US012356873B2

(12) United States Patent
Hwang et al.

(10) Patent No.: US 12,356,873 B2
(45) Date of Patent: Jul. 8, 2025

(54) METHOD OF FORMING CHALCOGENIDE-BASED THIN FILM USING ATOMIC LAYER DEPOSITION PROCESS, METHOD OF FORMING PHASE CHANGE MATERIAL LAYER AND SWITCHING DEVICE, AND METHOD OF FABRICATING MEMORY DEVICE USING THE SAME

(71) Applicant: Seoul National University R&DB foundation, Seoul (KR)

(72) Inventors: Cheol Seong Hwang, Seoul (KR); Manick Ha, Gyeonggi-do (KR)

(73) Assignee: Seoul National University R&DBfoundation, Seoul (KR)

( * ) Notice: Subject to any disclaimer, the term of this patent is extended or adjusted under 35 U.S.C. 154(b) by 1088 days.

(21) Appl. No.: 17/322,548

(22) Filed: May 17, 2021

(65) Prior Publication Data

US 2021/0359205 A1 Nov. 18, 2021

(30) Foreign Application Priority Data

May 18, 2020 (KR) .................. 10-2020-0059004
May 18, 2020 (KR) .................. 10-2020-0059006

(51) Int. Cl.
*H10N 70/00* (2023.01)
*C23C 16/30* (2006.01)
*C23C 16/455* (2006.01)
*C23C 16/56* (2006.01)
*H10B 63/00* (2023.01)
*H10N 70/20* (2023.01)

(52) U.S. Cl.
CPC ......... *H10N 70/023* (2023.02); *C23C 16/305* (2013.01); *C23C 16/45553* (2013.01);
(Continued)

(58) Field of Classification Search
CPC .. H10N 70/023; H10N 70/041; H10N 70/231; H10N 70/8828; H10N 70/882;
(Continued)

(56) References Cited

U.S. PATENT DOCUMENTS 8,691,668 B2 * 4/2014 Gatineau .............. C07D 213/16
257/E21.09
8,772,077 B2 * 7/2014 Lee ....................... C23C 16/042
438/102
(Continued)

FOREIGN PATENT DOCUMENTS

JP 2017-061743 3/2017
KR 10-2011-0014160 2/2011
(Continued)

OTHER PUBLICATIONS

A.L. Lacaita, Phase change memories: State-of-the-art, challenges and perspectives, Solid-State Electronics, vol. 50, Issue 1,2006, pp. 24-31, ISSN 0038-1101,https://doi.org/10.1016/j.sse.2005.10.046. (https://www.sciencedirect.com/science/article/pii/S0038110105003230) (Year: 2006).*
(Continued)

*Primary Examiner* — Fernando L Toledo
*Assistant Examiner* — Jahae Kim

(57) ABSTRACT

Disclosed is a method of forming a chalcogenide-based thin film using an atomic layer deposition (ALD) process including forming a Ge—Te-based material, the forming of the Ge—Te-based material may include a first operation of supplying, into a reaction chamber provided with a substrate, a first source gas including a Ge precursor with Ge having an oxidation state of +2, a second operation of supplying a first purge gas into the reaction chamber, a third operation of supplying, into the reaction chamber, a second source gas including a Te precursor and a first co-reactant gas for promoting a reaction between the Ge precursor and the Te precursor, and a fourth operation of supplying a second purge gas into the reaction chamber.

10 Claims, 49 Drawing Sheets

(52) U.S. Cl.
CPC ............. *C23C 16/56* (2013.01); *H10B 63/24* (2023.02); *H10N 70/041* (2023.02); *H10N 70/231* (2023.02); *H10N 70/8828* (2023.02)

(58) Field of Classification Search
CPC . C23C 16/305; C23C 16/45553; C23C 16/56; H10B 63/24
See application file for complete search history.

(56) References Cited

U.S. PATENT DOCUMENTS

| | | | | |
|---|---|---|---|---|
| 8,802,536 | B2* | 8/2014 | Lee | ...................... H10N 70/023 |
| | | | | 257/E45.002 |
| 9,175,390 | B2* | 11/2015 | Pore | .................. C23C 16/45553 |
| 11,814,400 | B2* | 11/2023 | Pore | ..................... H10N 70/231 |

FOREIGN PATENT DOCUMENTS

| | | |
|---|---|---|
| KR | 10-2017-0123825 | 11/2017 |
| WO | WO 20008-057616 | 5/2008 |

OTHER PUBLICATIONS

Process for Making Sb-Te-Containing and Ge-Sb-TeContaining Films An IP.com Prior Art Database Technical Disclosure (Year: 2012).*

Office Action dated Oct. 26, 2021 corresponding to Korean Application No. 10-2020-0059004, 6 pages.

* cited by examiner

Ge precursor

Te precursor (a)

(b)

(c)

(d)

(a)

(b)

R1　　　　　TS1　　　　　P1

(c)

R2　　　　　TS2　　　　　P2

● Te　● Ge　● Si　● N　● C　● H

< NH₃ >

METHOD OF FORMING CHALCOGENIDE-BASED THIN FILM USING ATOMIC LAYER DEPOSITION PROCESS, METHOD OF FORMING PHASE CHANGE MATERIAL LAYER AND SWITCHING DEVICE, AND METHOD OF FABRICATING MEMORY DEVICE USING THE SAME

CROSS-REFERENCES TO RELATED APPLICATION

This application claims priority of Korean Patent Application No. 10-2020-0059004, filed on May 18, 2020, and priority of Korean Patent Application No. 10-2020-0059006, filed on May 18, 2020, in the KIPO (Korean Intellectual Property Office), the disclosure of which is incorporated herein entirely by reference.

BACKGROUND OF THE INVENTION

Field of the Invention

Embodiments of the present disclosure relate to a method of forming a thin film and a method of manufacturing a device using the same, and more particularly, to a method of forming chalcogenide-based thin film using atomic layer deposition process, method of forming phase change material layer and switching device using the same and method of manufacturing memory device.

Description of the Related Art

Chalcogenide is a compound including at least one Group 16 (chalcogen) element and one or more electropositive elements. All of the Group 16 elements are chalcogen elements. However, an oxide that does not include Group 16 elements other than oxygen are not commonly referred to as a chalcogenide. The chalcogenide may have a characteristic that a phase change occurs rapidly between crystalline and amorphous states as heat is applied, and the characteristic may be used to implement a phase change memory device.

In forming a chalcogenide-based thin film applied to the phase change memory device or the like, an atomic layer deposition (ALD) process is mainly used. By using the ALD process, it is possible to conformally form a functional thin film having an atomic scale on a substrate having a complex surface structure, due to self-limited growth nature.

In forming a data storage material (i.e., a phase change material) applied to a phase change memory by using the ALD process, a precursor material and a deposition temperature (process temperature) may have a significant influence on the quality and performance of the data storage material. In general, a GeTe2 or Ge2Sb2Te7 (that is, GST227) material may be formed by using a Ge precursor with Ge having an oxidation state of +4, that is, a Ge(IV) precursor. However, these materials not only do not have excellent phase transition characteristics, but also have a problem that Te is precipitated during a phase transition operation process. When the deposition temperature is increased in the ALD process, the thin film is not properly adhered and falls off, and thus the deposition temperature may be set in a low region having a range of about 70 to 100° C. However, since the thin film deposited in this temperature range generally has low density and strength, the quality of the thin film is poor, and accordingly phase transition characteristics are not good. Thus, the thin film may not be suitable for implementation of the phase change memory device. Such a problem may occur in a similar manner with respect to a chalcogenide-based thin film for other use than the phase change material, as well as the phase change material.

SUMMARY OF THE INVENTION

An aspect of the present disclosure provides a method of forming a thin film using an atomic layer deposition (ALD) process capable of forming a chalcogenide-based thin film having excellent physical properties. Another aspect of the present disclosure provides a method of forming a thin film using an ALD process capable of forming a chalcogenide-based thin film having excellent film quality, phase change characteristics, and durability. Still another aspect of the present disclosure provides a method of forming a phase change material layer and a method of manufacturing a phase change memory device using the method of forming a thin film.

Still another aspect of the present disclosure provides a method of forming a thin film using an ALD process capable of forming a chalcogenide-based thin film having excellent physical properties. Still another aspect of the present disclosure provides a method of forming a thin film using an ALD process capable of forming a chalcogenide-based thin film having excellent film quality, excellent switching characteristics, and excellent durability. Still another aspect of the present disclosure provides a method of forming a switching device and a method of manufacturing a memory device using the method of forming a thin film.

Aspects of the present disclosure are not limited to the above-mentioned aspects, and other aspects that are not mentioned will be understood by those skilled in the art from the description below.

According to an aspect of the present disclosure, there is provided a method of forming a chalcogenide-based thin film using an ALD process, the method including forming a Ge—Te-based material. The forming of the Ge—Te-based material may include a first operation of supplying, into a reaction chamber provided with a substrate, a first source gas including a Ge precursor with Ge having an oxidation state of +2, a second operation of supplying a first purge gas into the reaction chamber, a third operation of supplying, into the reaction chamber, a second source gas including a Te precursor and a first co-reactant gas for promoting a reaction between the Ge precursor and the Te precursor, and a fourth operation of supplying a second purge gas into the reaction chamber.

The Ge precursor may include Ge(II)-guanidinate.

The Ge precursor may include Ge(II)-amido guandinate.

The second source gas and the first co-reactant gas may be simultaneously supplied into the reaction chamber.

The first co-reactant gas may include $NH_3$.

The first co-reactant gas may be configured to react with the Te precursor to generate TeH2.

In the Te precursor, Te may have a −2 valence oxidation state. For example, the Te precursor may include $Te(SiMe_3)_2$.

In the forming of the Ge—Te-based material, a deposition temperature may be in a range of about 70 to 200° C.

The method may further include forming a Sb—Te-based material. The forming of the Sb—Te-base material may include a fifth operation of supplying, into the reaction chamber, a third source gas including a Sb precursor, a sixth operation of supplying a third purge gas into the reaction chamber, a seventh operation of supplying, into the reaction chamber, the fourth source gas including a second Te precursor and a second co-reactant gas, and an eighth operation of supplying a fourth purge gas into the reaction chamber.

The fourth source gas may be the same as the second source gas.

The second co-reactant gas may be same as the first co-reactant gas.

The fourth source gas and the second co-reactant gas may be simultaneously supplied into the reaction chamber.

In the forming of the Sb—Te-based material, a deposition temperature may be in a range of about 70 to 200° C.

The forming of the Ge—Te-based material may be configured to form a GeTe material, and the forming the Sb—Te-based material may be configure to form a Sb2Te3 material.

The first to fourth operations for forming the Ge—Te-based material may be repeatedly performed m times (m is an integer of 1 or more), and the fifth to eighth operations for forming the Sb—Te-based material may be repeatedly performed n times (n is an integer of 1 or more).

The forming of the Ge—Te-based material and the forming of the Sb—Te-based material may be alternately and repeatedly performed.

The chalcogenide-based thin film may include a $(GeTe)_x(Sb_2Te_3)_{1-x}$ material.

The chalcogenide-based thin film may include a $Ge_2Sb_2Te_5$ (that is, GST225) material.

Annealing the chalcogenide-based thin film may be further performed.

According to another aspect of the present disclosure, there is provided a method of forming a phase change material layer including forming a chalcogenide-based thin film by using the above-described ALD process.

According to still another aspect of the present disclosure, there is provided a method of manufacturing a phase change memory device including forming a phase change material layer by using the method, and forming an electrode structure for applying a voltage to the phase change material layer.

According to still another aspect of the present disclosure, there is provided a method of forming a chalcogenide-based thin film using an ALD process, the method including a first operation of supplying, into a reaction chamber provided with a substrate, a first source gas including a Ge precursor with Ge having an oxidation state of +2, a second operation of supplying a first purge gas into the reaction chamber, a third operation of supplying, into the reaction chamber, a second source gas including a Se precursor and a reaction promoting gas for promoting a reaction between the Ge precursor and the Se precursor, and a fourth operation of supplying a second purge gas into the reaction chamber.

The Ge precursor may include Ge(II)-guanidate.

The Ge precursor may include $Ge^{II}N(CH_3)_2[(N^iPr)_2CN(CH_3)_2]$.

The second source gas and the reaction promoting gas may be simultaneously supplied into the reaction chamber.

The reaction promoting gas may include $NH_3$.

The reaction promoting gas may be configured to react with the Ge precursor on the substrate to form $Ge(NH_2)$.

The Se precursor may include Se having an oxidation state of −2.

The Se precursor may include $[(CH_3)_3Si]_2Se$.

The method of forming a chalcogenide-based thin film may be configured to form a stoichiometric GeSe in which a ratio of Ge and Se is 1:1.

In the method of forming a chalcogenide-based thin film, a deposition temperature may be in a range of about 70 to 200° C.

The first to fourth operations may be repeatedly performed a plurality of times.

Annealing the chalcogenide-based thin film may be further performed.

The annealing the chalcogenide-based thin film may be performed at a temperature of about 200 to 500° C.

According to still another aspect of the present disclosure, there is provided a method of forming a switching device, the method including forming a chalcogenide-based thin film by using the above-described ALD process. Here, the switching device may include an ovonic threshold switch (OTS) device.

According to still another aspect of the present disclosure, there is provided a method of manufacturing a memory device including a memory element and a switching device electrically connected to the memory element, the method including forming the switching device by using the method.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
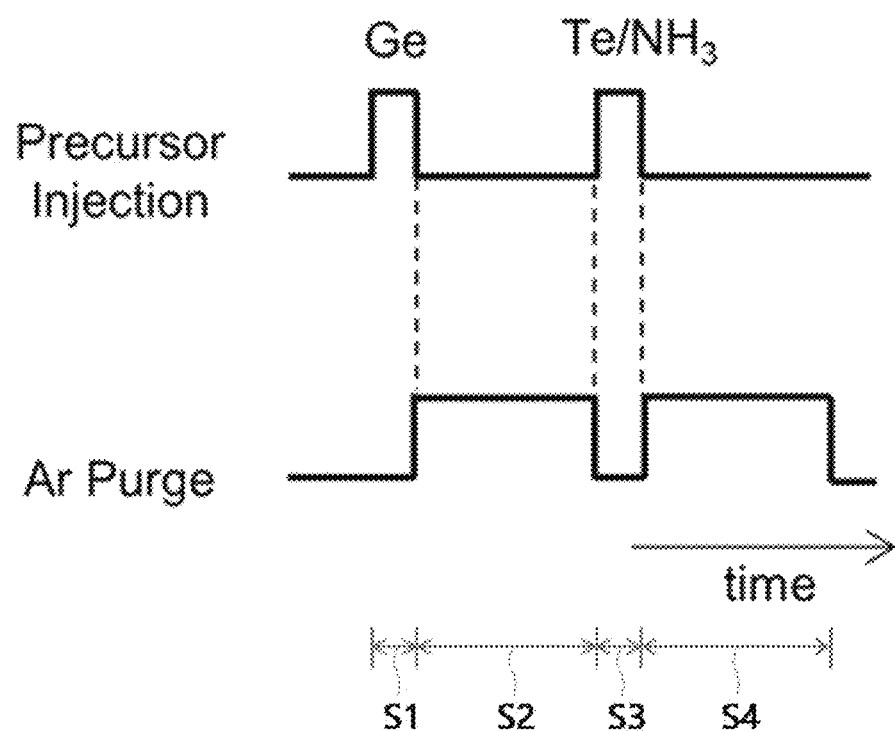
FIG. 1 is a diagram illustrating an atomic layer deposition (ALD) sequence applicable to a method of forming a chalcogenide-based thin film by an ALD process according to an embodiment of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, a method of forming a chalcogenide-based thin film using an atomic layer deposition (ALD) process, and a method of forming a phase change material layer and a switching device, and a method of manufacturing a memory device using the same according to embodiments of the present disclosure will be described in detail with reference to the accompanying drawings. The widths and thicknesses of layers or regions illustrated in the accompanying drawings may be exaggerated for clarity and ease of description. Like numbers refer to like elements throughout.

FIG. 1 is a diagram illustrating an ALD sequence applicable to a method of forming a chalcogenide-based thin film by an ALD process according to an embodiment of the present disclosure.

Referring to FIG. 1, the method of forming a chalcogenide-based thin film using an ALD process according to this embodiment may include forming a Ge—Te-based material. The forming the Ge—Te-based material may include a first operation S1 of supplying, into a reaction chamber (not illustrated) provided with a substrate (substrate to be deposited) (not illustrated), a first source gas including a Ge precursor with Ge having an oxidation state of +2, a second operation S2 of supplying a first purge gas into the reaction chamber, a third operation S3 of supplying, into the reaction chamber, a second source gas including a Te precursor and a first co-reactant gas for promoting a reaction between the Ge precursor and the Te precursor, and a fourth operation S4 of supplying a second purge gas into the reaction chamber.

By using a Ge precursor with Ge having an oxidation state of +2, that is, a Ge(II) precursor, it is possible to form GeTe that is a compound formed by Ge and Te in a substantially 1:1 ratio (that is, in a stoichiometric manner), and further it is possible to form $Ge_2Sb_2Te_5$ (that is, GST225) to be described later. GeTe and GST225 may exhibit more excellent phase transition characteristics than $GeTe_2$ and GST227 formed by using a Ge(IV) precursor, and may not cause a problem that Te is precipitated during a phase transition operation process. Thus, it may be advantageous in forming a chalcogenide-based thin film (for example, a phase change material layer) having excellent physical properties and characteristics.

The Ge precursor with Ge having an oxidation state of +2 may include, for example, Ge(II)-guanidate. In a specific example, the Ge precursor may be Ge(II)-amido guandinate. Ge(II)-amido guanidinate may be represented by Ge(guan)$NMe_2$. Here, guan may be $(^iPrN)_2CNMe_2$, and Me may be $CH_3$. Ge(II)-amido guanidinate may be represented by $Ge^{II}N(CH_3)_2[(N^iPr)_2CN(CH_3)_2]$. Ge(II)-amido guanidinate may be a precursor more suitable for a relatively high temperature deposition process than an existing Ge(IV) precursor. In this regard, when using a Ge(II) precursor such as Ge(II)-amido guandinate, a deposition temperature may be increased to 100° C. or more during the ALD process, and it may be advantageous in improving the density, strength, and film quality of the formed chalcogenide-based thin film. Here, Ge(II)-guanidinate is exemplified as a specific material of the Ge precursor, that is, the Ge(II) precursor usable in the embodiment is not limited to Ge(II)-guanidinate, and may vary.

In the Te precursor, Te may have an oxidation state of −2. For example, the Te precursor may include $Te(SiMe_3)_2$. Here, Me may be $CH_3$. However, a specific material of the Te precursor is merely exemplary, and may vary. The second source gas including the Te precursor may also be referred to as a "reaction gas".

The first co-reactant gas may serve to promote a reaction between the Ge precursor and the Te precursor, for example, may serve as a catalyst. That is, the first co-reactant gas may be a type of catalyst. The Ge precursor, that is, Ge(II) precursor, may be more stable than the Ge(IV) precursor. Thus, unless the first co-reactant gas is used, an ALD reaction with the Te precursor may be less likely to occur. In this embodiment, the chalcogenide-based thin film may be easily formed by using the first co-reactant gas capable of promoting the ALD reaction while using the Ge(II) precursor. The first co-reactant gas may include, for example, $NH_3$. The first co-reactant gas may be an $NH_3$ gas. The first co-reactant gas may be configured to react with the Te precursor, for example, to generate $TeH_2$, and the ALD reaction (film formation reaction) may be greatly promoted by the $TeH_2$. In addition, as will be described later, the first co-reactant gas may enable a high-temperature process of 100 to 200° C., thereby obtaining a chemical vapor deposition (CVD) that is a high-temperature process through the ALD process.

The second source gas including the Te precursor and the first co-reactant gas may be simultaneously supplied into the reaction chamber. By simultaneously supplying the second source gas and the first co-reactant gas into the reaction chamber, the above-described $TeH_2$ may be generated in-situ. When the first co-reactant gas is not used, a thin film may not be grown due to low reactivity between the Ge precursor and the Te precursor. In addition, even when the first co-reactant gas is not injected simultaneously with the second source gas, and the first co-reactant gas is separately supplied into the reaction chamber after the second source gas and the second purge gas are supplied, a desired thin film may not be properly grown. In addition, when the first co-reactant gas is separately injected after the first source gas and the first purge gas are supplied, and the second source gas and the second purge gas are supplied, a Ge-rich film (~60% Ge) may be formed. In addition, when the first co-reactant gas is injected together with (simultaneously with) the supply of the first source gas, and subsequently the first purge gas, the second source gas, and the second purge gas are sequentially supplied, a Ge-rich film (~80% Ge) with a higher Ge content may be formed. In addition, when the first source gas and the first co-reactant gas are simultaneously injected, and the second source gas is not injected, a Ge film may be formed. As in this embodiment, when the first co-reactant gas is injected simultaneously with the second source gas (that is, the first co-reactant gas and the second source gas are co-injected), a stoichiometric GeTe film may be easily formed.

The first purge gas and second purge gas may be inert gases such as Ar or $N_2$. Although a case in which an Ar gas is used as the first and second purge gases is illustrated herein, a type of purge gas may vary.

A substrate on which the chalcogenide-based thin film is deposited (that is, a substrate to be deposited) (not illustrated) may be selected from among various substrates. A surface portion of the substrate may be provided with an insulating material layer, a conductive material layer (metallic material layer), or a combination of the insulating material layer and the conductive material layer. The insulating material layer may include, for example, $SiO_2$ and $Si_3N_4$, and the conductive material layer may include a metal or a conductive metal compound such as TiN and WN. A type, material, and configuration of the substrate may vary.

A "deposition temperature" in the forming of the Ge—Te-based material according to the embodiment described with reference to FIG. 1 may be determined in a range of about 70 to 200° C. Here, the deposition temperature may correspond to a temperature of a substrate to be deposited when a thin film is formed. That is, an ALD thin film deposition process may be performed in a state where a substrate provided in a reaction chamber is heated to the temperature range. The deposition temperature in the ALD process according to this embodiment may be about 100 to 200° C. or about 100 to 180° C. The deposition temperature may be higher than a deposition temperature (about 70 to 100° C.) in a conventional ALD process. In this regard, the thin film formed by the ALD process according to the embodiment may have excellent characteristics in terms of density, strength, film quality, physical properties, and the like. In addition, the thin film formed by the ALD process according to the embodiment may have excellent phase transition characteristics, excellent durability, and the like.

A method of forming a thin film according to an experimental example may be as follows.

GeTe films were deposited in an ALD reactor with a 12 inch diameter showerhead and a substrate heater suitable for an 8 inch wafer scale as an example. A Ge precursor and a Te precursor were heated to 65° C. and 35° C., respectively, and gas phase pressures of 0.079 torr and 1 torr were formed. The films were grown on Si/SiO₂ or Si/TiN substrate (here, $SiO_2$ and TiN are upper surface portions), and a deposition temperature range was about 70 to 200° C. (70 to 180° C.). The precursors were injected into an ALD chamber at a flow rate of 50 sccm by an Ar carrier gas, and an Ar gas was injected at 200 sccm for a purge process. A working pressure of a process chamber (that is, ALD chamber) during deposition was maintained in a range of 4.5 to 5.5 torr. A precursor injection pulse time and a purge pulse time were adjusted in various ways. An injection/purge time of the Ge precursor may be, for example, 3 s/15 s, and an injection/purge time of the Te precursor may be, for example, 2 s/15 s. However, such precursor injection/purge times are merely exemplary, and may vary. In addition, various conditions of the above-described experimental example are merely exemplary, and the present disclosure is not limited thereto and may vary.

Figure 2:
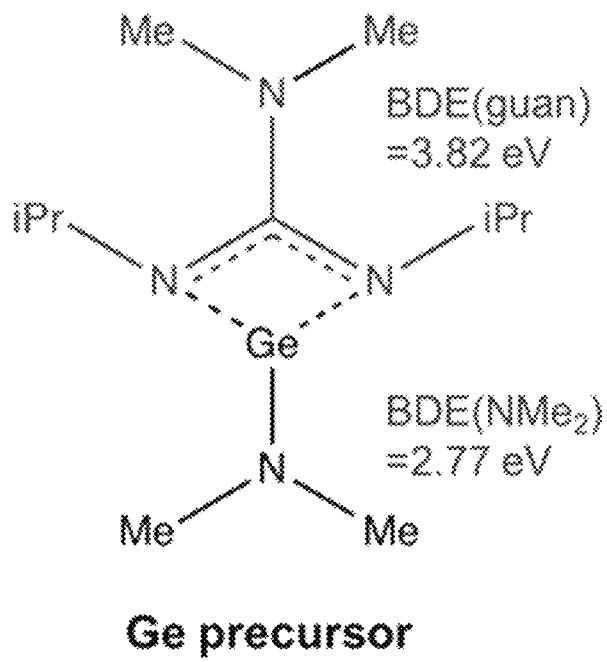
FIG. 2 is an exemplary chemical structure illustrating a Ge precursor applicable to a method of forming a chalcogenide-based thin film by an ALD process according to an embodiment of the present disclosure.

FIG. 2 is an exemplary chemical structure illustrating a Ge precursor applicable to a method of forming a chalcogenide-based thin film by an ALD process according to an embodiment of the present disclosure.

Referring to FIG. 2, the Ge precursor may be a precursor with Ge having an oxidation state of +2, for example, Ge(II)-amido guanidinate. Ge(II)-amido guandinate may be represented by Ge(guan)NMe₂. Here, guan may be $(^iPrN)_2CNMe_2$, and Me may be $CH_3$. Ge(II)-amido guanidinates may include two anionic ligands, that is, dimethyl-amino (NMe₂) and bidentate guanidinate [guan=$(^iPrN)_2CNMe_2$] ligands. In addition, Ge(II)-amido guandinate may have three electronic resonance structures in which p electrons are delocalized with respect to three C—N bonds. According to density functional theory (DFT) calculation, a bond dissociation energy (BDE) between Ge-guan is about 3.82 eV, which is greater than a BDE between Ge—NMe₂ (about 2.77 eV).

Figure 3:
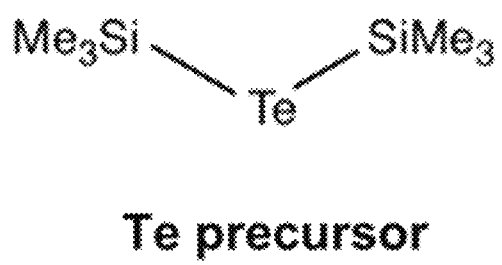
FIG. 3 is an exemplary chemical structure illustrating a Te precursor applicable to a method of forming a chalcogenide-based thin film by an ALD process according to an embodiment of the present disclosure.

FIG. 3 is an exemplary chemical structure illustrating a Te precursor applicable to a method of forming a chalcogenide-based thin film by an ALD process according to another embodiment of the present disclosure.

Referring to FIG. 3, the Te precursor is a precursor with Te having an oxidation state of −2, for example, Te(SiMe₃)₂. Here, Me may be $CH_3$. A material of the Te precursor is not limited to Te(SiMe₃)₂, and may vary.

Figure 4:
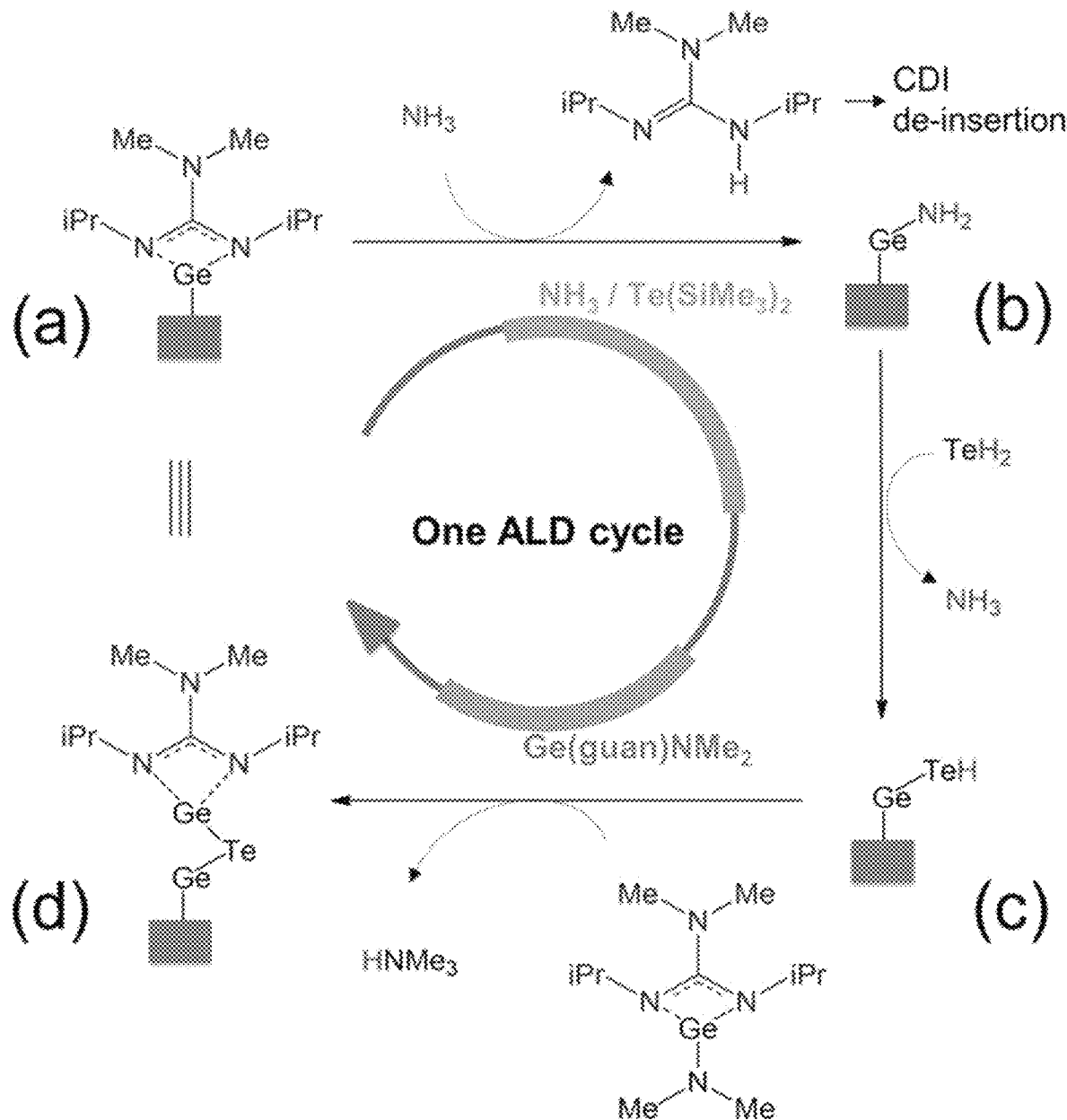
FIG. 4 is an exemplary diagram illustrating a reaction mechanism applicable to a method of forming a chalcogenide-based thin film by an ALD process according to an embodiment of the present disclosure.

FIG. 4 is an exemplary diagram illustrating a reaction mechanism applicable to a method of forming a chalcogenide-based thin film by an ALD process according to an embodiment of the present disclosure. That is, FIG. 4 is a diagram illustrating a reaction mechanism between a Ge precursor, a Te precursor, and an NH₃ co-reactant.

Referring to FIG. 4, operation (a) illustrates an initial Ge-terminated surface having a guanidinate ligand. Since a bonding energy (3.82 eV) between Ge-guan is greater than a bonding energy (2.77 eV) between Ge—NMe₂, it is possible to have a surface state terminated with —Ge(guan), rather than —Ge(NMe₂).

An NH₃ molecule simultaneously injected with Te(SiMe₃)₂ may play two roles. That is, the NH₃ molecule may convert —Ge(guan) on a film surface into —Ge(NH₂) through a surface reaction [see operation (b)]. In addition, Te(SiMe₃)₂ may be converted into TeH₂ through a gas phase reaction. A dissociated (separated) guanidinate ligand may be further decomposed into HNMe₂ and C(N$^i$Pr)₂ through carbodiimide (CDI) de-insertion, which is proved by density functional theory (DFT) calculation that it is energetically advantageous (ΔG=−0.785 eV at 130° C.). —Ge—Te—H may be formed on the film surface by a reaction between TeH₂ and Ge(NH₂), as illustrated in operation (c).

Subsequent injection of Ge(guan)NMe₂ may generate a Ge-terminated surface equivalent to an initial state [operation (a)] [see operation (d)].

Figure 5:
FIG. 5 is a diagram illustrating a reaction formula showing chemical reactions in a method of forming a chalcogenide-based thin film by an ALD process and a gradational change in a chemical structure corresponding thereto according to an embodiment of the present disclosure.
Figure 5:
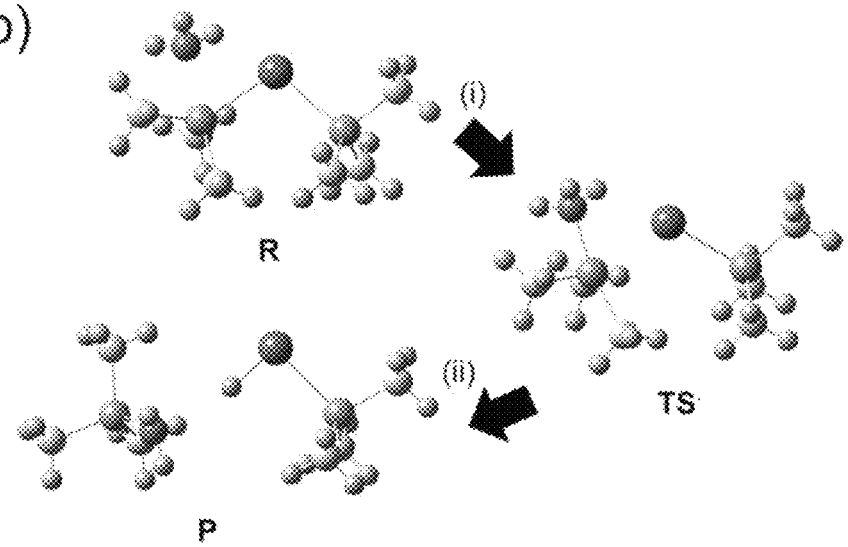
Figure 5:
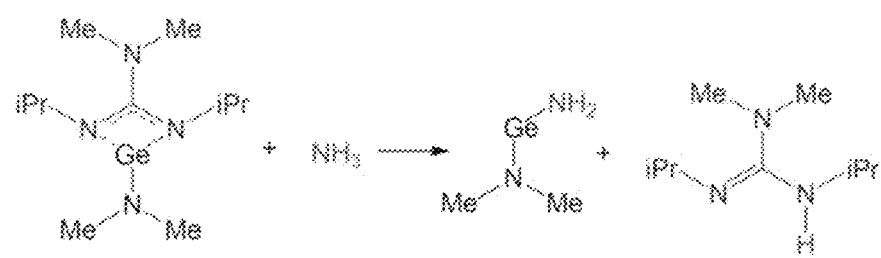
Figure 5:
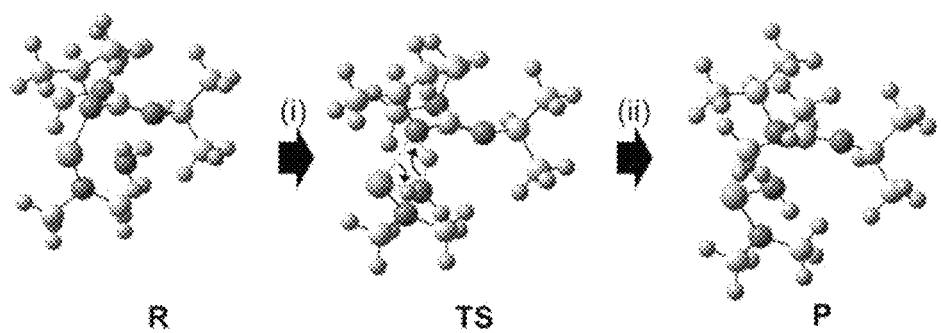
Figure 5:

FIG. 5 is a diagram illustrating a reaction formula showing chemical reactions in a method of forming a chalcogenide-based thin film by an ALD process and a gradational change in a chemical structure corresponding thereto according to an embodiment of the present disclosure. FIG. 5 illustrates the reaction formula and chemical structures that are analyzed through intrinsic reaction coordinates (IRC) and potential energy surface (PES) scans using a DFT method.

FIGS. 5A and 5B illustrate a reaction between Te(SiMe₃)₂ and NH₃ as a result of calculation using the DFT method. The reaction between Te(SiMe₃)₂ and NH₃ may generate TeH₂, and may generate 2H₂NSiMe₃ as a byproduct. In FIG. 5B, R represents a reactant, TS represents a transition state, and P represents a product. In FIG. 5B, through (i) reaction, an N atom of $NH_3$ may be first bonded to Si of a silyl ligand, and a dangling bond may be left on a Te atom. In FIG. 5B, through (ii) reaction, as one proton moves from $NH_3$ to Te, half substitution of the silyl ligand by hydrogen may be completed, and H—Te—$SiMe_3$ may be generated. The second substitution of the remaining $SiMe_3$ ligand may follow a similar pathway.

FIGS. 5C and 5D illustrate a reaction between Ge(guan)$NMe_2$ and $NH_3$ as a result of calculation using the DFT method. A guanidinate ligand may be substituted with $NH_2$ by the reaction between Ge(guan)$NMe_2$ and $NH_3$. In FIG. 5D, R represents a reactant, TS represents a transition state, and P represents a product. When $NH_3$ is located sufficiently close to a Ge atom of Ge(guan)$NMe_2$, one nitrogen (N) of bidentate guanidinate (Ge—(N,N'-guan)) may be separated from Ge, and a guanidinate having one Ge—N bond may be generated, which is represented by R in FIG. 5D. In FIG. 5D, a product P may correspond to a result of dissociation of a guandinate ligand into guan-H through protonation by $NH_3$. As a result, $(NH_2)Ge(NMe_2)$ may be obtained.

Figure 6:
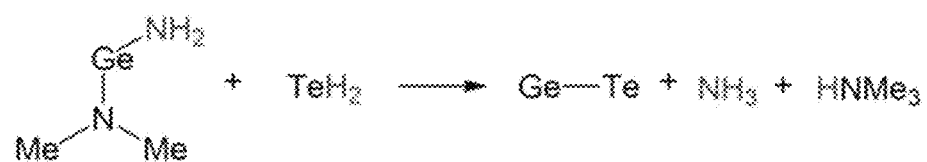
FIG. 6 is a diagram illustrating a reaction between intermediates generated in a method of forming a chalcogenide-based thin film by an ALD process and a gradational change in a chemical structure corresponding thereto according to an embodiment of the present disclosure.
Figure 6:
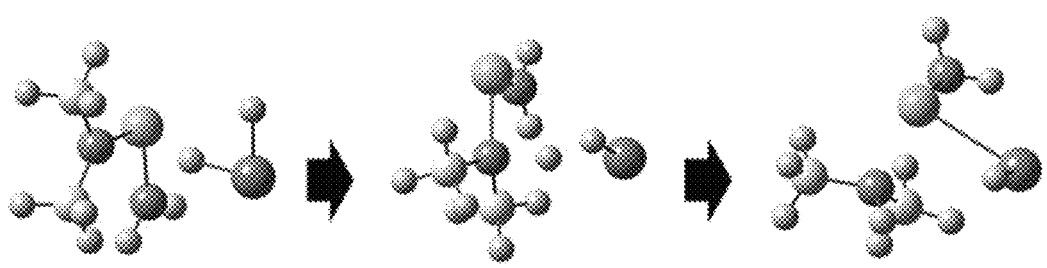
Figure 6:
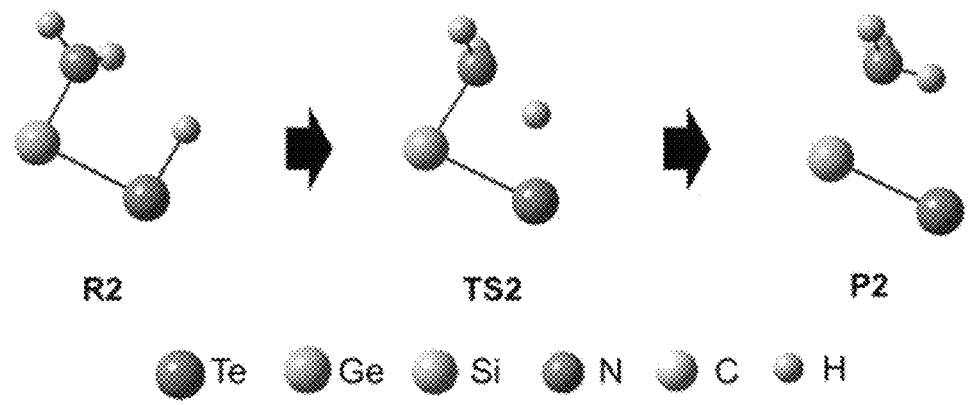

FIG. 6 is a diagram illustrating a reaction between intermediates generated in a method of forming a chalcogenide-based thin film by an ALD process and a gradational change in a chemical structure corresponding thereto according to an embodiment of the present disclosure. FIG. 6 illustrates a reaction between Ge and Te intermediates, which is analyzed by the DFT method. In FIGS. 6B and 6C, R1 and R2 represent reactants, TS1 and TS2 represent transition states, and P1 and P2 represent products.

Referring to FIG. 6A, Ge—Te may be formed through a reaction between $(NH_2)Ge(NMe_2)$ and $TeH_2$ that are intermediates. FIGS. 6B and 6C illustrate separation (dissociation) processes of $NMe_3$ and $NH_2$ through protonation by $TeH_2$, respectively.

Figure 7:
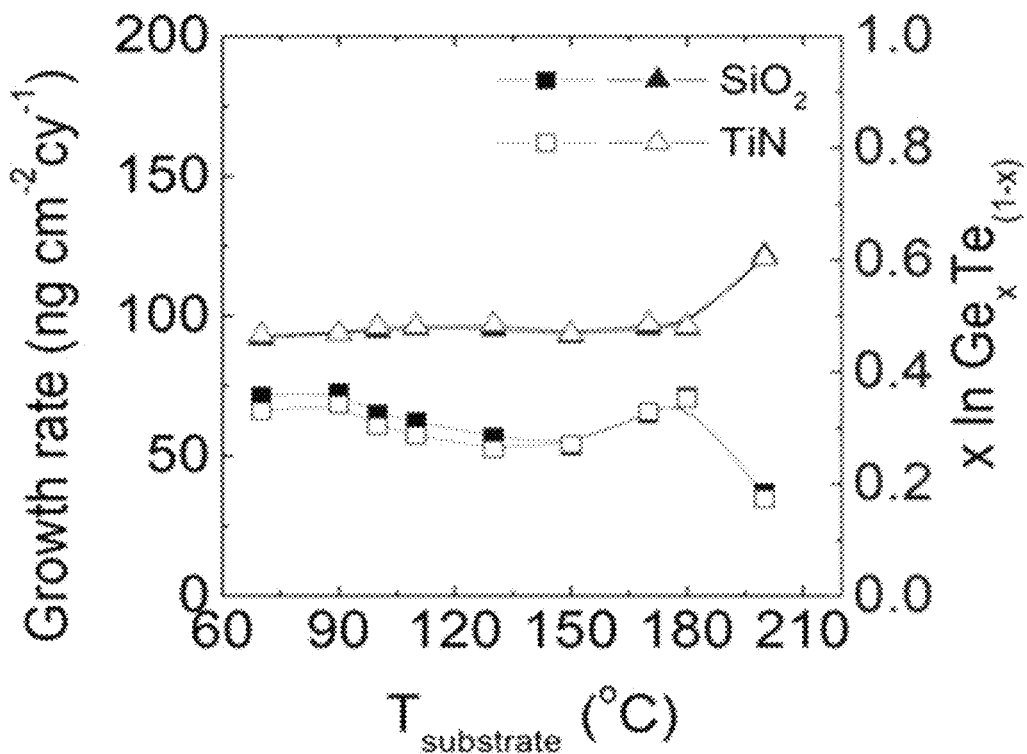
FIG. 7 is a graph illustrating an influence of a substrate temperature on a growth rate of a thin film in a method of forming a chalcogenide-based thin film according to an embodiment of the present disclosure.

FIG. 7 is a graph illustrating an influence of a substrate temperature on a growth rate of a thin film in a method of forming a chalcogenide-based thin film according to an embodiment of the present disclosure. In this case, the number of ALD cycles was fixed to 200.

Referring to FIG. 7, it can be confirmed that a stable growth rate of about 60±0.3 ng·cm$^{-2}$·cy$^{-1}$ is obtained on $SiO_2$ and TiN substrates at a temperature (substrate temperature) of about 70 to 170° C. Precursors have a relatively high thermal stability, and thus may exhibit stable growth characteristics even at a relatively high deposition temperature (substrate temperature). A Ge precursor may be stable up to about 187° C. It is presumed that a slightly higher deposition (growth) rate in a temperature region of 90° C. or less is due to an impurity of a reaction by-product.

FIG. 7 illustrates a change of x (that is, a composition ratio change) in the deposited $Ge_xTe_{(1-x)}$ thin film. Referring to a result thereof, it can be confirmed that a 1:1 stoichiometric composition is maintained up to a temperature of about 180° C., and a Ge-rich film is formed and a growth rate is slowed down at a temperature of about 180° C. or more. This is presumed to be due to significant desorption of a Te precursor in a high temperature region. Thus, a maximum deposition temperature may be set in a range of about 170 to 180° C. However, this is exemplary and a result thereof may vary depending on an experimental condition.

All films grown at different deposition temperatures may be in an amorphous state. However, a bulk density, impurity level, chemical state, and the like of a film may vary depending on a deposition temperature. This will be described in more detail later.

Figure 8:
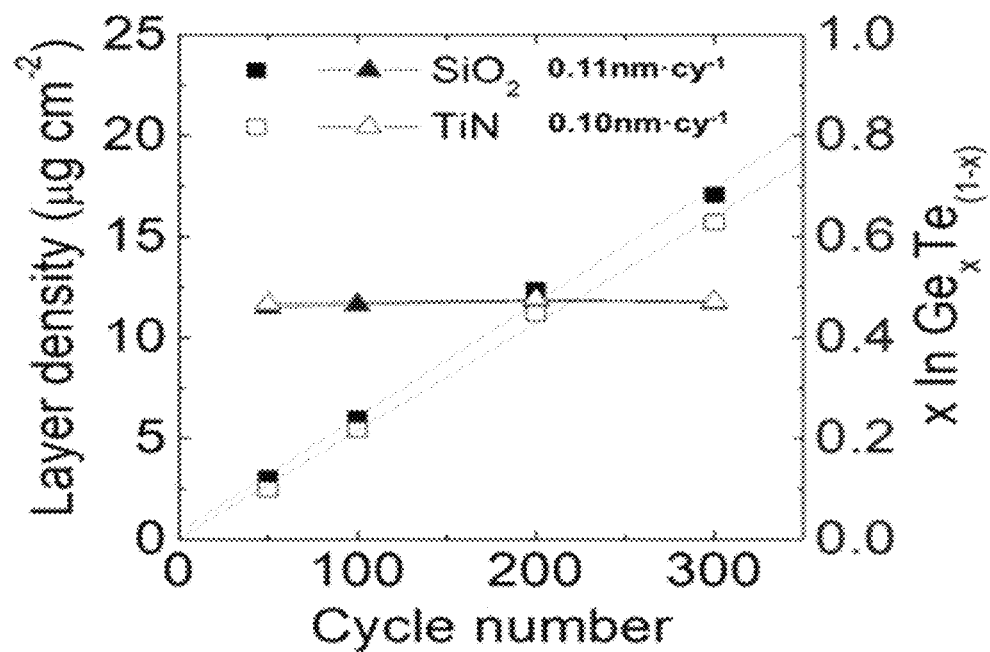
FIG. 8 is a graph illustrating a change in thin film (layer) density and composition ratio based on the number of ALD cycles in a method of forming a chalcogenide-based thin film according to an embodiment of the present disclosure.

FIG. 8 is a graph illustrating a change in thin film (layer) density and composition ratio based on the number of ALD cycles in a method of forming a chalcogenide-based thin film according to an embodiment of the present disclosure. In this case, a deposition temperature of a thin film was 170° C.

Referring to FIG. 8, it can be confirmed that a thin film density increases as the number of ALD cycles for thin film growth increases. A GeTe thin film grew linearly with a velocity gradient of about 55 to 60 ng·cm$^{-2}$·cy$^{-1}$. In this case, an increase rate of a thin film thickness was about 0.10 to 0.11 nm/cycle. A stoichiometric composition of 1:1 was well maintained even when the number of ALD cycles increased.

Figure 9:
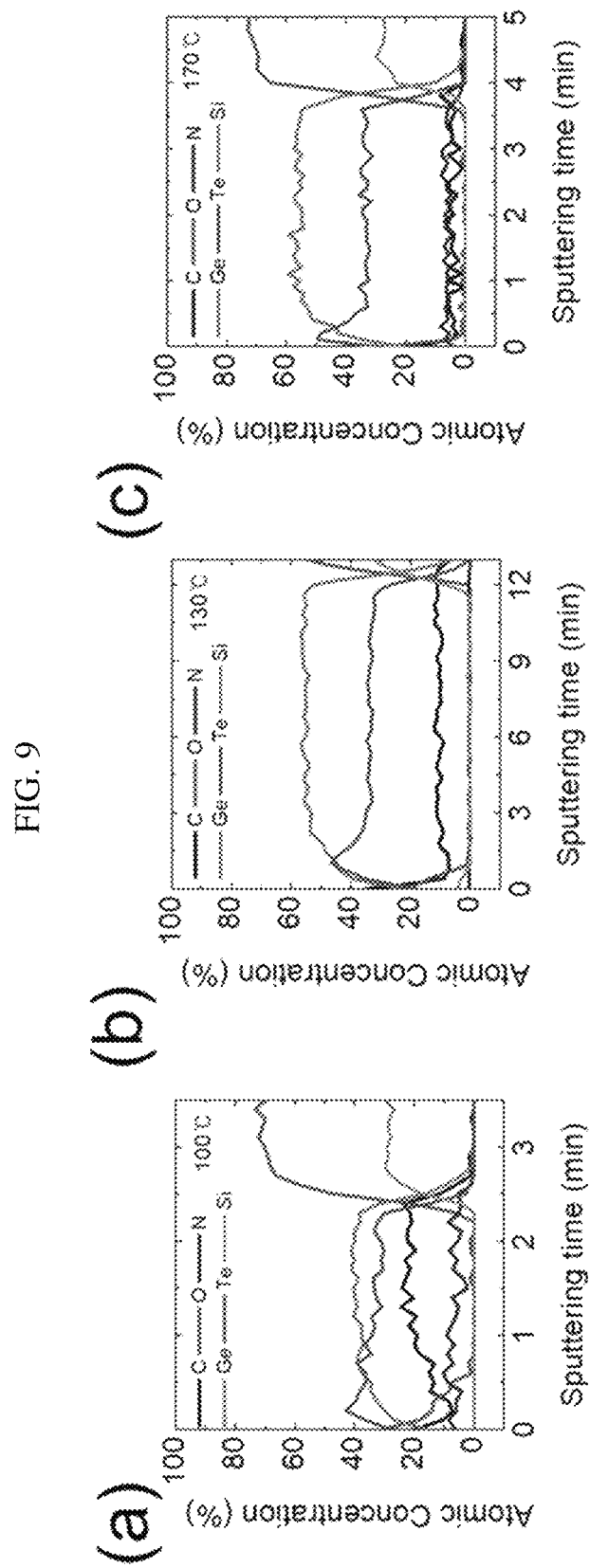
FIG. 9 is a graph illustrating an auger electron spectroscopy (AES) depth profile analysis result for a chalcogenide-based thin film (GeTe) formed according to an embodiment of the present disclosure.

FIG. 9 is a graph illustrating an auger electron spectroscopy (AES) depth profile analysis result for a chalcogenide-based thin film (GeTe) formed according to an embodiment of the present disclosure. FIG. 9A illustrates a result of a GeTe thin film deposited at 100° C., FIG. 9B illustrates a result of a GeTe thin film deposited at 130° C., and FIG. 9C illustrates a result of a GeTe thin film deposited at 170° C. FIG. 9 illustrates a result of absolute concentration analysis being not reflected, which is for confirming a relative change of each constituent material or impurity.

Referring to FIG. 9A, a GeTe thin film deposited at 100° C. may include relatively high C and N impurities.

Referring to FIG. 9B, in the case of a GeTe thin film deposited at 130° C., it can be confirmed that an N concentration was negligibly decreased, but a C impurity remained in a significant amount.

Referring to FIG. 9C, in the case of a GeTe thin film deposited at 170° C., it can be confirmed that a C impurity concentration was further decreased, but an N impurity concentration was slightly increased.

Figure 10:
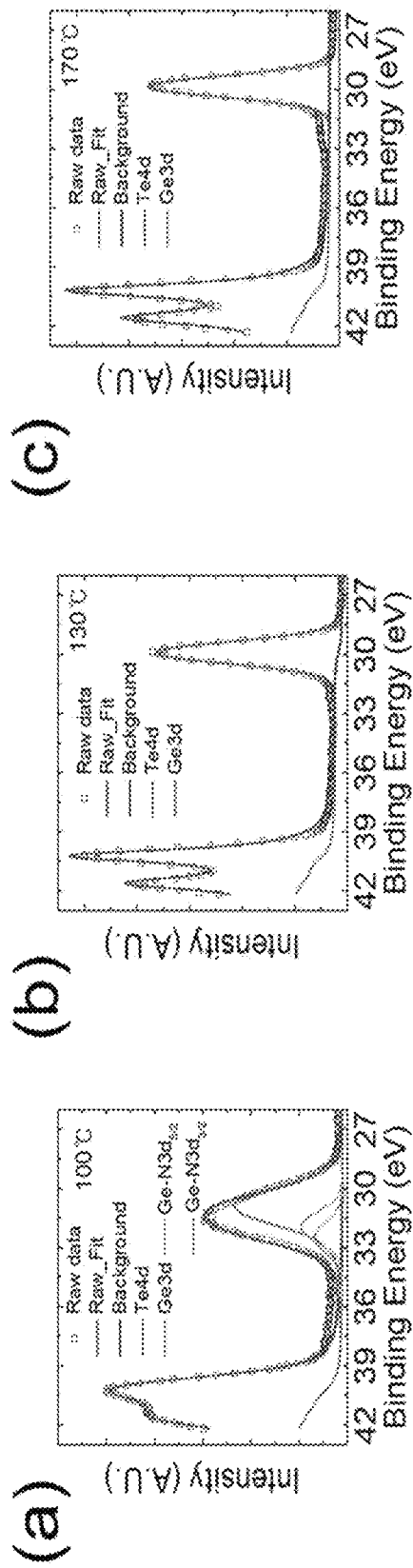
FIG. 10 is a graph illustrating an X-ray photoelectron spectroscopy (XPS) analysis result for a chalcogenide-based thin film (GeTe) formed according to an embodiment of the present disclosure.

FIG. 10 is a graph illustrating an X-ray photoelectron spectroscopy (XPS) analysis result for a chalcogenide-based thin film (GeTe) formed according to an embodiment of the present disclosure. FIG. 10A illustrates a result of a GeTe thin film deposited at 100° C., FIG. 10B illustrates a result of a GeTe thin film deposited at 130° C., and FIG. 10C illustrates a result of a GeTe thin film deposited at 170° C. FIGS. 10A, 10B and 10C illustrate XPS spectra of a Te 4d peak having a binding energy (BEs) of about ~39 to 42 eV and a Ge 3d peak having a binding energy of about ~30 eV.

Referring to FIG. 10A, in the case of a GeTe thin film deposited at 100° C., it can be confirmed that the Ge 3d peak was shifted (moved) in a high energy direction due to a relatively high impurity content, and widths of the Ge 3d and Te 4d peaks were significantly widened.

Referring to FIGS. 10B and 10C, in the case of GeTe thin films deposited at 130° C. and 170° C., the Ge 3d peak showed a single component of binding energy corresponding to Ge—Te, the Te 4d peaks showed clear splitting, and their binding energies well corresponded to reference values of GeTe.

Figure 11:
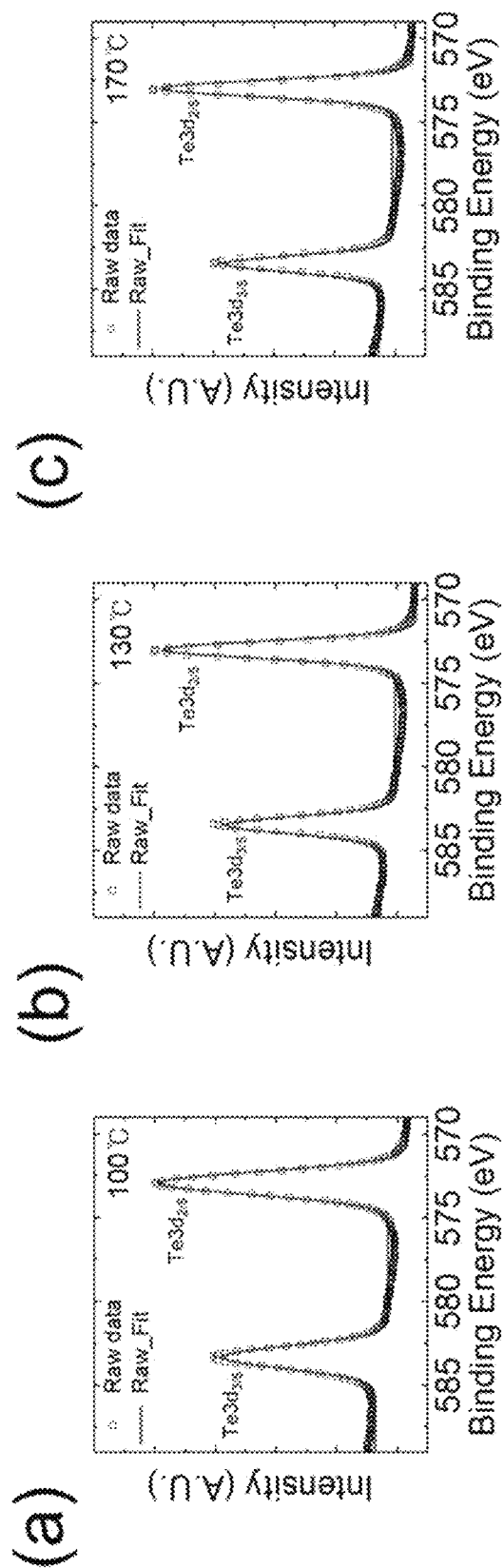
FIG. 11 is a graph illustrating an XPS analysis result for a chalcogenide-based thin film (GeTe) formed according to an embodiment of the present disclosure.

FIG. 11 is a graph illustrating an XPS analysis result for a chalcogenide-based thin film (GeTe) formed according to an embodiment of the present disclosure. FIG. 11A illustrates a result of a GeTe thin film deposited at 100° C., FIG. 11B illustrates a result of a GeTe thin film deposited at 130° C., and FIG. 11C illustrates a result of a GeTe thin film deposited at 170° C.

FIGS. 11A, 11B and 11C illustrate XPS spectra of a Te $3d_{5/2}$ peak and a Te $3d_{3/2}$ peak. Referring to FIGS. 11A, 11B, and 11C, it can be confirmed that the binding energies of the Te $3d_{5/2}$ peaks are commonly located at about 573 eV, and the binding energies of the Te $3d_5$ $s_2$ peaks are commonly located about 583.5 eV. This result well corresponded to reference binding energy values of Ge—Te.

Figure 12:
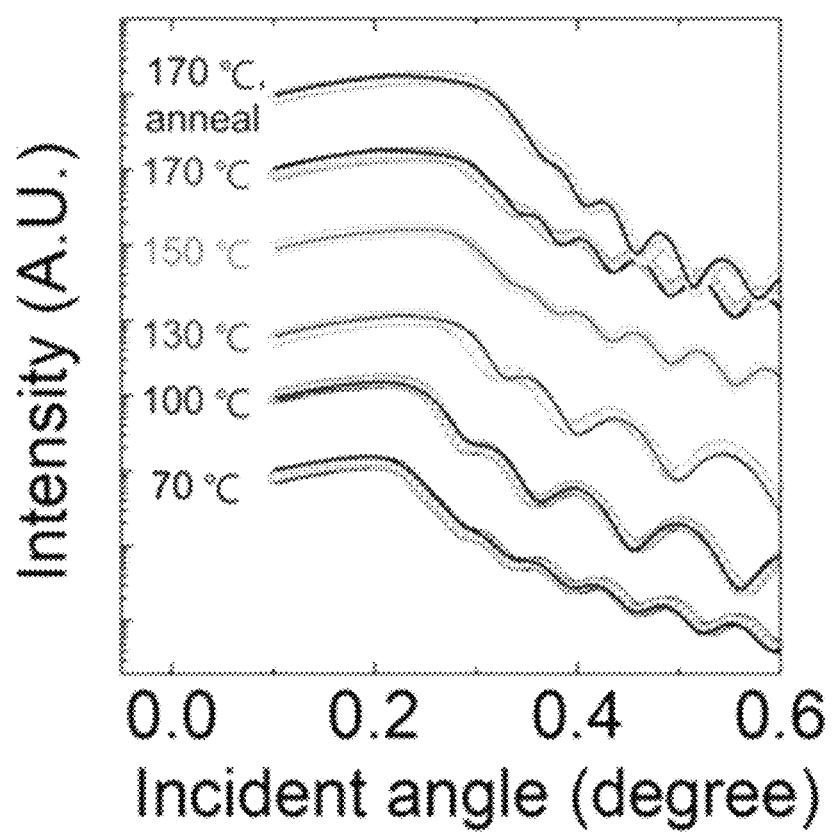
FIG. 12 is a graph illustrating X-ray reflectivity (XRR) spectra for a chalcogenide-based thin film (GeTe) formed according to an embodiment of the present disclosure.

FIG. 12 is a graph illustrating X-ray reflectivity (XRR) spectra for a chalcogenide-based thin film (GeTe) formed according to an embodiment of the present disclosure. This measurement was performed on GeTe thin films formed on a Si/SiO$_2$ substrate while changing a deposition temperature. A bulk density of a thin film may be measured from the result of FIG. 12. The result of FIG. 13 below may be obtained from FIG. 12.

Figure 13:
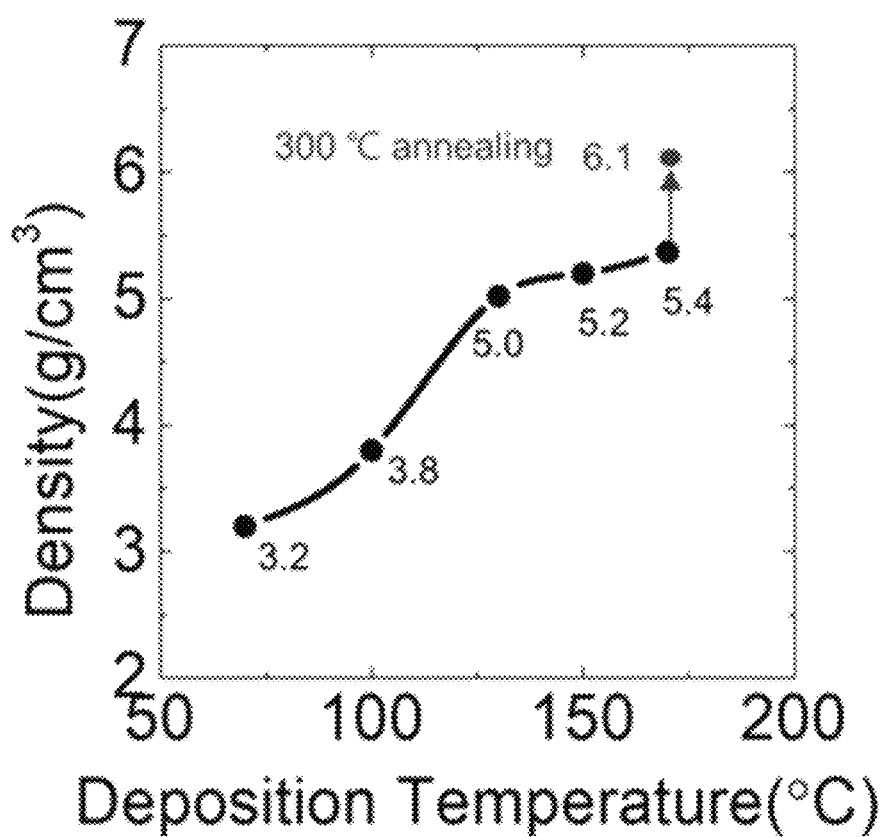
FIG. 13 is a graph illustrating a change in bulk density based on a deposition temperature of a chalcogenide-based thin film (GeTe) formed according to an embodiment of the present disclosure.

FIG. 13 is a graph illustrating a change in bulk density based on a deposition temperature of a chalcogenide-based thin film (GeTe) formed according to an embodiment of the present disclosure. The deposition temperature was changed from 70° C. to 170° C. With respect to a thin film deposited at 170° C., a density thereof when annealing at 300° C. was measured.

Referring to FIG. 13, a bulk density of a thin film formed at 130° C. is about 5.0 g·cm$^{-3}$ which is a value similar to a theoretical density (5.61 g·cm$^{-3}$) of bulk amorphous GeTe. A bulk density of a thin film formed at 170° C. was about 5.4 g·cm$^{-3}$, and when annealing at 300° C. after deposition, the bulk density was increased to about 6.1 g·cm$^{-3}$. The bulk density after annealing corresponds well to a density value of crystalline rhombohedral GeTe. Thus, it can be confirmed that crystallization occurs when the deposited thin films are annealed. The thin films deposited at a temperature of 170° C. or less may also be crystallized by annealing, and densities thereof may increase.

Figure 14:
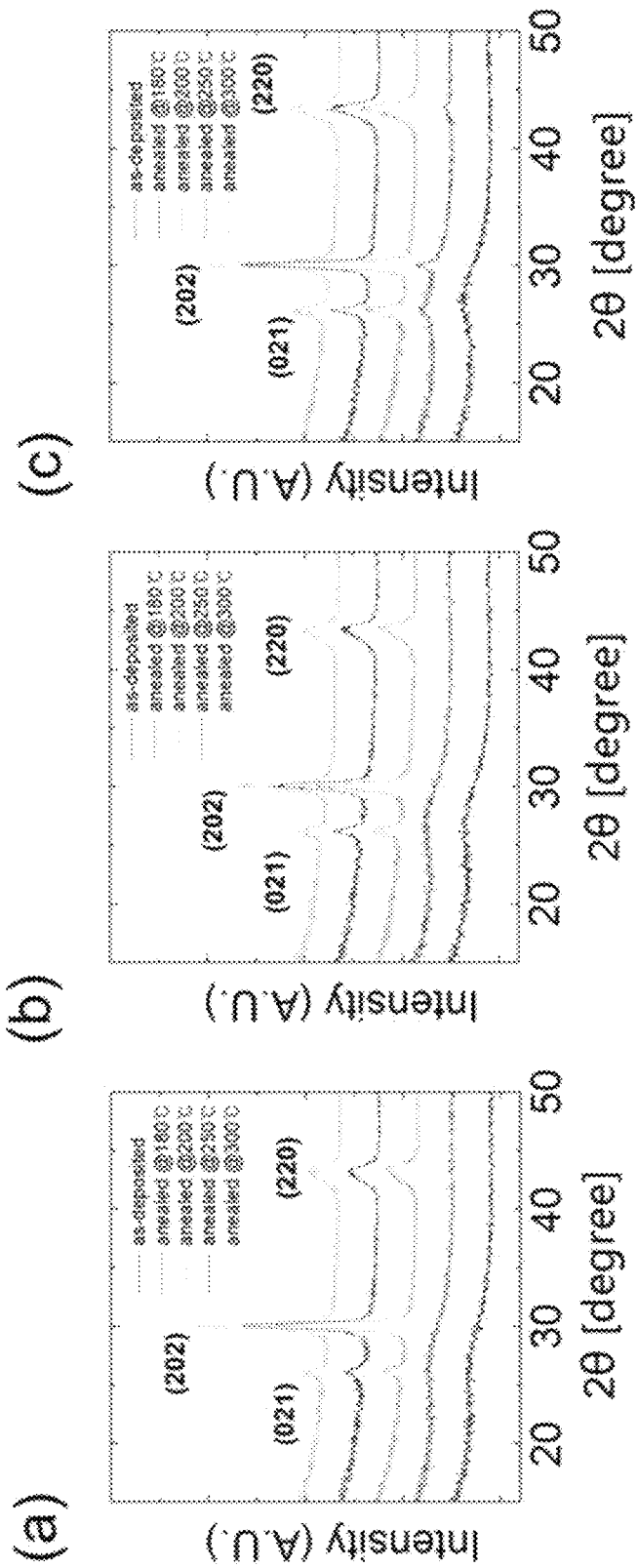
FIG. 14 is a glancing incident X-ray diffraction (GIXRD) analysis result illustrating a change in crystallinity based on a subsequent annealing temperature condition of a chalcogenide-based thin film (GeTe) formed according to an embodiment of the present disclosure.

FIG. 14 is a glancing incident X-ray diffraction (GIXRD) analysis result illustrating a change in crystallinity based on a subsequent annealing temperature condition of a chalcogenide-based thin film (GeTe) formed according to an embodiment of the present disclosure. FIG. 14A illustrates a result of a GeTe thin film deposited at 130° C., FIG. 14B illustrates a result of a GeTe thin film deposited at 150° C., and FIG. 14C illustrates a result of a GeTe thin film deposited at 170° C. With respect to each case, annealing temperature conditions were changed to 180, 200, 250, and 300° C., and annealing was performed in an N$_2$ atmosphere for 30 minutes.

Referring to FIGS. 14A and 14B, it can be confirmed that thin films deposited at 130° C. and 150° C. begin to crystallize into rhombohedral GeTe upon annealing at a temperature of 200° C. or more.

Referring to FIG. 14C, it can be confirmed that a thin film deposited at 170° C. begins to crystallize upon annealing at 180° C. slightly lower than 200° C. The thin film deposited at 170° C. may have a relatively high thin film density in a state before annealing (that is, an as-deposited state), and may have a relatively high intensity of a peak in a region of 2θ=27.5°, and accordingly crystallization may be easily performed even at a lower annealing temperature.

Figure 15:
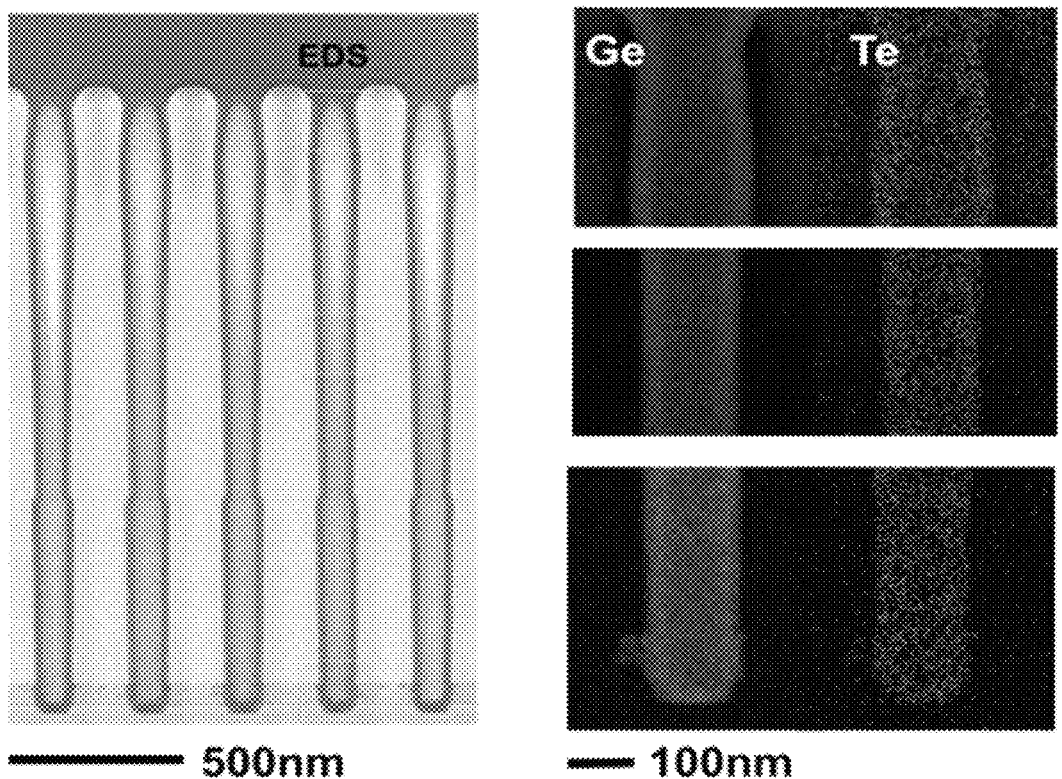
FIG. 15 is a diagram illustrating a transmission electron microscopy (TEM) cross-sectional image (left image) and an energy dispersive spectroscopy (EDS) analysis result (right image) for a chalcogenide-based thin film (GeTe) formed on a substrate having a high-aspect-ratio hole structure, according to an embodiment of the present disclosure.

FIG. 15 is a diagram illustrating a transmission electron microscopy (TEM) cross-sectional image (left image) and an energy dispersive spectroscopy (EDS) analysis result (right image) for a chalcogenide-based thin film (GeTe) formed on a substrate having a high-aspect-ratio hole structure, according to an embodiment of the present disclosure. Here, the GeTe thin film was deposited at a deposition temperature of 170° C. on a hole structure having an aspect ratio of about 29:1. The right image of FIG. 15 illustrates a result of composition mapping by an EDS analysis technique in each of upper, middle, and lower regions of a hole.

Referring to FIG. 15, it can be confirmed that the thin film is conformally deposited on the hole structure having a high aspect ratio by the ALD process according to the embodiment. In this case, an opening of the hole had a diameter of about 100 nm, and had a depth of about 2900 nm. It can be confirmed that the thin film deposition was very uniformly formed on an entire surface of the hole structure. The deposited thin film had a thickness of about 28 nm.

Figure 16:
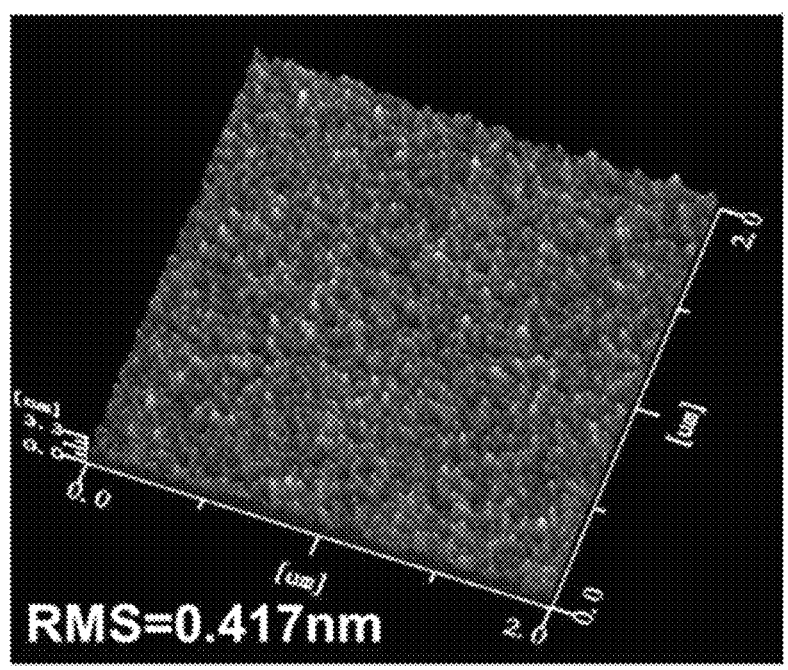
FIG. 16 is a diagram illustrating an atomic force microscope (AFM) image of a chalcogenide-based thin film (GeTe) formed on a SiO2 substrate according to an embodiment of the present disclosure.

FIG. 16 is a diagram illustrating an atomic force microscope (AFM) image of a chalcogenide-based thin film (GeTe) formed on a SiO$_2$ substrate according to an embodiment of the present disclosure. Here, a GeTe thin film was deposited at 170° C. to have a thickness of 50 nm, and this analysis was performed in an as-deposited state before annealing.

Referring to FIG. 16, as a result of measuring surface roughness by using a root mean square (RMS) method, the roughness was very low, about 0.417 nm. Thus, it can be confirmed that the formed thin film has excellent surface morphology and high smoothness.

The above-described chalcogenide-based thin film according to the embodiment may be a phase change material layer, and the phase change material layer may be applied as a memory layer (information storage layer) of a phase change memory device (PRAM).

A method of forming a phase change material layer according to the embodiment of the present disclosure may include forming a chalcogenide-based thin film using the above-described ALD process. In addition, the method may further include annealing the chalcogenide-based thin film. In this case, the annealing temperature may be determined in a temperature range of about 180 to 400° C.

A method of manufacturing a phase change memory device according to the embodiment of the present disclosure may include forming a phase change material layer by using the above-described method, and forming an electrode structure for applying a voltage to the phase change material layer. In addition, the method may further include forming a switching device electrically connected to the phase change material layer.

Figure 17:
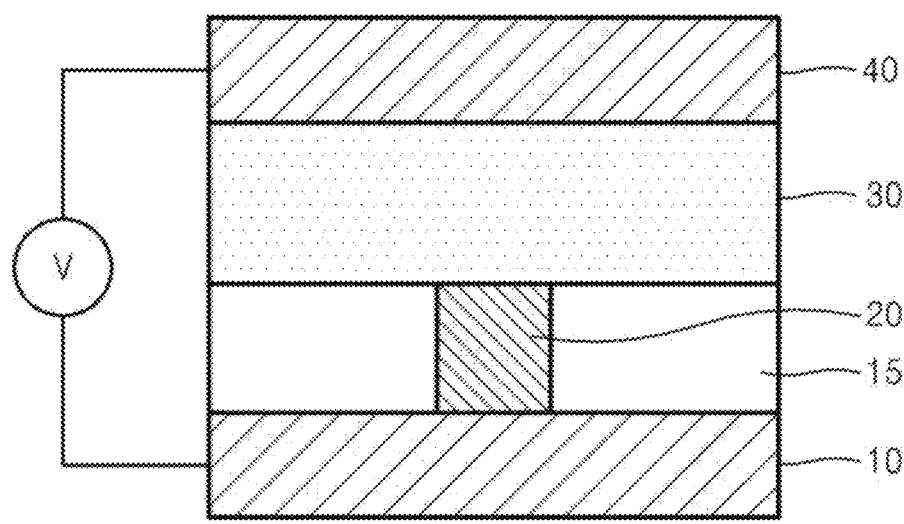
FIG. 17 is an exemplary diagram illustrating a phase change memory device (PRAM) to which a chalcogenide-based thin film is applied according to an embodiment of the present disclosure.

FIG. 17 is an exemplary diagram illustrating a phase change memory device (PRAM) to which a chalcogenide-based thin film is applied according to an embodiment of the present disclosure.

Referring to FIG. 17, the phase change memory device may include a lower electrode 10, a lower electrode contact layer 20, a phase change layer 30, and an upper electrode 40 stacked in sequence. The lower electrode contact layer 20 may have a smaller width than that of the lower electrode 10, and may connect the lower electrode 10 and the phase change layer 30 to each other. An interlayer insulating layer 15 surrounding the lower electrode contact layer 20 may be provided between the lower electrode 10 and the phase change layer 30. Although not illustrated in FIG. 17, one of the lower electrode 10 and the upper electrode 40, for example, the lower electrode 10 may be connected to the switching device. The switching device may be a transistor formed on a substrate (not illustrated), but may be a device other than a transistor, for example, a diode. Depending on a voltage V applied between the lower electrode 10 and the upper electrode 40, a phase of a portion of the phase change layer 30 that is in contact with the lower electrode contact layer 20 may be changed. However, a structure of the phase change memory device described with reference to FIG. 17 is exemplary, and may vary.

Figure 18A:
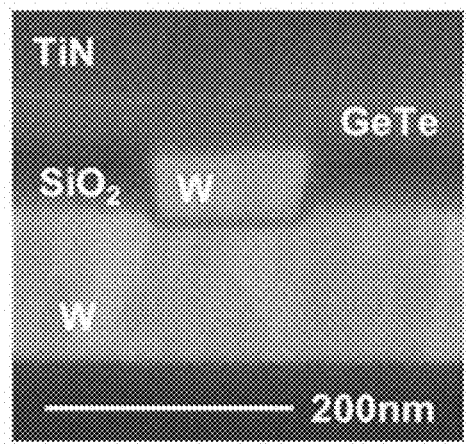
FIG. 18A is a cross-sectional view illustrating a phase change memory device manufactured according to an embodiment of the present disclosure.

FIG. 18A is a cross-sectional view illustrating a phase change memory device manufactured according to an embodiment of the present disclosure.

Referring to FIG. 18A, W (tungsten) may be applied as a material of a lower electrode and a lower electrode contact layer, $SiO_2$ may be used as an interlayer insulating layer material, a GeTe thin film formed by an ALD process according to the embodiment of the present disclosure may be applied as a phase change layer material, and TiN may be applied as an upper electrode material. The lower electrode contact layer had a diameter of about 130 nm.

Figure 18B:
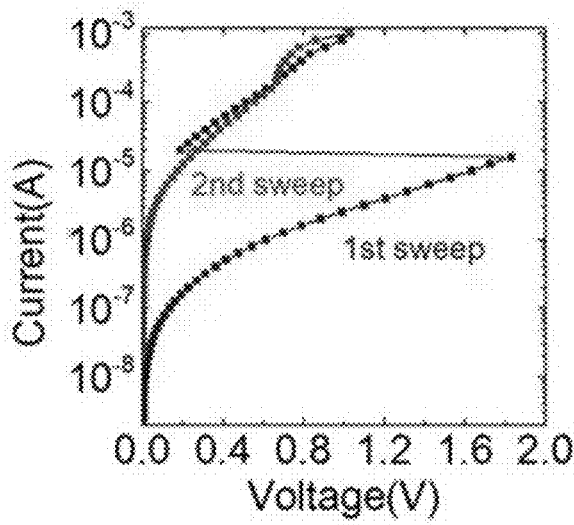
FIG. 18B is a graph illustrating a current-voltage switching characteristic using a current sweep method for the device of FIG. 18A.

FIG. 18B is a graph illustrating a current-voltage switching characteristic using a current sweep method for the device of FIG. 18. In this case, the GeTe thin film was deposited at 170° C. A pristine (that is, amorphous-as-deposited) GeTe thin film exhibits high resistance state (HRS) characteristics up to about ~20 µA, but when the applied current further increases, resistance may be switched to a low resistance state (LRS) by a sudden snapback of voltage. This switching has a non-volatile characteristic.

Figure 18C:
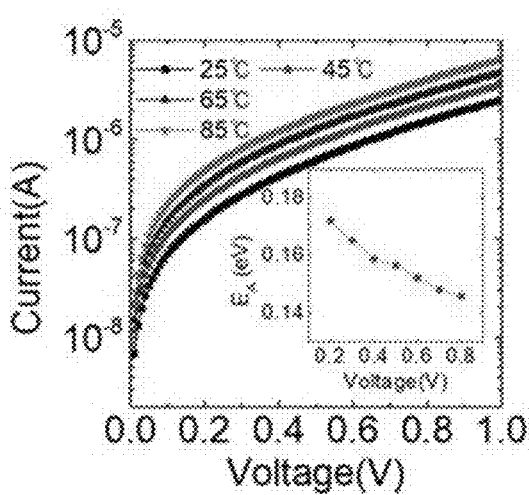
FIG. 18C is a graph illustrating temperature dependence of resistance in a high resistance state (HRS) of the device of FIG. 18A.

FIG. 18C is a graph illustrating temperature dependence of resistance in an HRS of the device of FIG. 18A. A current level in the HRS may slightly increase in response to an increase in temperature.

Figure 18D:
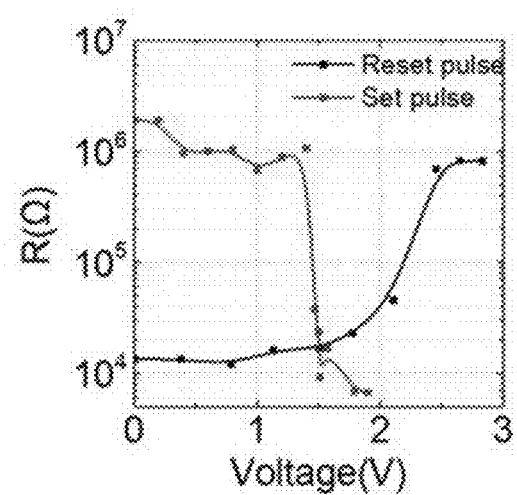
FIG. 18D is a graph illustrating a resistance-voltage measurement result for the device of FIG. 18A.

FIG. 18D is a graph illustrating a resistance-voltage measurement result for the device of FIG. 18A. A SET (switching from HRS to LRS) voltage and a RESET (switching from LRS to HRS) voltage of a phase change memory device may be determined from this resistance-voltage measurement. Minimum voltages for SET and RESET may be about 1.5 V and 2.5 V, respectively. Appropriate SET and RESET voltages may be set to 2 V and 2.8 V, respectively. However, conditions and features related to a device operation described with reference to FIGS. 18A to 18D are merely exemplary, and may vary.

Figure 19:
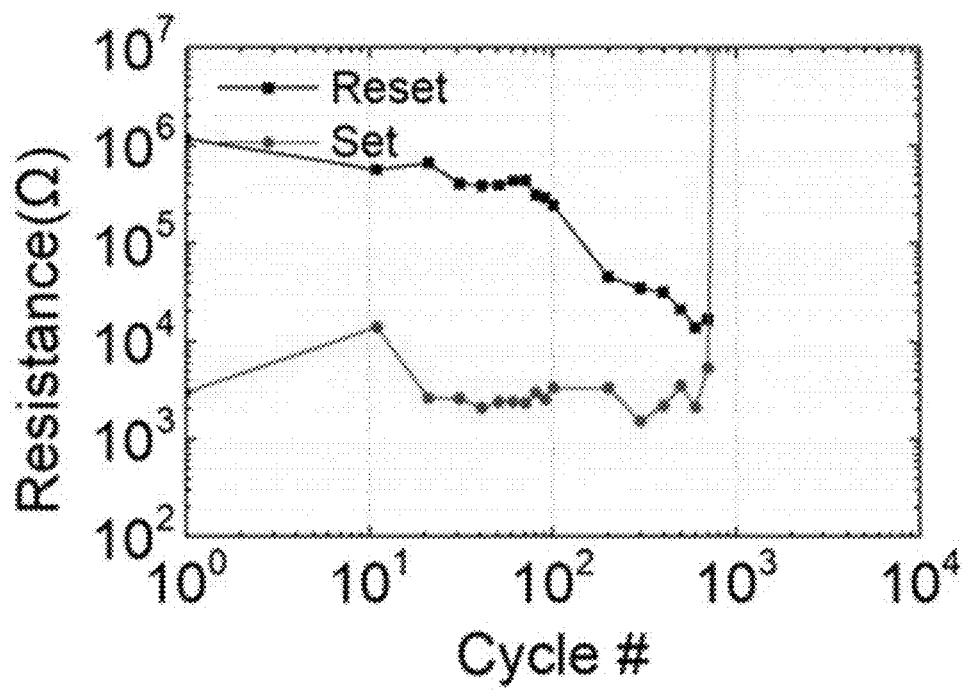
FIGS. 19 and 20 are graphs illustrating results of evaluating durability based on an increase in switching cycle of a phase change memory device including a GeTe phase change layer formed according to an embodiment of the present disclosure.
Figure 20:
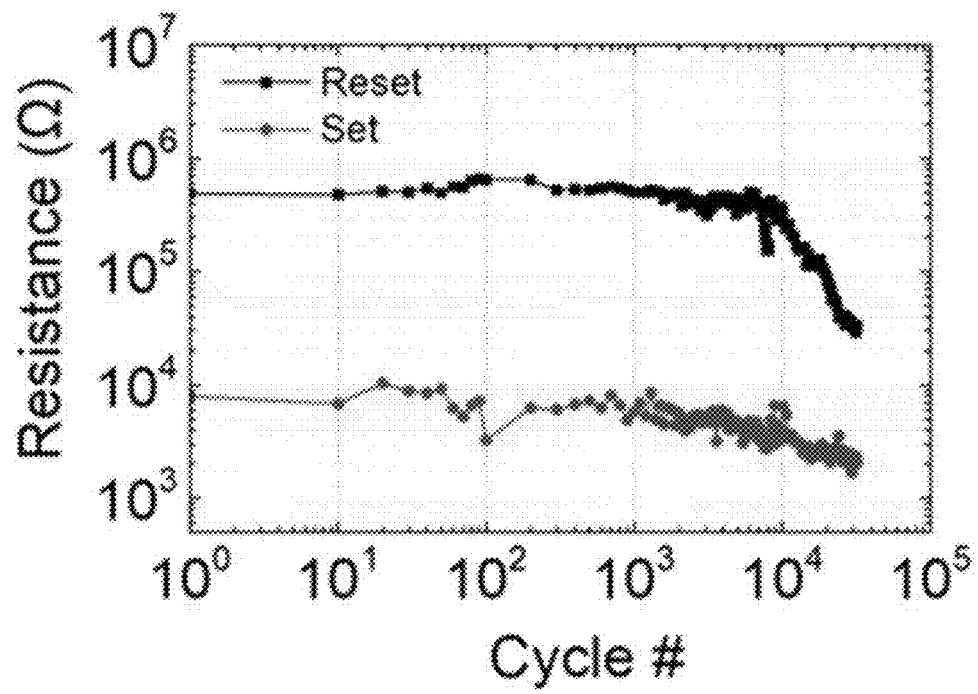

FIGS. 19 and 20 are graphs illustrating results of evaluating durability based on to an increase in switching cycle of a phase change memory device including a GeTe phase change layer formed according to an embodiment of the present disclosure. FIG. 19 relates to a phase change memory device including a GeTe thin film deposited at 150° C. as a phase change layer, and FIG. 20 relates to a phase change memory device including a GeTe thin layer deposited at 170° C. as a phase change layer.

Referring to FIG. 19, a phase change memory device including a GeTe thin film deposited at 150° C. as a phase-change layer exhibited durability in which a switching cycle is generally well maintained up to about ~800 cycles.

Referring to FIG. 20, a phase change memory device including a GeTe thin film deposited at 170° C. as a phase-change layer exhibited excellent durability in which a switching cycle is well maintained up to about $\sim 3 \times 10^4$ cycles. In this case, a resistance change ratio was maintained at about ~100.

Figure 21:
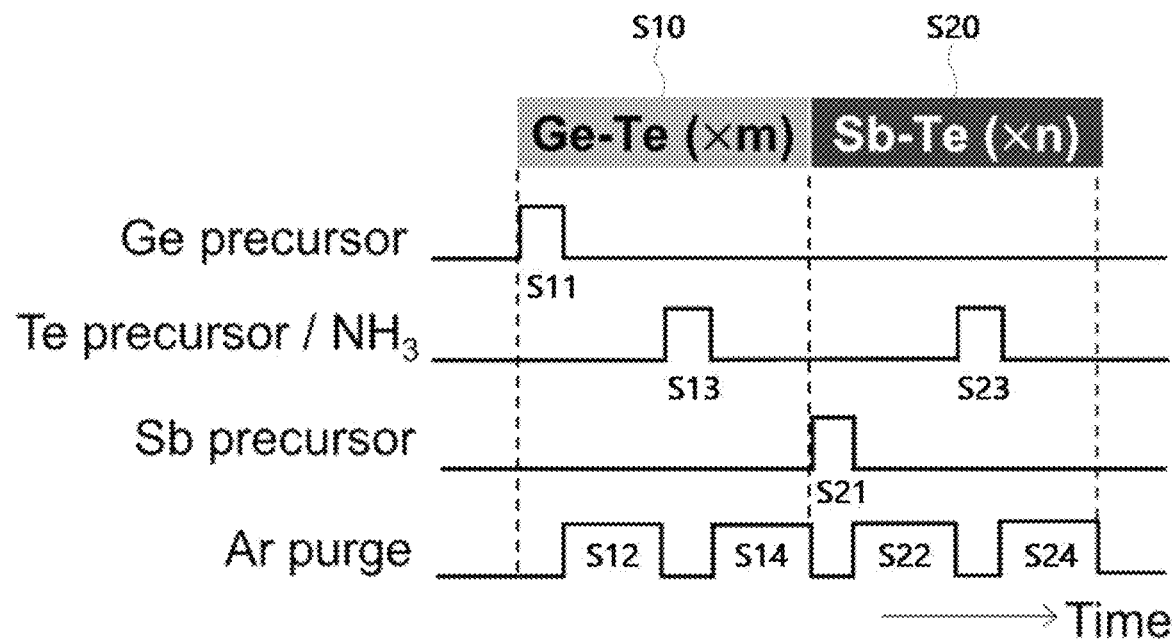
FIG. 21 is a diagram illustrating an ALD sequence applicable to a method of forming a chalcogenide-based thin film by an ALD process according to another embodiment of the present disclosure.

FIG. 21 is a diagram illustrating an ALD sequence applicable to a method of forming a chalcogenide-based thin film by an ALD process according to another embodiment of the present disclosure.

Referring to FIG. 21, the method of forming a chalcogenide-based thin film using an ALD process according to this embodiment may include an operation S10 of forming a Ge—Te-based material. The operation S10 of forming a Ge—Te-based material may include a first operation S11 of supplying, into a reaction chamber (not illustrated) provided with a substrate (substrate to be deposited) (not illustrated), a first source gas including a Ge precursor with Ge having an oxidation state of +2, a second operation S12 of supplying a first purge gas into the reaction chamber, a third operation S13 of supplying, into the reaction chamber, a second source gas including a Te precursor and a first co-reactant gas for promoting a reaction between the Ge precursor and the Te precursor, and a fourth operation S14 of supplying a second purge gas into the reaction chamber. Here, the first to fourth operations S11 to S14 may be the same as or similar to the first to forth operations S1 to S4 described with reference to FIG. 1, respectively. The operation S10 of forming a Ge—Te-based material may be substantially the same as or similar to the method of forming a Ge—Te-based material described with reference to FIGS. 1 to 16.

The method of forming a chalcogenide-based thin film using an ALD process according to this embodiment may further include an operation S20 of forming a Sb—Te-based material. The operation S20 of forming a Sb—Te-based material may include a fifth operation S21 of supplying, into the reaction chamber, a third source gas including a Sb precursor, a sixth operation S22 of supplying a third purge gas into the reaction chamber, a seventh operation S23 of supplying, into the reaction chamber, the fourth source gas including a second Te precursor and a second co-reactant gas, and an eighth operation S24 of supplying a fourth purge gas into the reaction chamber.

Here, the fourth source gas may be the same as the second source gas, and the second co-reactant gas may be the same as the first co-reactant gas. In other words, the fourth source gas may include, for example, $Te(SiMe_3)_2$ as the second Te precursor. However, a material of the second Te precursor is not limited to $Te(SiMe_3)_2$, and may vary. The second co-reactant gas may include, for example, $NH_3$. The second co-reactant gas may be an $NH_3$ gas. The second co-reactant gas may be a type of catalyst. The fourth source gas and the second co-reactant gas may be simultaneously supplied into the reaction chamber.

A "deposition temperature" in the operation S10 of forming a Ge—Te-based material and/or the operation S20 of forming a Sb—Te-based material of the method of forming a chalcogenide-based thin film according to the embodiment described with reference to FIG. 21 may be determined in a range of about 70 to 200° C. Here, the deposition temperature may correspond to a temperature of a substrate to be deposited during thin film formation. That is, an ALD thin film deposition process may be performed in a state where a substrate provided in a reaction chamber is heated to the above-described temperature range. The deposition temperature in the ALD process according to this embodiment may be about 100 to 200° C. or about 100 to 180° C. This deposition temperature may be higher than a deposition temperature (about 70 to 100° C.) in a conventional ALD process. In this regard, the thin film formed by the ALD process according to the embodiment may have excellent characteristics in terms of density, strength, film quality, physical properties, and the like. In addition, the thin film formed by the ALD process according to the embodiment may have excellent phase transition characteristics, excellent durability, and the like.

The operation S10 of forming a Ge—Te based material may be configured to form a GeTe material. Here, the GeTe material may be a compound in which Ge and Te are in a 1:1 ratio, that is, a compound having a stoichiometric composition, or a material substantially corresponding thereto. The operation S20 of forming a Sb—Te based material may be configured to form a $Sb_2Te_3$ material or a material substantially corresponding thereto.

In the operation S10 of forming a Ge—Te-based material, the first to fourth operations S11 to S14 for forming the Ge—Te-based material may be repeatedly performed m times (m is an integer of 1 or more), and in the operation S20 of forming a Sb—Te-based material, the fifth to eighth operations S21 to S24 for forming the the Sb—Te-based material may be repeatedly performed n times (n is integer of 1 or more). In addition, the operation S10 of forming a Ge—Te-based material and the operation S20 of forming a Sb—Te based material may be alternately and repeatedly performed. As a result, the formed chalcogenide-based thin film may be a $(GeTe)_x(Sb_2Te_3)_{1-x}$ thin film or may include a $(GeTe)_x(Sb_2Te_3)_{1-x}$ material. The $(GeTe)_x(Sb_2Te_3)_{1-x}$ thin film may be a nanocrystalline-as-deposited film in some cases, and may also be a pseudobinary film. A subsequent annealing process for the deposited $(GeTe)_x(Sb_2Te_3)_{1-x}$ thin film may be performed, but may not be performed.

When using the ALD process according to this embodiment, the operation S10 of forming a Ge—Te-based material and the operation S20 of forming a Sb—Te-based material may be appropriately mixed/combined, as a result thereby forming a $Ge_2Sb_2Te_5$ (that is, GST225) thin film or a material film substantially corresponding thereto. The $Ge_2Sb_2Te_5$ (GST225) thin film may have excellent phase transition characteristics and excellent durability in comparison to a conventional $Ge_2Sb_2Te_7$ (GST227) thin film. Thus, according to the embodiment of the present disclosure, a phase change memory device having excellent performance, durability and stability may be easily implemented.

The chalcogenide-based thin film formed according to this embodiment, for example, the GST225 thin film may have a crystalline structure in which amorphous and nanocrystalline are mixed in an as-deposited state. Depending on the deposition temperature, a ratio of amorphous and nanocrystalline in the GST225 thin film may vary, and crystallization (complete or generally complete crystallization) and phase change may be induced through a subsequent annealing process. The annealing temperature may be determined in a temperature range of about 180 to 400° C. However, the GST225 thin film may not be necessarily deposited in a mixed structure of amorphous and nanocrystalline. In some cases, the GST225 thin film may be deposited in a generally amorphous state or in a generally crystalline state.

A method of forming a thin film according to an experimental example may be as follows.

GST films were deposited in an ALD reactor with a 12 inch diameter showerhead and a substrate heater suitable for an 8 inch wafer scale. $Ge(guan)NMe_2$, $Te(SiMe_3)_2$, and $Sb(OEt)_3$ were used as a Ge precursor, Te precursor, and Sb precursor, respectively, and an $NH_3$ gas was used as a co-reactant gas. The NH3 gas was injected simultaneously with the Te precursor. The Ge precursor, Te precursor and Sb precursor were heated to 65° C., 35° C., and 40° C. temperatures, respectively, and gas phase pressures of 0.079 torr, 1 torr and 1 torr were formed. The films were grown on $Si/SiO_2$ or Si/TiN substrate (here, $SiO_2$ and TiN are upper surface portions), and the deposition temperature range was about 70 to 200° C. (100 to 170° C.). The precursors were injected into an ALD chamber at a flow rate of 50 sccm by an Ar carrier gas, and an Ar gas was injected at 200 sccm for a purge process. A working pressure of a process chamber (that is, ALD chamber) during deposition was maintained in a range of 4.5 to 5.5 torr. Alternating injection pulses of Ge—Te or Sb—Te precursors form a binary subcycle for the deposition of a Ge—Ta material (GT) or a Sb—Te material (ST). One supercycle is formed by blending these binary subcycles at an arbitrary ratio. A ternary GST thin film may be deposited by repeating the supercycles. A composition (composition ratio) of the ternary GST thin film may vary depending on a ratio of the subcycle. A precursor injection pulse time and a purge pulse time were adjusted in various ways. In a GT subcycle, an injection/purge time of the Ge precursor may be, for example, about 3 s/15 s, and an injection/purge time of the Te precursor (with $NH_3$) may be, for example, about 2 s/15 s. In an ST subcycle, Injection times of the Sb and Te precursors may be slightly changed under an existing process condition for a high-temperature deposition process. An injection/purge time of the Sb precursor may be, for example, about 2 s/15 s, and an injection/purge time of the Te precursor (with $NH_3$) may be, for example, about is/15 s. However, the injection/purge times of the precursors are merely exemplary, and may vary. In addition, various conditions of the above-described experimental example are merely exemplary, and the present disclosure is not limited thereto, and may vary.

In some cases, the operation S20 of forming a Sb—Te-based material illustrated in FIG. 21 may be replaced with an existing general process of forming a $Sb_2Te_3$ thin film (ALD process), or may be modified similarly thereto. Even in this case, a $Ge_2Sb_2Te_5$ (GST225) thin film may be formed.

The Ge precursor and the Te precursor used in the method of forming a chalcogenide-based thin film by an ALD process according to another embodiment of the present disclosure (the embodiment of FIG. 21) may be the same as described with reference to FIGS. 1 to 3.

Figure 22:
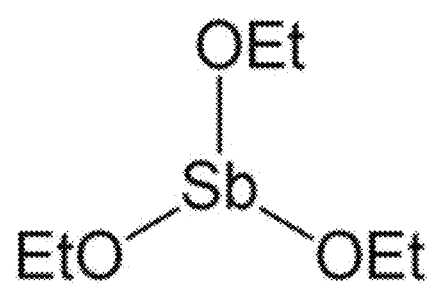
FIG. 22 is an exemplary chemical structure illustrating a Sb precursor applicable to a method of forming a chalcogenide-based thin film by an ALD process according to another embodiment of the present disclosure.

FIG. 22 is an exemplary chemical structure illustrating a Sb precursor applicable to a method of forming a chalcogenide-based thin film by an ALD process according to another embodiment of the present disclosure.

Referring to FIG. 22, a Sb precursor may be, for example, $Sb(OEt)_3$. $Sb(OEt)_3$ may correspond to $Sb(OCH_2CH_3)_3$. A material of the Sb precursor is not limited to $Sb(OEt)_3$, and may vary.

Figure 23:
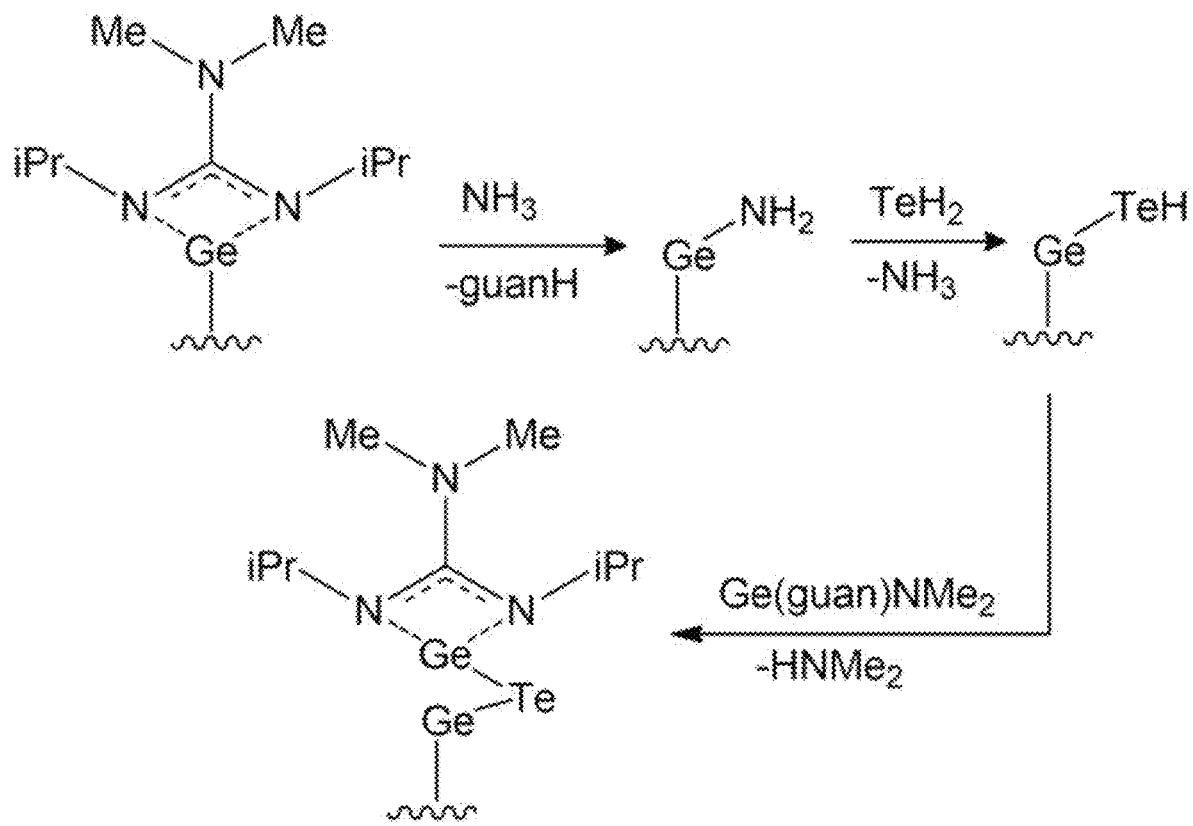
FIG. 23 is a diagram illustrating gradational chemical reactions that may occur in an operation of forming a Ge—Te-based material in a method of forming a chalcogenide-based thin film according to another embodiment of the present disclosure.

FIG. 23 is a diagram illustrating gradational chemical reactions that may occur in an operation of forming a Ge—Te-based material (S10 in FIG. 21) in a method of forming a chalcogenide-based thin film according to another embodiment of the present disclosure.

Referring to FIG. 23, reactions between a Ge precursor, a Te precursor, and a first co-reactant gas ($NH_3$) may be confirmed. FIG. 23 may be the same as described with reference to FIGS. 4 and 5, and thus repeated detailed description thereof will be omitted. As a result, a Ge—Te-based material (GeTe material) may be deposited on a substrate.

Formula 1 below shows a net chemical reaction occurring in an operation of forming a Ge—Te-based material (S10 in FIG. 21).

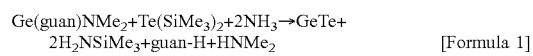

Ge(guan)NMe$_2$+Te(SiMe$_3$)$_2$+2NH$_3$→GeTe+ 2H$_2$NSiMe$_3$+guan-H+HNMe$_2$ [Formula 1]

Figure 24:
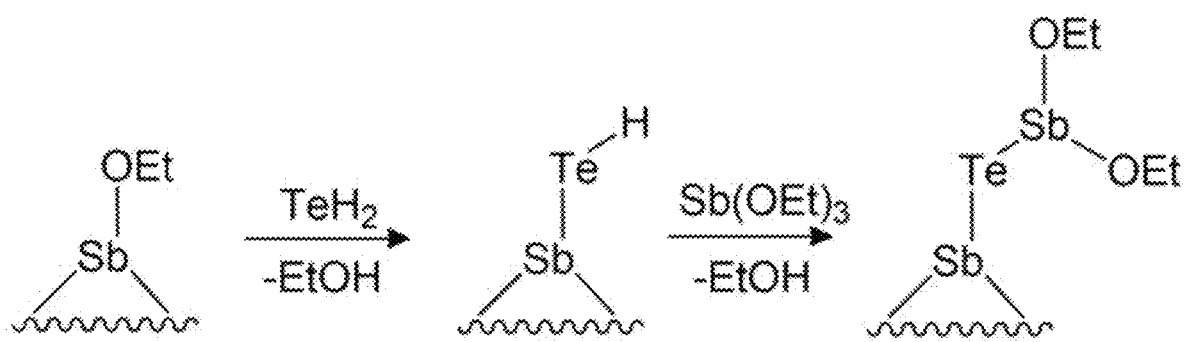
FIG. 24 is a diagram illustrating gradational chemical reactions that may occur in an operation of forming a Sb—Te-based material in a method of forming a chalcogenide-based thin film according to another embodiment of the present disclosure.

FIG. 24 is a diagram illustrating gradational chemical reactions that may occur in an operation of forming a Sb—Te-based material (S20 in FIG. 2) in a method of forming a chalcogenide-based thin film according to another embodiment of the present disclosure.

Referring to FIG. 24, reactions between a Sb precursor, a Te precursor, and a second co-reactant gas ($NH_3$) may be confirmed. $TeH_2$ may be generated by a reaction between the Te precursor and the second co-reactant gas ($NH_3$). In $Sb(OEt)_3$ that is the Sb precursor, an ethoxy group may be decomposed into an ethanol (EtOH) form from Sb through protonation by $TeH_2$, and a bond between Sb and Te may be formed on a substrate. As a result, a $Sb_2Te_3$ material may be deposited.

Formula 2 shows a net chemical reaction occurring in an operation of forming a Ge—Te-based material (S20 in FIG. 21).

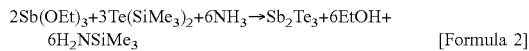

$$2Sb(OEt)_3 + 3Te(SiMe_3)_2 + 6NH_3 \rightarrow Sb_2Te_3 + 6EtOH + 6H_2NSiMe_3 \quad \text{[Formula 2]}$$

When a second co-reactant gas (for example, $NH_3$) is not injected simultaneously with a Te precursor, a growth rate ($ng \cdot cm^{-2} \cdot cy^{-1}$) of a thin film ($Sb_2Te_3$) may be significantly lower than that of the thin film when co-injection is performed. Therefore, when forming the $Sb_2Te_3$ thin film, it may be desirable to inject the second co-reactant gas (for example, $NH_3$) simultaneously with the Te precursor.

Figure 25A:
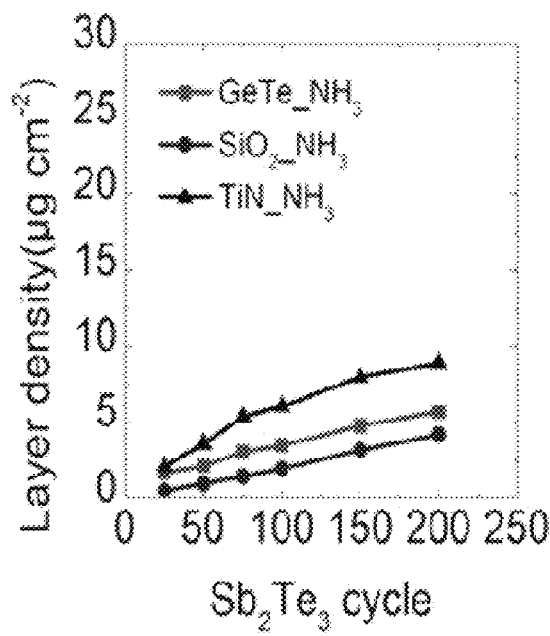
FIG. 25A is a graph illustrating a change in thin film (layer) density based on the number of ALD cycles in a method of forming a chalcogenide-based thin film according to another embodiment of the present disclosure.

FIG. 25A is a graph illustrating a change in thin film (layer) density based on the number of ALD cycles in a method of forming a chalcogenide-based thin film according to another embodiment of the present disclosure. Here, a thin film was a $Sb_2Te_3$ layer, and a deposition temperature was 130° C. The $Sb_2Te_3$ layer was formed by using a method of injecting $NH_3$ simultaneously with a Te precursor. FIG. 25A includes results when a material of an upper surface portion of a substrate is GeTe, $SiO_2$, and TiN.

Referring to FIG. 25A, it can be confirmed that a density of a $Sb_2Te_3$ thin film increases as the number of ALD cycles (that is, ST ALD cycles) increases. There was a difference in density depending on a type of substrate.

Figure 25B:
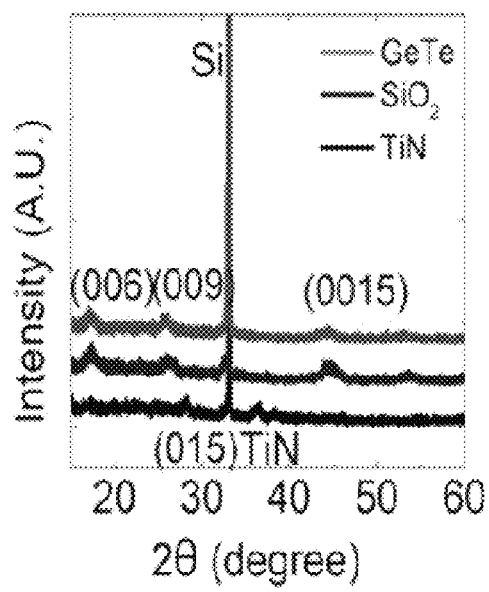
FIG. 25B is a graph illustrating XRD analysis results of the Sb2Te3 thin films illustrated in FIG. 25A.

FIG. 25B is a graph illustrating XRD analysis results of the $Sb_2Te_3$ thin films illustrated in FIG. 25A.

Referring to FIG. 25B, it can be confirmed from the XRD analysis result that all $Sb_2Te_3$ thin films (thickness: 8 nm) are crystalline in an as-deposited state.

Figure 26A:
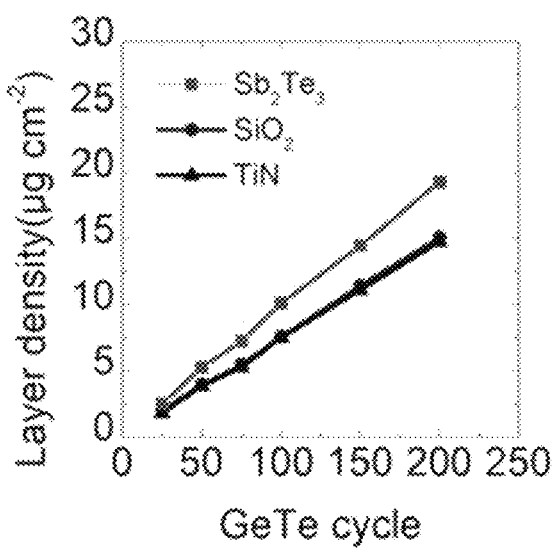
FIG. 26A is a graph illustrating a change in thin film (layer) density based on the number of ALD cycles in a method of forming a chalcogenide-based thin film according to another embodiment of the present disclosure.

FIG. 26A is a graph illustrating a change in thin film (layer) density based on the number of ALD cycles in a method of forming a chalcogenide-based thin film according to another embodiment of the present disclosure. In this case, a thin film was a GeTe layer, and a deposition temperature was 130° C. A GeTe layer was formed by using a method of injecting $NH_3$ simultaneously with a Te precursor. FIG. 26A includes results when a material of an upper surface portion of a substrate is $Sb_2Te_3$, $SiO_2$, and TiN.

Referring to FIG. 26A, it can be confirmed that a density of a GeTe thin film increases as the number of ALD cycles (i.e., GT ALD cycles) increases. Although there was a difference in density depending on a type of substrate, there was little difference in the case of $SiO_2$ and TiN substrate materials.

Figure 26B:
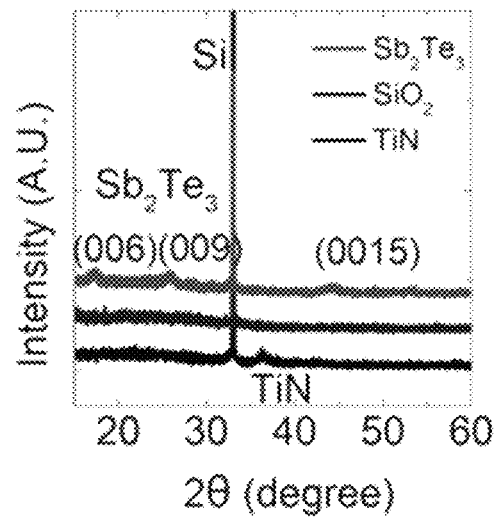
FIG. 26B is a graph illustrating XRD analysis results of the GeTe thin films illustrated in FIG. 25A.

FIG. 26B is a graph illustrating XRD analysis results of the GeTe thin films illustrated in FIG. 25A.

Referring to FIG. 26B, all GeTe thin films formed on three types of substrates were in an amorphous state. This result well corresponds to a relatively high crystallization temperature (about 180 to 190° C.) of a GT thin film.

Figure 27:
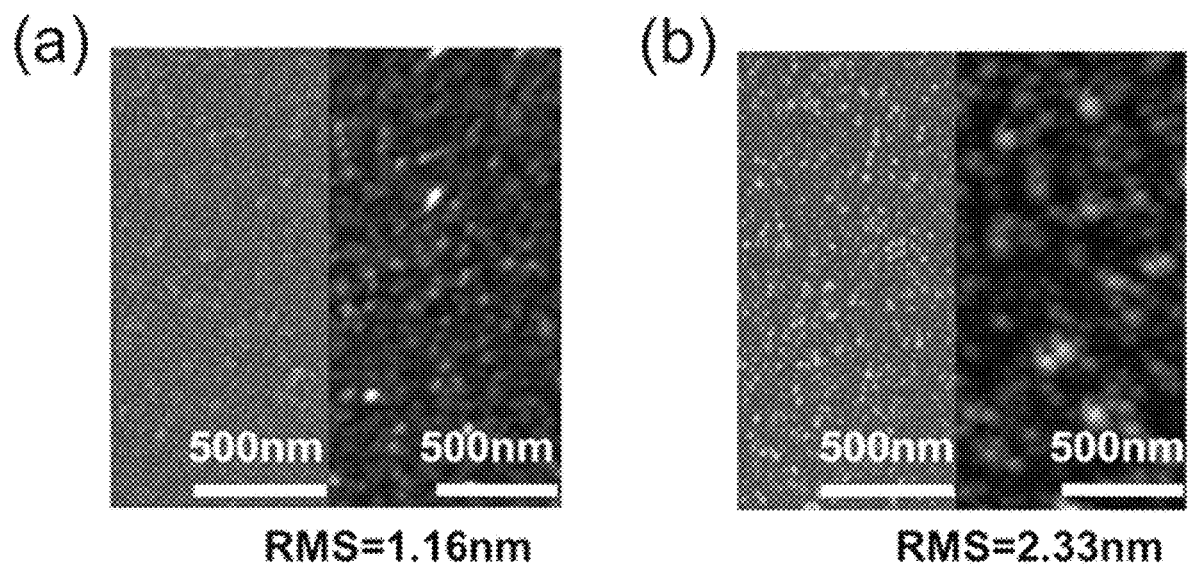
FIG. 27 is a diagram illustrating a scanning electron microscope (SEM) image and an AFM image of a chalcogenide-based thin film formed according to another embodiment of the present disclosure.

FIG. 27 is a diagram illustrating a scanning electron microscope (SEM) image and an AFM image of a chalcogenide-based thin film formed according to another embodiment of the present disclosure. FIG. 27A illustrates a $Sb_2Te_3$ thin film (with a thickness of 8 nm) formed on GeTe, and FIG. 27B illustrates a GeTe thin film (with a thickness of 20 nm) formed on $Sb_2Te_3$. In each of FIGS. 27A and 27B, a left image is an SEM image and a right image is an AFM image. The $Sb_2Te_3$ thin film and the GeTe thin film had a deposition temperature of 130° C.

In FIG. 27A, the $Sb_2Te_3$ thin film had an RMS roughness of about 1.16 nm, and in FIG. 27B, the GeTe thin film had an RMS roughness of about 2.33 nm. A chalcogenide-based thin film formed by the method according to the embodiment may have excellent surface morphology and high smoothness.

Figure 28:
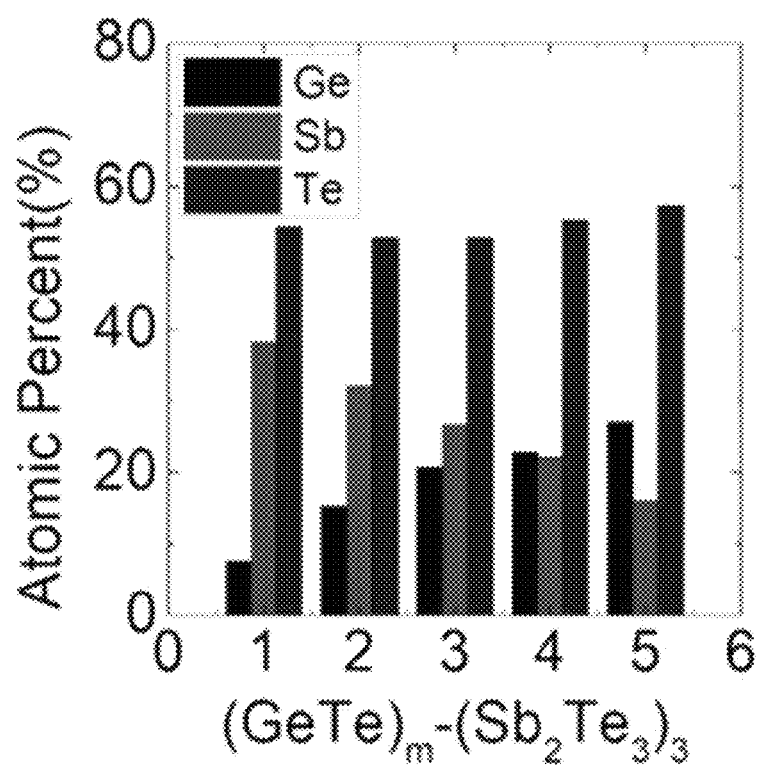
FIG. 28 is a graph illustrating a change in composition of a thin film when the number of GeTe subcycles (m) is increased from 1 to 5 in a state where the number of Sb2Te3 subcycles (n) is fixed to 3 in a method of forming a chalcogenide-based thin film according to another embodiment of the present disclosure.

FIG. 28 is a graph illustrating a change in composition of a thin film when the number of GeTe subcycles (m) is increased from 1 to 5 in a state where the number of $Sb_2Te_3$ subcycles (n) is fixed to 3 in a method of forming a chalcogenide-based thin film according to another embodiment of the present disclosure. In this case, the total number of supercycles was fixed to 20.

Referring to FIG. 28, as the number of GeTe subcycles (m) increases from 1 to 5, Ge and Te contents tended to generally increase, and a Sb content tended to relatively decrease. A variation of the Te content was relatively smaller than that of the Ge content.

Figure 29:
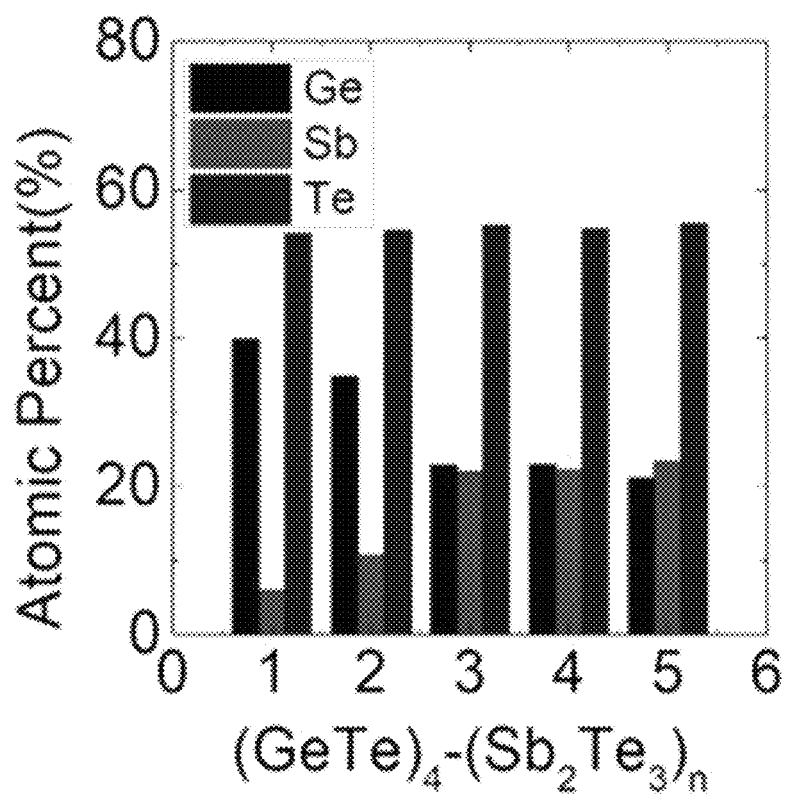
FIG. 29 is a graph illustrating a change in composition of a thin film when the number of Sb2Te3 subcycles (n) is increased from 1 to 5 in a state where the number of GeTe subcycles (m) is fixed to 4 in a method of forming a chalcogenide-based thin film according to another embodiment of the present disclosure.

FIG. 29 is a graph illustrating a change in composition of a thin film when the number of $Sb_2Te_3$ subcycles (n) is increased from 1 to 5 in a state where the number of GeTe subcycles (m) is fixed to 4 in a method of forming a chalcogenide-based thin film according to another embodiment of the present disclosure. In this case, the total number of supercycles was fixed to 20.

Referring to FIG. 28, as the number of $Sb_2Te_3$ subcycles (n) increases from 1 to 3, the Sb content increased, and then, in the process in which n increases to 5, the variation of the Sb content was not significant. The Ge content decreased to 3 as n increases, but then in the process in which n increases to 5, the variation thereof was not significant. The Te content did not have a significant variation in the process in which n increases to 5.

Figure 30:
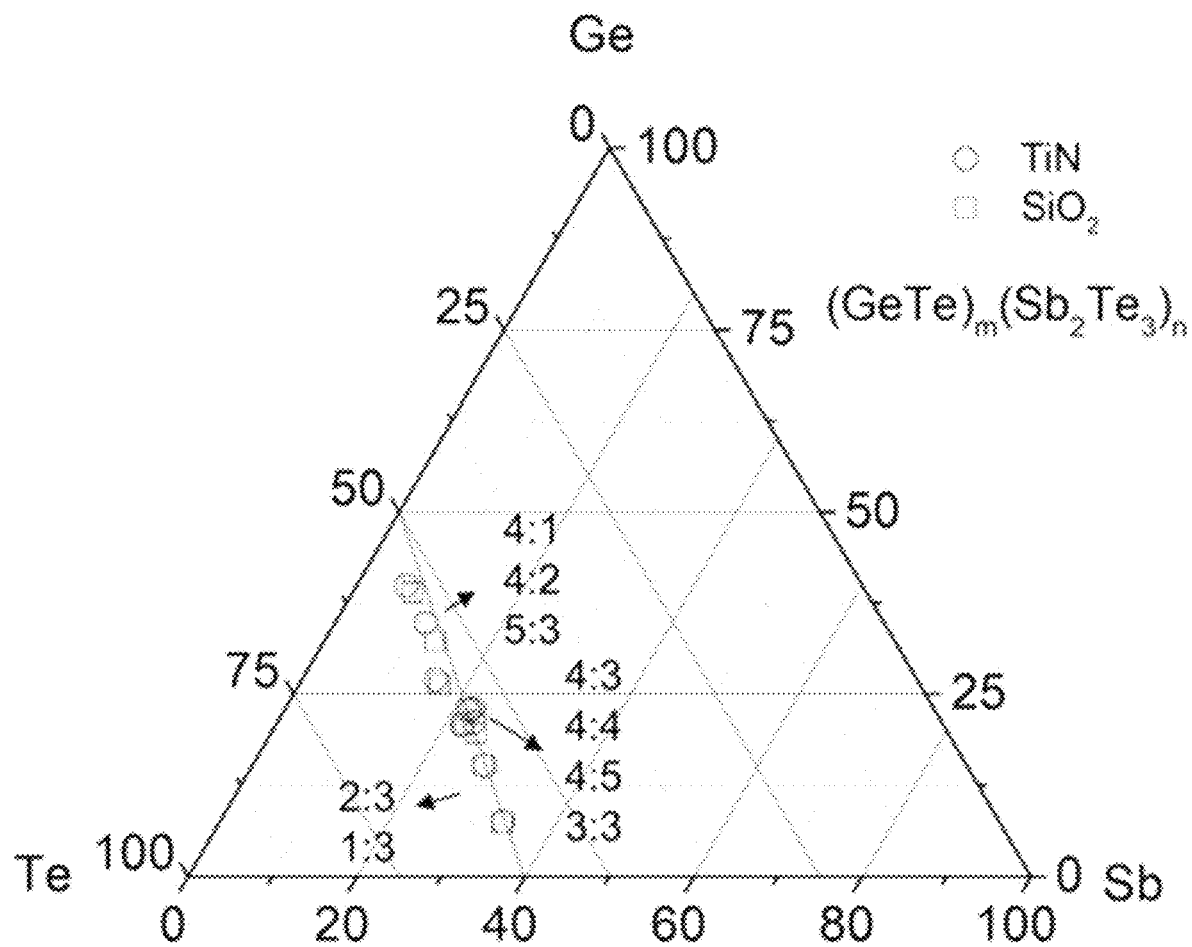
FIG. 30 is a ternary state diagram illustrating how a composition of a formed thin film is changed according to various combinations of two binary subcycles in a method of forming a chalcogenide-based thin film according to another embodiment of the present disclosure.

FIG. 30 is a ternary state diagram illustrating how a composition of a formed thin film is changed according to various combinations of two binary subcycles in a method of forming a chalcogenide-based thin film according to another embodiment of the present disclosure.

Referring to FIG. 30, it can be confirmed that all deposited thin films are located on or near a GeTe—$Sb_2Te_3$ tie line (that is, a pseudobinary tie line). Therefore, according to the embodiment of the present disclosure, a GST thin film having a GST225 composition may be easily grown. A GT/ST subcycle ratio (that is, m:n) for forming the GST 225 thin film may be selected to be, for example, 4:3.

Figure 31:
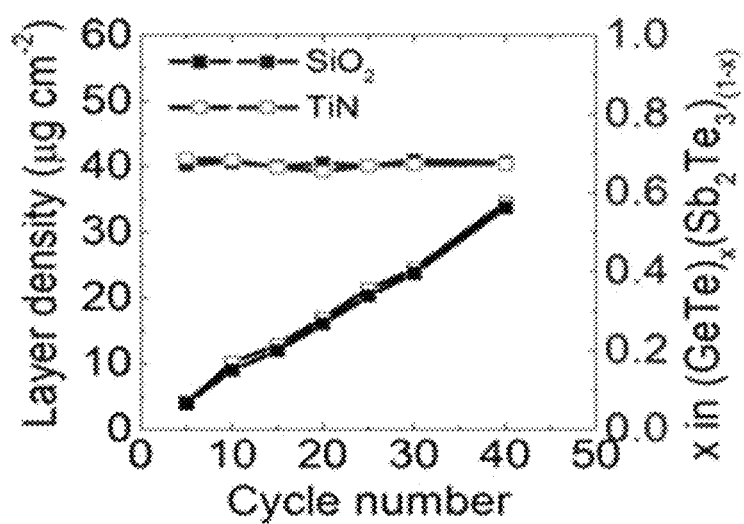
FIG. 31 is a graph illustrating how a density and a composition of a formed GST225 thin film are changed according to a change in the number of supercycles in a method of forming a chalcogenide-based thin film according to another embodiment of the present disclosure.

FIG. 31 is a graph illustrating how a density and a composition of a formed GST225 thin film are changed according to a change in the number of supercycles in a method of forming a chalcogenide-based thin film according to another embodiment of the present disclosure. In this case, a thin film was deposited at a deposition temperature of 130° C., and a ratio of m:n was 4:3.

Figure 32:
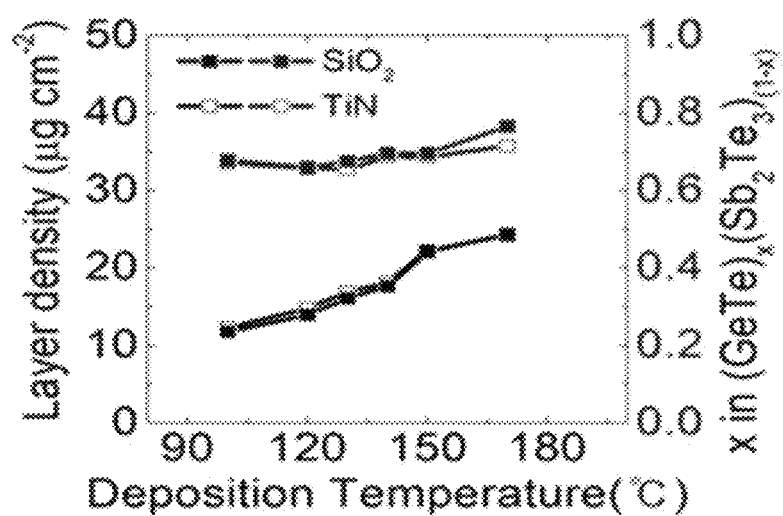
FIG. 32 is a graph illustrating how a density and a composition of a formed GST225 thin film are changed according to a change in deposition temperature in a method of forming a chalcogenide-based thin film according to another embodiment of the present disclosure.

FIG. 32 is a graph illustrating how a density and a composition of a formed GST225 thin film are changed according to a change in deposition temperature in a method of forming a chalcogenide-based thin film according to another embodiment of the present disclosure. The number of supercycles was 20, and a ratio of m:n was 4:3.

Referring to FIGS. 31 and 32, it can be confirmed that even when the number of supercycles is changed or a deposition temperature is changed, a composition of the formed GST225 thin film is almost unchanged and generally maintained. As the number of supercycles increases or the deposition temperature increases, a density of the GST225 thin film tended to increase generally linearly.

Figure 33:
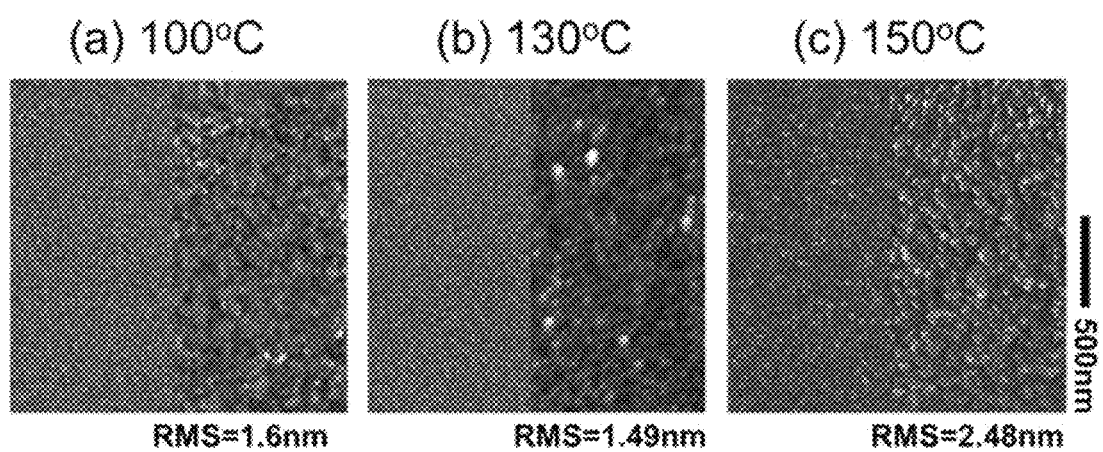
FIG. 33 is a diagram illustrating an SEM image and an AFM image of a GST225 thin film formed to have a thickness of 40 nm on a SiO2 substrate according to another embodiment of the present disclosure.

FIG. 33 is a diagram illustrating an SEM image and an AFM image of a GST225 thin film formed to have a thickness of 40 nm on a $SiO_2$ substrate according to another embodiment of the present disclosure. FIG. 33A illustrates a GST225 thin film formed at 100° C., FIG. 33B illustrates a GST 225 thin film formed at 130° C., and FIG. 33C illustrates a GST 225 film formed at 150° C. In each of FIGS. 33A, 33B, and 33C, a left image is an SEM image and a right image is an AFM image.

Referring to FIG. 33, RMS roughness values of the GST225 thin films of FIGS. 33A, 33B, and 33C were measured as 1.60, 1.49. and 2.48 nm, respectively. The GST225 thin film formed according to the embodiment may have excellent surface morphology and high smoothness.

Figure 34:
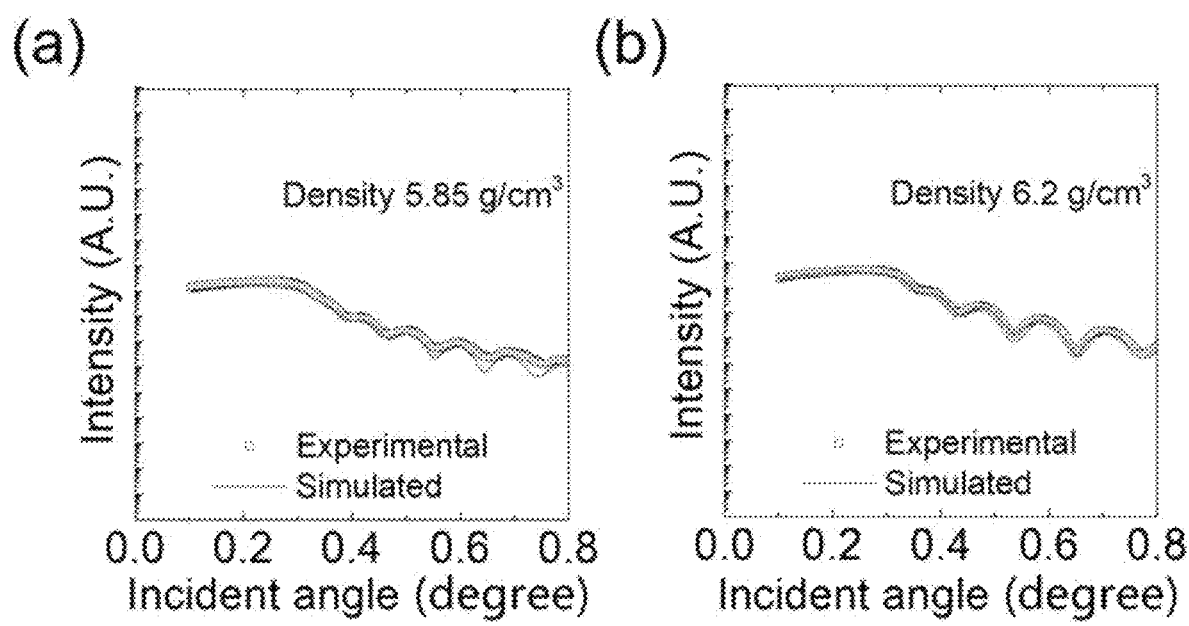
FIG. 34 is a graph illustrating XRR spectra for a GST225 thin film formed according to another embodiment of the present disclosure.

FIG. 34 is a graph illustrating XRR spectra for a GST225 thin film formed according to another embodiment of the present disclosure. The GST225 thin film was formed on a $SiO_2$ substrate. FIG. 34A illustrates a case in which a deposition temperature is 100° C., and FIG. 34B illustrates a case in which a deposition temperature is 130° C.

From the result of FIG. 34, a density of the thin film may be measured. The GST225 thin film of FIG. 34A may have a density of about 5.85 $g/cm^3$, and the GST225 thin film of FIG. 34B may have a density of about 6.2 $g/cm^3$. An increase in deposition temperature may increase a density of the thin film. Here, the measured density values of the thin film were similar to a density value (5.89 $g/cm^3$) of an amorphous structure and a density value (6.27 $g/cm^3$) of an FCC crystal structure of the GST225 thin film deposited by a sputtering method.

Figure 35:
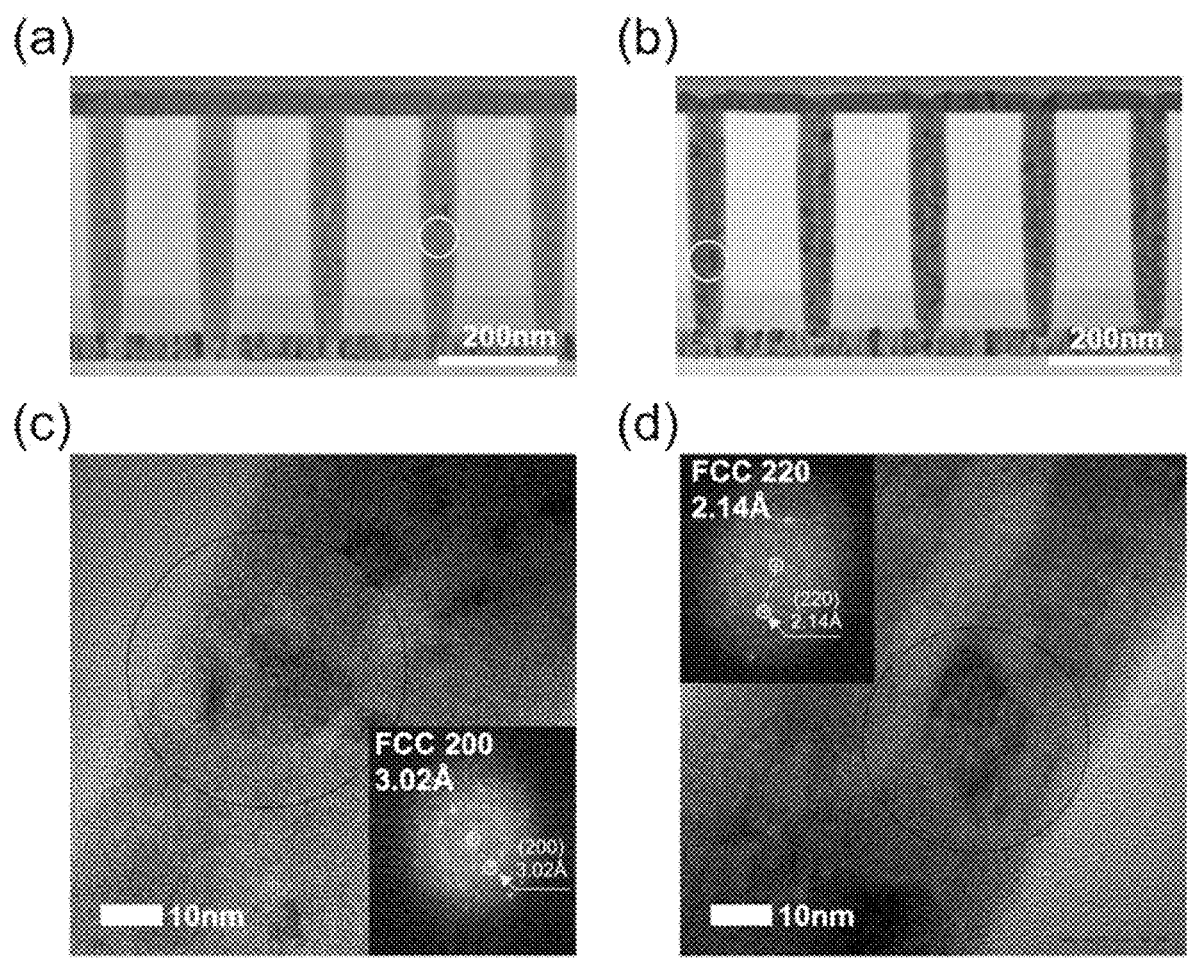
FIG. 35 is a diagram illustrating a TEM image and an analysis result for a GST225 thin film deposited on a substrate provided with a hole having an aspect ratio of about 5:1, according to another embodiment of the present disclosure.

FIG. 35 is a diagram illustrating a TEM image and an analysis result for a GST225 thin film deposited on a substrate provided with a hole having an aspect ratio of about 5:1, according to another embodiment of the present disclosure. FIG. 35A illustrates a case in which it is deposited at 100° C., and FIG. 35B illustrates a case in which it is deposited at 130° C. FIGS. 35C and 35D are enlarged images of the portions (circle display regions) of FIGS. 35A and 35B, respectively.

Referring to FIG. 35, it can be confirmed that GST225 thin films according to the embodiment were deposited to conformally cover and fill the interior of a hole having a relatively high aspect ratio. Here, the number of ALD supercycles at 100° C. was 40, and the number of ALD supercycles at 130° C. was 30.

Referring to FIGS. 35C and 35D, it can be confirmed from an analysis result by fast Fourier transform (FFT) that both films have nanoscale (i.e., nanometer-size) grains of crystalline GST225. In some cases, the formed films may have a mixed composition of crystalline (nanocrystalline) and amorphous.

Figure 36:
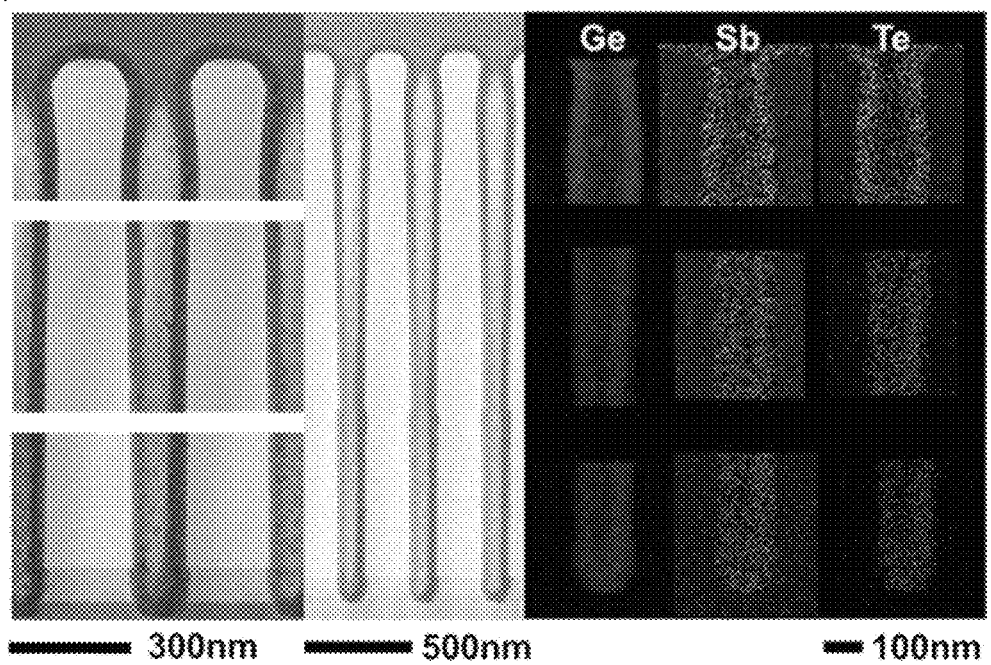
FIG. 36 is a diagram illustrating a TEM cross-sectional image (left image) and an EDS analysis result (right image) for a GST225 thin film formed on a substrate having a high-aspect-ratio hole structure, according to another embodiment of the present disclosure.
Figure 36:
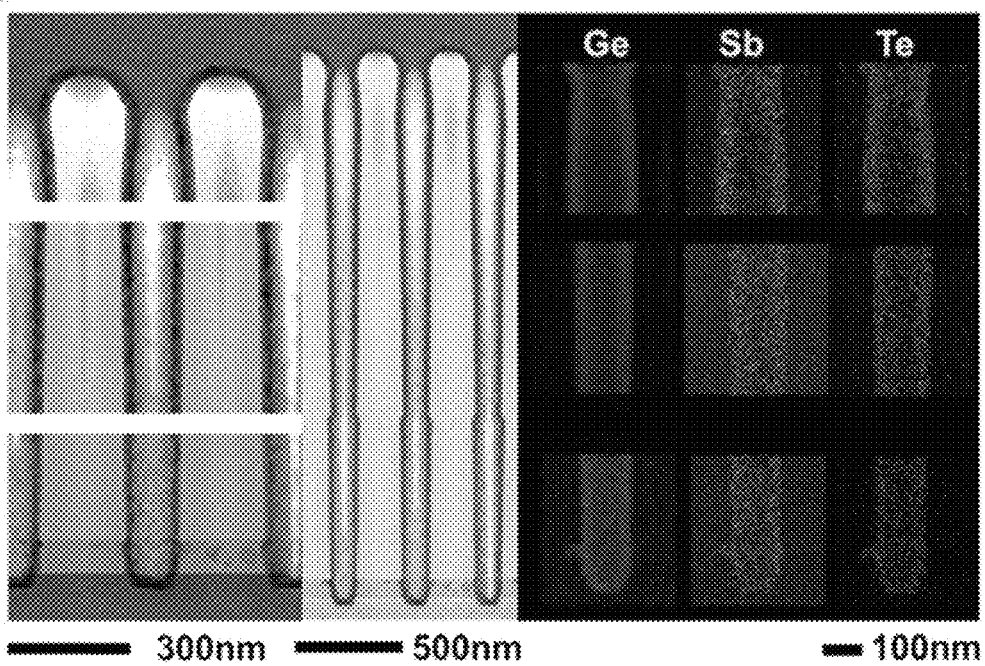

FIG. 36 is a diagram illustrating a TEM cross-sectional image (left image) and an EDS analysis result (right image) for a GST225 thin film formed on a substrate having a high-aspect-ratio hole structure, according to another embodiment of the present disclosure. In this case, the GST225 thin film was deposited on a hole structure having an aspect ratio of about 29:1 at deposition temperatures of 100° C. and 130° C. FIG. 36A illustrates a case in which a deposition temperature is 100° C., and FIG. 36B illustrates a case in which a deposition temperature is 130° C. In each of FIGS. 36A and 36B, a right image illustrates composition mapping results by EDS analysis in upper, middle and lower regions of a hole.

Referring to FIG. 36, it can be confirmed that the GST225 thin film was conformally deposited to the hole structure having a high aspect ratio by an ALD process according to the embodiment. In this case, an opening of the hole had an diameter of about 100 nm, and had a depth of about 2900 nm. It can be confirmed that thin film deposition was generally uniformly formed on an entire surface of the hole structure.

Figure 37:
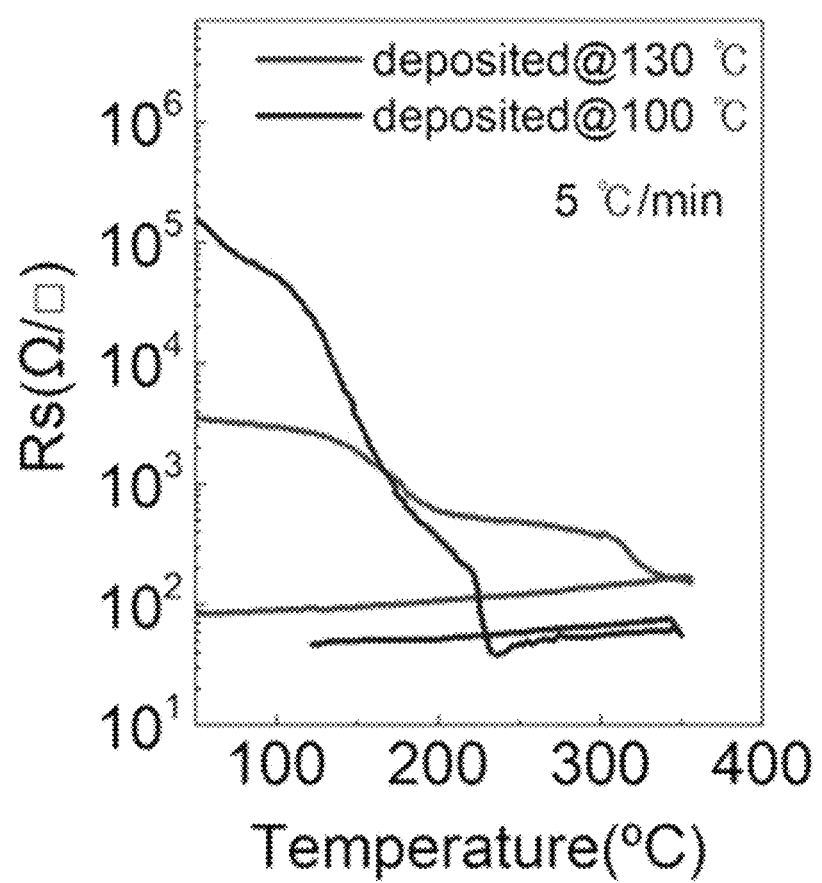
FIG. 37 is a graph illustrating a result of measuring a change in sheet resistance (Rs) based on a temperature change for a GST225 thin film formed according to another embodiment of the present disclosure.

FIG. 37 is a graph illustrating a result of measuring a change in sheet resistance (Rs) based on a temperature change for a GST225 thin film formed according to another embodiment of the present disclosure. FIG. 37 includes a case in which a deposition temperature is 100° C., and a case in which a deposition temperature is 130° C. During measurement, the temperature was increased at a rate of 5° C./min.

Referring to FIG. 37, a nanocrystalline/amorphous thin film deposited at 100° C. initially exhibits a high sheet resistance, which reflects low crystallinity of the thin film. As the temperature increases, crystallization may be performed, and as a result Rs may decrease rapidly. At the end, a sudden drop phenomenon occurs at a temperature of about 225° C., which may be due to complete crystallization at this temperature. During cooling the temperature to room temperature, the thin film is maintained in an LRS, which means that a phase transition to a crystalline phase has non-volatile characteristics.

The thin film deposited at 130° C. exhibits a significantly lower initial sheet resistance, which may be due to a predominant crystalline structure in an initially deposited state. As the temperature increases to about 180° C., Rs gradually decreases, which may be a result of crystallization of a remaining amorphous portion. Rs is slightly abruptly changed at a temperature between about 180° C. and 200° C., which may correspond to a result of the thin film being completely crystallized into an FCC structure. Another sudden drop phenomenon of Rs occurs at about 310° C., which may be due to another phase transition to an HCP structure. These changes can be confirmed by the XRD analysis result of FIG. 38 below.

Figure 38:
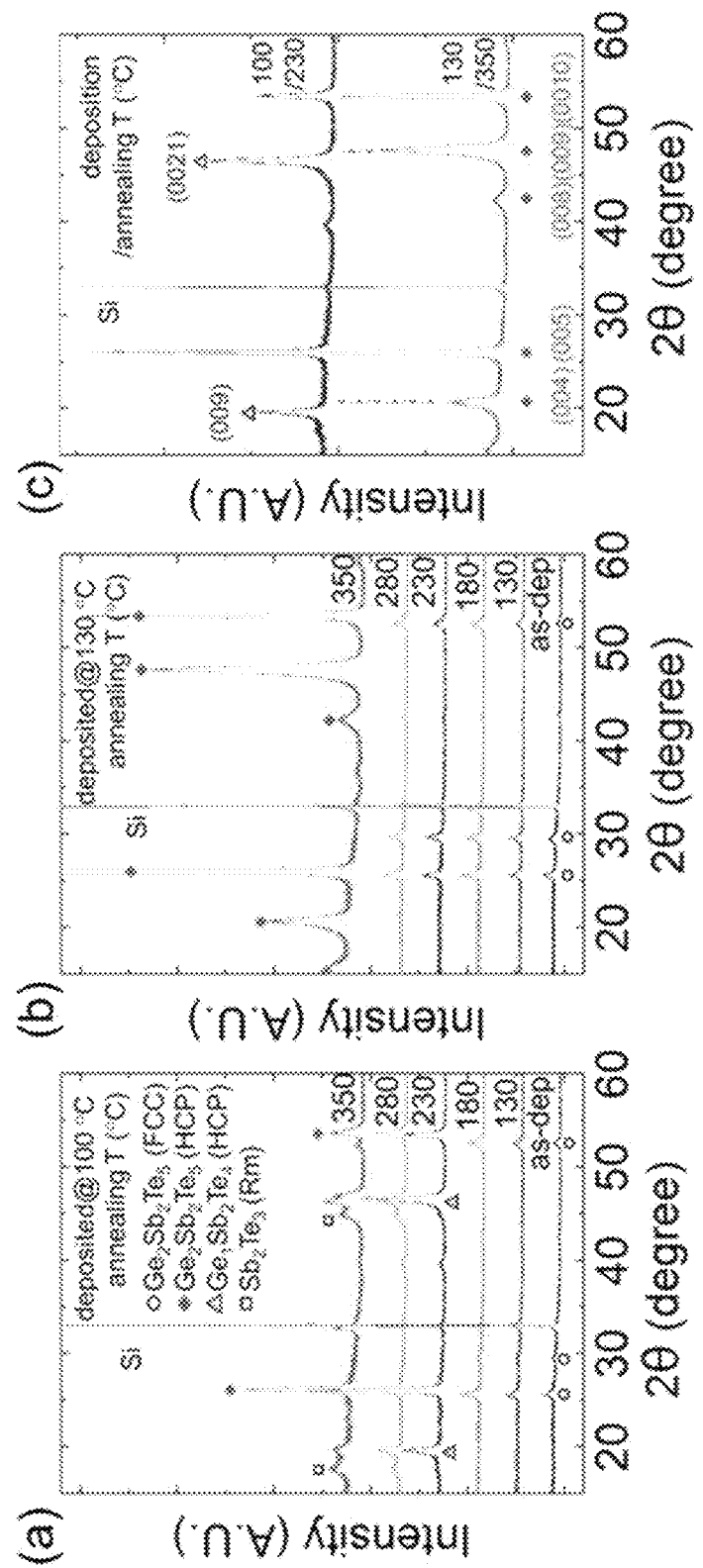
FIG. 38 is a graph illustrating XRD analysis results for the GST225 thin films illustrated in FIG. 37.

FIG. 38 is a graph illustrating XRD analysis results for the GST225 thin films illustrated in FIG. 37. FIG. 38A illustrates XRD analysis results for a GST225 thin film deposited at 100° C., and thin films annealed at different temperatures up to 350° C., and FIG. 38B illustrates XRD analysis results for a GST225 thin film deposited at 130° C., and thin films annealed at different temperatures up to 350° C. FIG. 38C is a graph illustrating a comparison of HCP peaks of a GST225 thin film annealed at 230° C. after deposition at 100° C. and a GST225 thin layer annealed at 350° C. after deposition at 130° C.

Referring to FIG. 38A, a GST225 thin film deposited at 100° C. shows small peaks corresponding to an FCC phase, and at an annealing temperature of about 230° C., FCC peaks mostly disappear and new strong peaks appear, which may be peaks corresponding to $Ge_1Sb_2Te_4$ (GST124) and HCP GST225. When an annealing temperature increases 280° C. or more, peaks corresponding to an ST phase appear, whereas intensities of peaks of GST124 decrease. This result may mean phase separation into ST-GST124-G ST225 at a high temperature of about 350° C.

Referring to FIG. 38B, the GST225 thin film deposited at 130° C. was maintained in an FCC structure up to about 300° C., and was converted into an HCP phase at a high temperature, and in this case, no involvement of other phases such as ST and GST124 was found.

FIG. 38C illustrates a comparison of HCP peaks of a GST225 thin film annealed at 230° C. after deposition at 100° C., and a GST225 thin film annealed at 350° C. after deposition at 130° C.

Figure 39:
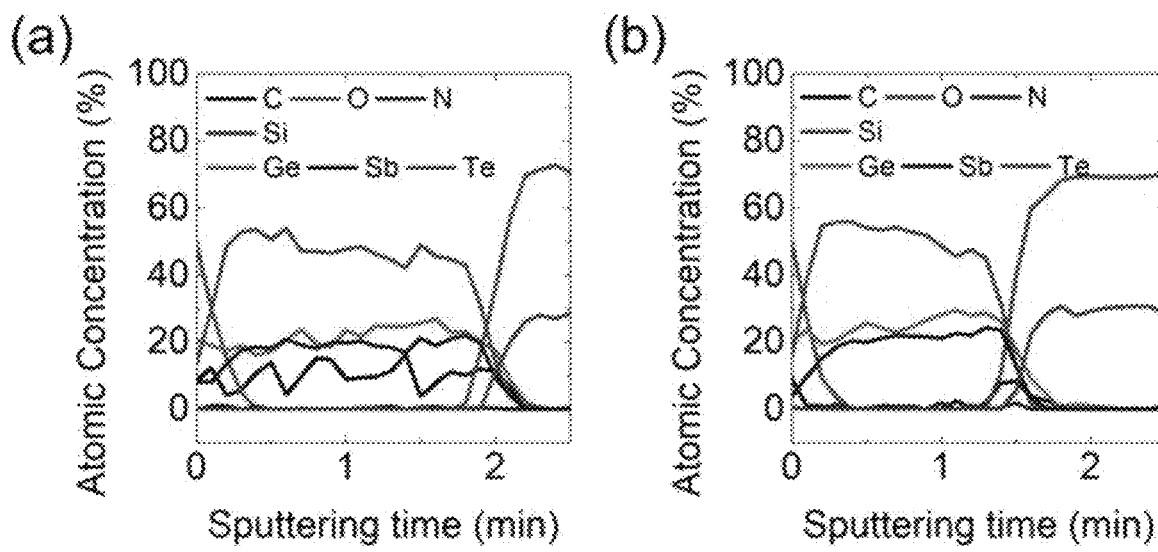
FIG. 39 is a graph illustrating an AES depth profile analysis result for GST225 thin films formed according to another embodiment of the present disclosure.

FIG. 39 is a graph illustrating an AES depth profile analysis result for a GST225 thin film formed according to another embodiment of the present disclosure. FIG. 39A illustrates a result for a GST225 thin film deposited at 100° C., and FIG. 39B illustrates a result for a GST235 thin film deposited at 130° C. FIG. 39 illustrates a result of absolute concentration analysis being not reflected, which is for confirming a relative change of each constituent material or impurity.

Referring to FIG. 39A, a GST225 thin film deposited at 100° C. may include a relatively high C impurity.

Referring to FIG. 39B, it can be confirmed that impurities including a C impurity were hardly found in a GST225 thin film deposited at 130° C. In FIG. 9, it can be confirmed that in the case of a GeTe thin film formed at a temperature of about 130 to 150° C., it may be very effective to remove impurities remaining in a GT sublayer by growing an ST sublayer in this embodiment, as compared with a case where C and N impurities are included in a significant amount. As a result, the GST thin film formed according to this embodiment may be more advantageous in implementing excellent switching performance.

The chalcogenide-based thin film according to the embodiment described with reference to FIGS. 21 to 39 may be a phase change material layer, and the phase change material layer may be applied as a memory layer (information storage layer) of a phase change memory device (PRAM). A method of forming a phase change material layer according to the embodiment of the present disclosure may include forming a chalcogenide-based thin film using the above-described ALD process. In addition, the method may further include annealing the chalcogenide-based thin film. In this case, the annealing temperature may be determined in a temperature range of about 180 to 400° C. A method of manufacturing a phase change memory device according to the embodiment of the present disclosure may include forming a phase change material layer by using the above-described method, and forming an electrode structure for applying a voltage to the phase change material layer. In addition, the method may further include forming a switching device electrically connected to the phase change material layer.

Figure 40A:
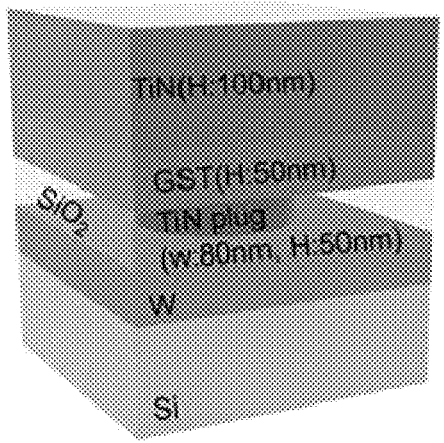
FIG. 40A is a cross-sectional view illustrating a phase change memory device manufactured according to another embodiment of the present disclosure.

FIG. 40A is a cross-sectional view illustrating a phase change memory device manufactured according to another embodiment of the present disclosure.

Referring to FIG. 40A, W (tungsten) may be applied as a lower electrode material, TiN may be applied as a lower electrode contact layer material, $SiO_2$ may be applied as an interlayer insulating layer material, a GST (GST225) thin film formed by an ALD process according to the embodiment of the present disclosure may be applied as a phase change layer material, and TiN may be applied as an upper electrode material. The lower electrode contact layer had a width (diameter) of about 80 nm and a height (thickness) of about 50 nm.

Figure 40B:
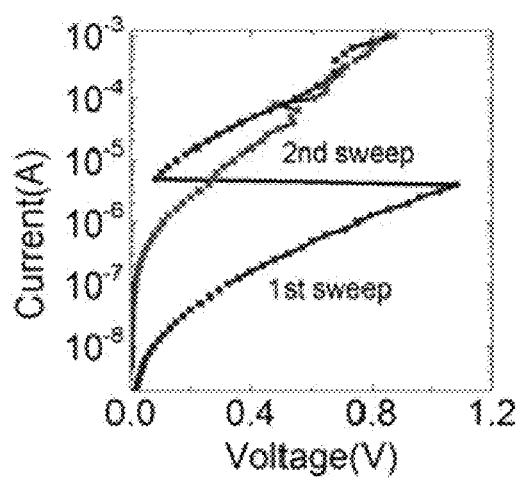
FIG. 40B is a graph illustrating a current-voltage switching characteristic using a current sweep method for the device of FIG. 40A.

FIG. 40B is a graph illustrating a current-voltage switching characteristic using a current sweep method for the device of FIG. 40A. In this case, the GST (GST225) thin film was deposited at 130° C., and then was annealed at 300° C. The GST225 thin film exhibits an HRS characteristic due to RESET switching before measurement. However, a sudden snapback of voltage occurs due to an increase in applied current, and resistance may be switched to an LRS. This switching has a non-volatile characteristic.

Figure 41:
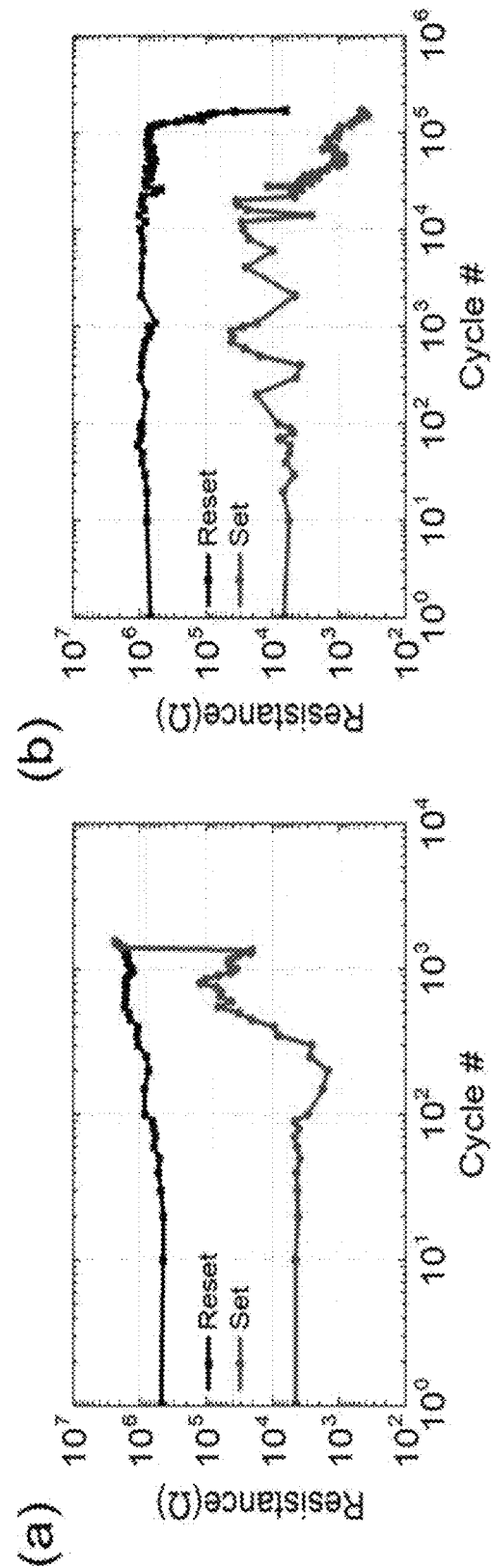
FIG. 41 is a graph illustrating a durability evaluation result based on an increase in switching cycle of a phase change memory device including a GST225 thin film formed according to another embodiment of the present disclosure.

FIG. 41 is a graph illustrating a durability evaluation result based on an increase in switching cycle of a phase change memory device including a GST225 thin film formed according to another embodiment of the present disclosure. FIG. 41A relates to a phase change memory device including a GST225 thin film as-deposited at 100° C., and FIG. 40B relates to a phase change memory device including a BST225 film as-deposited at 130° C.

Referring to FIG. 41A, a phase change memory device including a GST225 thin film deposited at 100° C. exhibited durability in which a switching cycle is generally well maintained up to about thousands of cycles.

Referring to FIG. 41B, a phase change memory device including a GST225 thin film deposited at 130° C. exhibited durability in which a switching cycle is generally well maintained up to about $10^5$ cycles.

Figure 42:
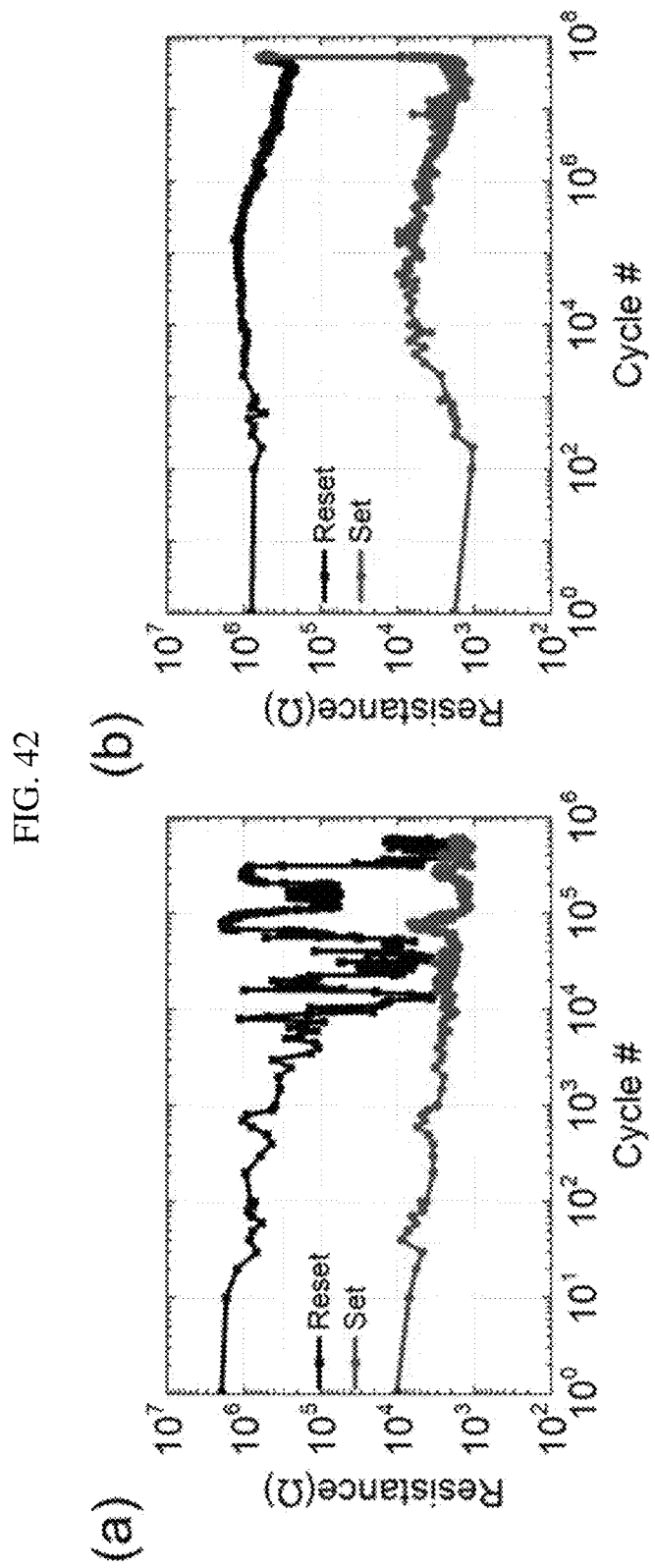
FIG. 42 is a graph illustrating a durability evaluation result based on an increase in switching cycle of a phase change memory device including a GST225 thin film formed according to another embodiment of the present disclosure.

FIG. 42 is a graph illustrating a durability evaluation result based on an increase in switching cycle of a phase change memory device including a GST225 thin film formed according to another embodiment of the present disclosure. FIG. 42A relates to a phase change memory device including a GST225 thin film annealed at 300° C. after deposition at 100° C., and FIG. 42B relates to a phase change memory device including a GST225 thin film annealed at 300° C. after deposition at 130° C.

Referring to FIG. 42A, a phase change memory device including a GST225 thin film annealed at 300° C. after deposition at 100° C. exhibited a characteristic in which a switching cycle is generally well maintained up to about $10^4$ cycles, but is slightly unstable in cycles greater than or equal to $10^4$ cycles.

Referring to FIG. 42B, a phase change memory device including a GST225 thin film annealed at 300° C. after deposition at 130° C. exhibited durability in which a switching cycle is well maintained up to about $\sim 5 \times 10^7$ cycles. It is presumed that this excellent durability is due to characteristics such as improved thin film density, low impurity concentration, uniform phase transition, and the like. Referring to this result, it may be desirable to deposit a chalcogenide-based thin film according to the embodiment at a temperature of 100° C. or more, for example, a temperature of 120° C. or more, and then to anneal the chalcogenide-based thin film at a temperature of 200° C. or more, for example, a temperature of 250° C. or more, for use. However, this is merely exemplary, and an appropriate deposition temperature and annealing temperature may vary depending on characteristics such as a thin film deposition condition, equipment, and the like.

Figure 43:
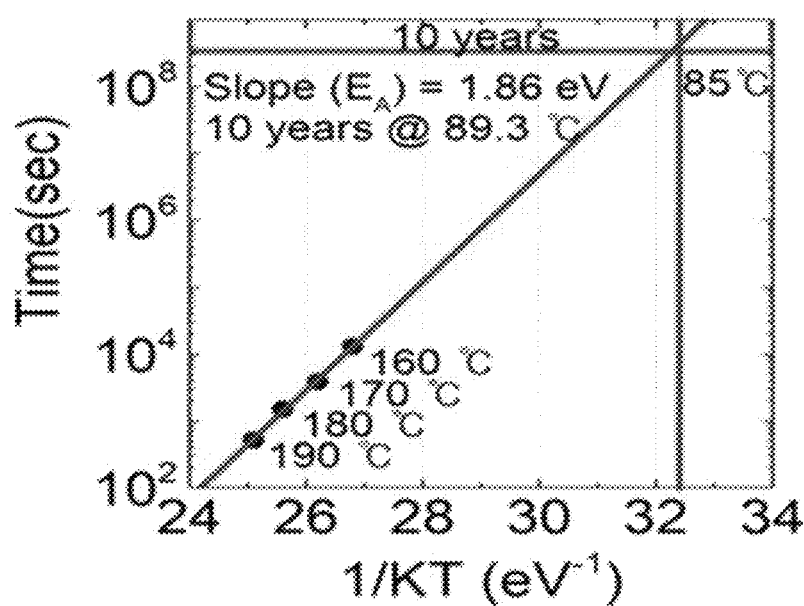
FIG. 43 is a graph illustrating a data retention characteristic of an HRS at different temperatures of a phase change memory device including a GST225 thin film formed according to another embodiment of the present disclosure.

FIG. 43 is a graph illustrating a data retention characteristic of an HRS at different temperatures of a phase change memory device including a GST225 thin film formed according to another embodiment of the present disclosure.

Referring to FIG. 43, time required for being switched to an LRS after a first RESET operation was measured. The time was 12923 s, 3837 s, 1484 s, and 512 s at temperatures of 160° C., 170° C., 180° C., and 190° C., respectively. The switching may mean that an amorphous region is recrystallized in a memory cell. As a result of evaluation, it was estimated that a data retention characteristic of about 10 years or more may be secured at a temperature condition of 89.3° C.

According to the above-described embodiments of the present disclosure, a chalcogenide-based thin film having excellent physical properties may be formed by using an ALD process. In particular, according to the embodiments, a chalcogenide-based thin film having excellent film quality, excellent phase change characteristics and excellent durability may be easily formed by using the ALD process. When applying the method of forming a thin film according to the embodiments, a phase change memory device having excellent performance may be implemented.

Figure 44:
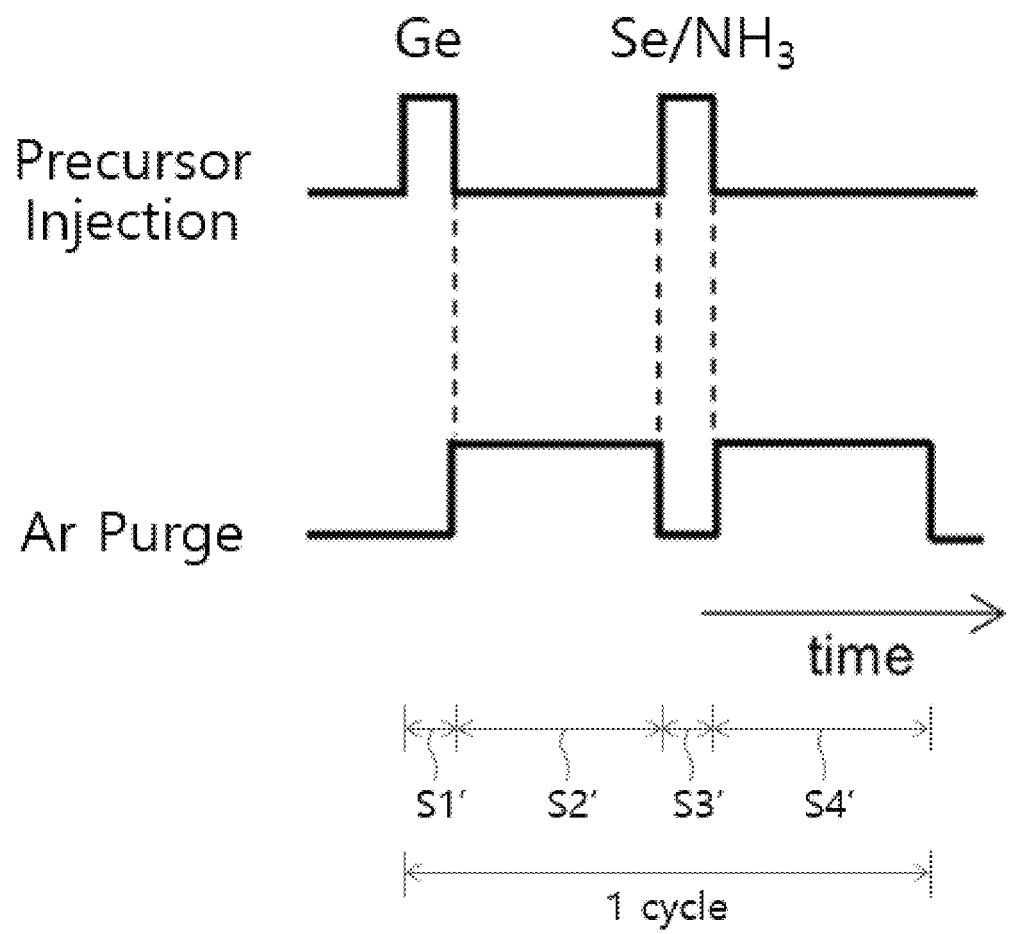
FIG. 44 is a diagram illustrating an ALD sequence applicable to a method of forming a chalcogenide-based thin film by an ALD process according to an embodiment of the present disclosure.

FIG. 44 is a diagram illustrating an ALD sequence applicable to a method of forming a chalcogenide-based thin film by an ALD process according to an embodiment of the present disclosure.

Referring to FIG. 44, the method of forming a chalcogenide-based thin film using the ALD process according to this embodiment may be a method of forming a Ge—Se-based thin film. The method of forming a chalcogenide-based thin film may include a first operation S1' of supplying, into a reaction chamber (not illustrated) provided with a substrate (substrate to be deposited) (not illustrated), a first source gas including a Ge precursor with Ge having an oxidation state of +2, a second operation S2' of supplying a first purge gas into the reaction chamber, a third operation S3' of supplying, into the reaction chamber, a second source gas including a Se precursor and a reaction promoting gas for promoting a reaction between the Ge precursor and the Se precursor, and a fourth operation S4' of supplying a second purge gas into the reaction chamber.

The Ge precursor with Ge having an oxidation state of +2 may include, for example, Ge(II)-guanidate. In a specific example, the Ge precursor may be Ge(II)-amido guandinate. Ge(II)-amido guandinate may be represented by Ge(guan)NMe$_2$. Here, guan may be (iPrN)($^i$PrN)$_2$CNMe$_2$, and Me may be CH$_3$. In other words, Ge(II)-amido guandinate may be represented by Ge$^{II}$N(CH$_3$)$_2$[(N$^i$Pr)$_2$CN(CH$_3$)$_2$]. Here, $^i$Pr represents an isopropyl group. Ge(II)-amido guandinate may be a precursor more suitable for a relatively high-temperature deposition process than an existing Ge(IV) precursor. Ge(II)-amido guanidinate may have relatively high thermal decomposition resistance due to bidentate bonding between Ge and N. In this regard, the use of a Ge(II) precursor, such as Ge(II)-amido guandinate, may raise a deposition temperature to 100° C. or more during the ALD process, and may be advantageous in improving the density, strength and film quality of the formed chalcogenide thin film. Here, Ge(II)-guanidinate is exemplified as a specific material of the Ge precursor, that is, the Ge(II) precursor, but the Ge(II) precursor usable in the embodiment is not limited to Ge(II)-guanidinate, and may vary.

The use of the Ge precursor with Ge having an oxidation state of +2, that is, the Ge(II) precursor may easily form GeSe that is a compound formed by Ge and Se in a substantially 1:1 ratio (that is, in a stoichiometric manner). A stoichiometric GeSe material in which the ratio of Ge and Se is substantially 1:1 may exhibit excellent switching characteristics, for example, excellent ovonic threshold switch (OTS) characteristics.

The Se precursor may include Se having an oxidation state of −2. For example, the Se precursor may include (Me$_3$Si)$_2$Se. Here, Me may be CH$_3$. The Se precursor may include [(CH$_3$)$_3$Si]$_2$Se. However, a specific material of the Se precursor is merely exemplary, and may vary. The second source gas including the Se precursor may also be referred to as a "reaction gas".

The reaction promoting gas may serve to promote a reaction between the Ge precursor and the Se precursor, for example, may serve as a catalyst. That is, the reaction promoting gas may be a type of catalyst. The Ge precursor, that is, Ge(II) precursor, may be more stable than the Ge(IV) precursor. Thus, unless the reaction-promoting gas is used, an ALD reaction with the Se precursor may be less likely to occur. In this embodiment, the chalcogenide-based thin film may be easily formed by using the reaction promoting gas capable of promoting the ALD reaction while using the Ge(III) precursor. The reaction promoting gas may include, for example, NH$_3$. The reaction promoting gas may be an NH$_3$ gas. The reaction promoting gas may react with the Ge precursor on the substrate to form Ge(NH$_2$), and Ge(NH$_2$) may react with the Se precursor on the substrate to form a Ge—Se bond. When the reaction promoting gas includes NH$_3$, NH$_3$ may react with the Ge precursor on the substrate to form Ge(NH$_2$) or combine with the Ge precursor, rather than reacting with the Se precursor to form SeH$_2$, as described above. In addition, as will be described later, the reaction promoting gas may enable a high-temperature process of 100 to 200° C., whereas a conventional ALD is a low-temperature process, thereby obtaining a CVD that is a high-temperature process through the ALD process.

The second source gas including the Se precursor and the reaction promoting gas may be simultaneously supplied into the reaction chamber. By simultaneously supplying the second source gas and the reaction promoting gas into the reaction chamber, the Ge precursor may be activated (for example, Ge(NH$_2$) formation) with the reaction promoting gas, and a spontaneous reaction between the Ge precursor and the Se precursor may be easily induced. When the reaction promoting gas is not used, a thin film may not be grown due to low reactivity between the Ge precursor and the Se precursor. In addition, even when the reaction promoting gas is not injected simultaneously with the second source gas, and the reaction promoting gas is separately supplied into the reaction chamber after the supply of the second source gas and the second purge gas, a desired thin film may not be properly grown. In addition, even when the reaction promoting gas is separately injected after the supply of the first source gas and the first purge gas, and the second source gas and the second purge gas are supplied, the desired thin film may not be properly grown. In addition, even when the reaction promoting gas is injected together (simultaneously) with the supply of the first source gas, and subsequently the first purge gas, the second source gas, and the second purge gas are sequentially supplied, the desired thin film may not be properly grown. As in this embodiment, when the reaction promoting gas is injected simultaneously with the second source gas (that is, the reaction promoting gas and the second source gas are co-injected), a stoichiometric GeSe film may be easily well formed.

The first purge gas and second purge gas may be inert gases such as Ar or N$_2$. Although a case in which an Ar gas is used as the first and second purge gases is illustrated herein, a type of purge gas may vary.

The first to fourth operations S1' to S4' may be repeatedly performed a plurality of times. In other words, the first to fourth operations S1' to S4' may constitute a basic cycle of the ALD process, and this cycle may be repeatedly performed several times.

A substrate on which the chalcogenide-based thin film is deposited (that is, a substrate to be deposited) (not illustrated) may be selected from among various substrates. A surface portion of the substrate may be provided with an insulating material layer, a conductive material layer (metallic material layer), or a mixture of the insulating material layer and the conductive material layer. The insulating material layer may include, for example, SiO$_2$ and Si$_3$N$_4$, and the conductive material layer may include a metal or a metal compound such as TiN. A type, material, and configuration of the substrate may vary.

A "deposition temperature" in the forming of the chalcogenide-based (Ge—Te-based) thin film according to the embodiment described with reference to FIG. 44 may be determined in a range of about 70 to 200° C. Here, the deposition temperature may correspond to a temperature of a substrate to be deposited during thin film formation. That is, an ALD thin film deposition process may be performed in a state where a substrate provided in a reaction chamber is heated to the above-described temperature range. The deposition temperature in the ALD process according to this embodiment may be about 70 to 180° C. or about 100 to 200° C. The deposition temperature may be higher than a deposition temperature (about 70 to 80° C.) in a conventional ALD process. In this regard, the thin film formed by the ALD process according to the embodiment may have excellent characteristics in terms of density, strength, film quality, physical properties, and the like. In addition, the thin film formed by the ALD process according to the embodiment may have excellent switching characteristics, excellent durability, and the like.

The chalcogenide-based thin film, for example, Ge—Se-based thin film formed according to this embodiment may be amorphous in an as-deposited state, or may include an amorphous phase. The film quality of the Ge—Se-based thin film may vary depending on the deposition temperature. In addition, a subsequent annealing process may be further performed on the chalcogenide-based thin film formed according to the embodiment. The annealing temperature may be determined in a range of about 200 to 500° C. or about 200 to 400° C. The film quality may vary depending on the annealing temperature, and at least a portion of the chalcogenide-based thin film may be crystallized when the annealing temperature is high. However, the chalcogenide-based thin film (Ge—Se-based thin film) may not necessarily be deposited only in an amorphous state. In some cases, the chalcogenide-based thin film (Ge—Se based thin film) may be deposited in a mixed state of amorphous and crystalline.

A method of forming a thin film according to an experimental example may be as follows.

GeSe films were deposited in an ALD reactor with a 12 inch diameter showerhead and a substrate heater suitable for an 8 inch wafer scale. The Ge precursor and the Se precursor were heated at 65° C. and 30° C. temperatures, respectively. The films were grown on Si/SiO$_2$ or Si/TiN substrate (here, SiO$_2$ and TiN are upper surface portions), and the deposition temperature (substrate temperature) range was about 70 to 200° C. (70 to 180° C.). The precursors were injected into an ALD chamber at a flow rate of 50 sccm by an Ar carrier gas, an Ar gas was injected at 200 sccm for a purge process, and a reaction promoting gas (NH$_3$ gas) was injected at 50 sccm. A precursor injection pulse time and a purge pulse time were adjusted in various ways. An injection/purge time of the Ge precursor may be, for example, about 3 s/15 s or 3 s/20 s, and an injection/purge time of the Se precursor may be, for example, about 5 s/15 s or 5 s/20 s. However, the injection/purge times of the precursors are merely exemplary, and may vary. In addition, various conditions of the above-described experimental example are merely exemplary, and the present disclosure is not limited thereto, and may vary.

Figure 45:
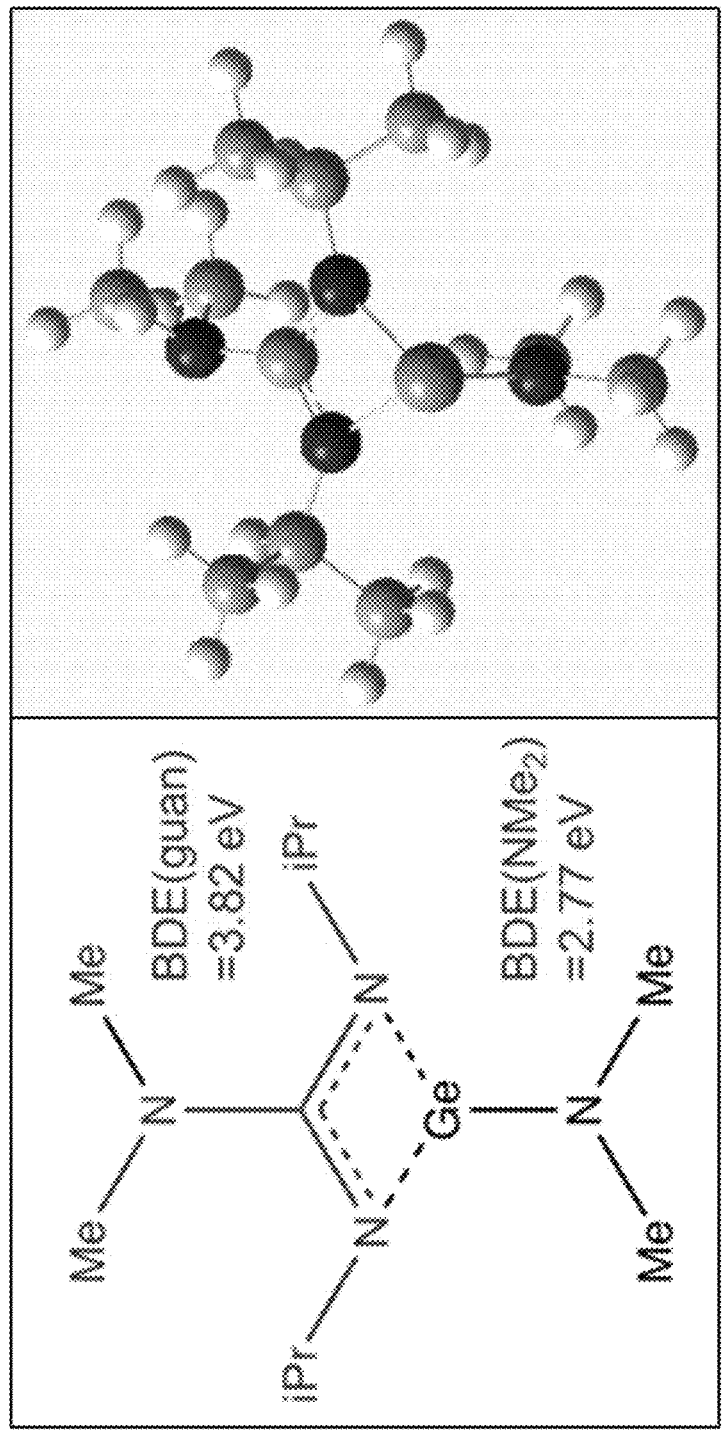
FIG. 45 is an exemplary chemical structure illustrating a Ge precursor applicable to a method of forming a chalcogenide-based thin film by an ALD process according to another embodiment of the present disclosure.

FIG. 45 is an exemplary chemical structure illustrating a Ge precursor applicable to a method of forming a chalcogenide-based thin film by an ALD process according to another embodiment of the present disclosure. A left figure illustrates a chemical structure, and a right figure illustrates a molecular structure corresponding to the chemical structure.

Referring to FIG. 45, the Ge precursor may be a precursor with Ge having an oxidation state of +2, for example, Ge(II)-amido guanidinate. Ge(II)-amido guandinate may be represented by Ge(guan)NMe$_2$. Here, guan may be ($^i$PrN)$_2$CNMe$_2$, and Me may be CH$_3$. Ge(II)-amido guanidinates may include two anionic ligands, that is, dimethylamino (NMe$_2$) and bidentate guanidinate [guan=($^i$PrN)$_2$CNMe$_2$] ligands. In addition, Ge(II)-amido guandinate may have three electronic resonance structures in which p electrons are delocalized with respect to three C—N bonds. According to DFT calculation, a BDE between Ge-guan is about 3.82 eV, which is greater than a BDE between Ge—NMe$_2$ (about 2.77 eV).

Figure 46:
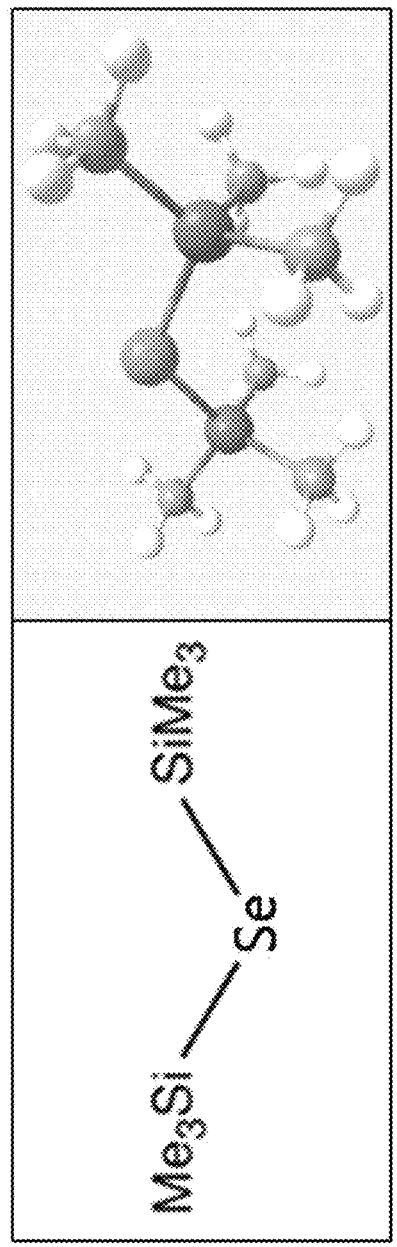
FIG. 46 is an exemplary chemical structure illustrating a Se precursor applicable to a method of forming a chalcogenide-based thin film by an ALD process according to an embodiment of the present disclosure.

FIG. 46 is an exemplary chemical structure illustrating a Se precursor applicable to a method of forming a chalcogenide-based thin film by an ALD process according to an embodiment of the present disclosure. A left figure illustrates a chemical structure, and a right figure illustrates a molecular structure corresponding to the chemical structure.

Referring to FIG. 46, the Se precursor may be a precursor with Se having an oxidation state of −2, for example, (Me$_3$Si)$_2$Se. Here, Me may be CH$_3$. In other words, the Se precursor may be [(CH$_3$)$_3$Si]$_2$Se. A material of the Se precursor is not limited to (Me$_3$Si)$_2$Se, and may vary.

Figure 47:
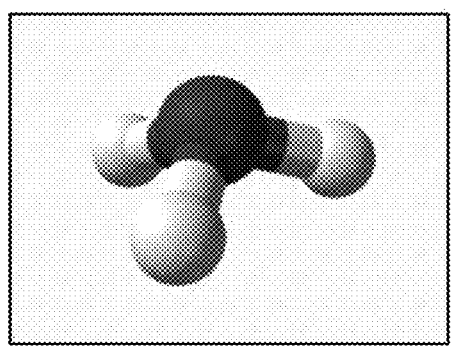
FIG. 47 is an exemplary diagram illustrating a molecular structure of a reaction promoting gas applicable to a method of forming a chalcogenide-based thin film by an ALD process according to an embodiment of the present disclosure.

FIG. 47 is an exemplary diagram illustrating a molecular structure of a reaction promoting gas applicable to a method of forming a chalcogenide-based thin film by an ALD process according to an embodiment of the present disclosure.

Referring to FIG. 47, a reaction promoting gas may be, for example, NH$_3$ (ammonia) gas. However, the reaction promoting gas may further include other materials together with NH$_3$, or may include other materials than NH$_3$.

Figure 48:
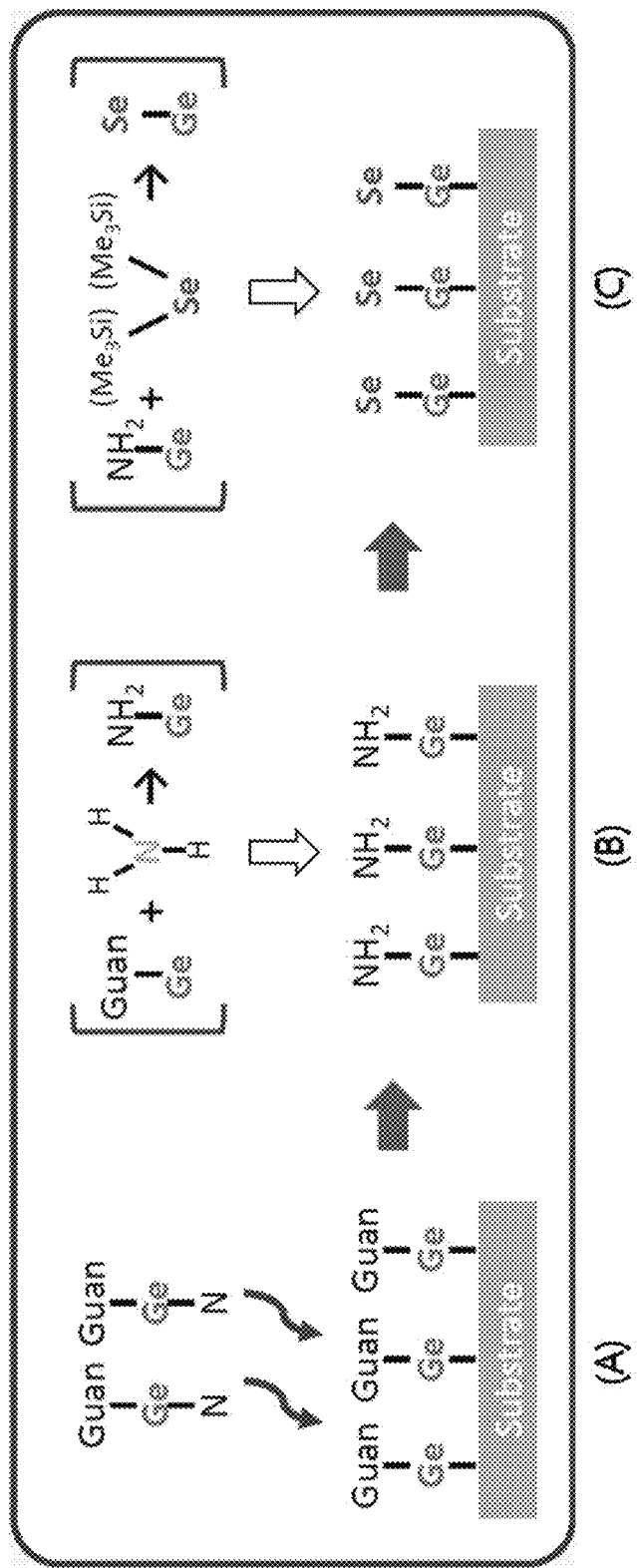
FIG. 48 is an exemplary diagram illustrating a reaction mechanism applicable to a method of forming a chalcogenide-based thin film by an ALD process according to an embodiment of the present disclosure.

FIG. 48 is an exemplary diagram illustrating a reaction mechanism applicable to a method of forming a chalcogenide-based thin film by an ALD process according to an embodiment of the present disclosure. That is, FIG. 48 illustrates the reaction mechanism between a Ge precursor, an NH$_3$ reaction promoting gas, and a Se precursor.

Referring to FIG. 48, operation (A) illustrates an initial Ge-terminated surface having a guanidinate ligand. Since a bonding energy (3.82 eV) between Ge-guan is greater than a bonding energy (2.77 eV) between Ge—NMe$_2$, a substrate (substrate to be deposited) may have a surface state terminated with —Ge(guan), rather than —Ge(NMe$_2$). In other words, when the Ge precursor is supplied into a reaction chamber, the Ge precursor may be bonded to a surface of the substrate in a —Ge-guan state.

An NH$_3$ molecule injected simultaneously with (Me$_3$Si)$_2$Se that is the Se precursor may convert —Ge(guan) on the surface of the substrate into —Ge(NH$_2$) through a surface reaction, as illustrated in operation (B). A lone pair electron of —Ge(guan) and NH$_3$ may react on the surface of the substrate to form —Ge(NH$_2$). That is, the NH$_3$ molecule may react with a material of the Ge precursor on the substrate to form Ge(NH$_2$).

As illustrated in operation (C), —Ge(NH$_2$) formed on the substrate surface may react with (Me$_3$Si)$_2$Se to form a Ge—Se bond. That is, a Ge—Se bonding material may remain on the substrate by a ligand exchange reaction between —Ge(NH$_2$) and (Me$_3$Si)$_2$Se. As a result, a GeSe material may be formed on the substrate.

Formula 3 below shows a reaction occurring in operation (B). This reaction is proved by DFT calculation that it is energetically advantageous (ΔG=−129.3 kJ/mol).

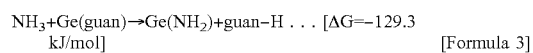

NH$_3$+Ge(guan)→Ge(NH$_2$)+guan-H . . . [ΔG=−129.3 kJ/mol]  [Formula 3]

Formula 4 below shows a reaction occurring in operation (C). This reaction is proved by DFT calculation that it is energetically advantageous (ΔG=−70.9 kJ/mol).

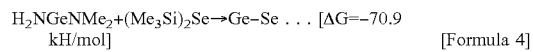

H$_2$NGeNMe$_2$+(Me$_3$Si)$_2$Se→Ge–Se . . . [ΔG=−70.9 kH/mol]  [Formula 4]

A reaction mechanism in the method of forming a thin film according to the embodiment has been described in detail with reference to FIG. 48 and Formulas 3 and 4. However, the reaction mechanism is merely exemplary, and may vary. Other reactions not disclosed herein may occur, and a reaction equation may vary depending on a type of material used.

FIGS. 49A to 49D are graphs illustrating results of evaluating an ALD saturation behavior based on an injection/purge time of a Ge precursor and injection/purge times of a Se precursor and a reaction promoting gas in a method of forming a chalcogenide-based thin film according to an embodiment of the present disclosure.

Figure 49A:
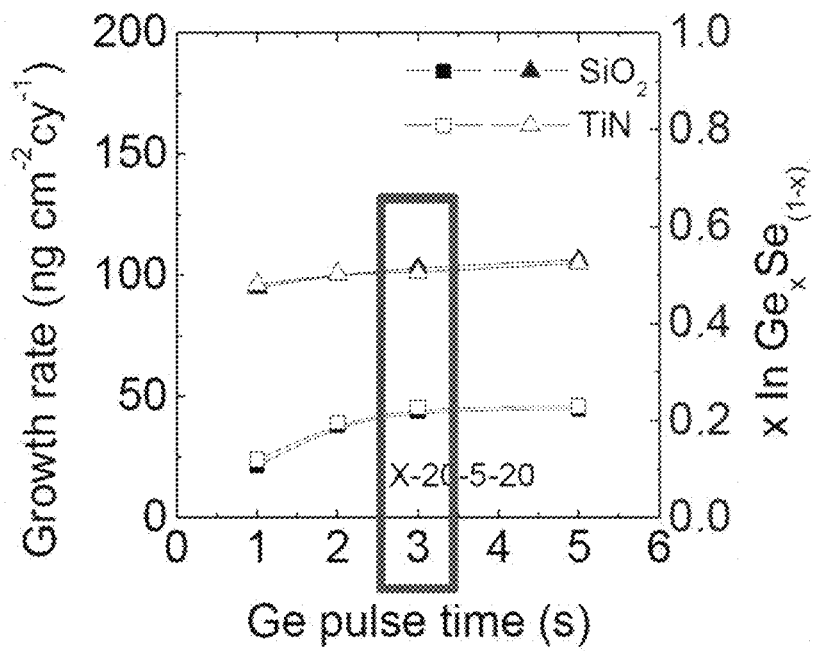
FIGS. 49A to 49D are graphs illustrating results of evaluating an ALD saturation behavior based on an injection/purge time of a Ge precursor and injection/purge times of a Se precursor and a reaction promoting gas in a method of forming a chalcogenide-based thin film according to an embodiment of the present disclosure.

FIG. 49A illustrates a change in thin film growth rate and composition (composition ratio) of a GeSe thin film based on a change in pulse (injection) time of a Ge precursor.

Figure 49B:
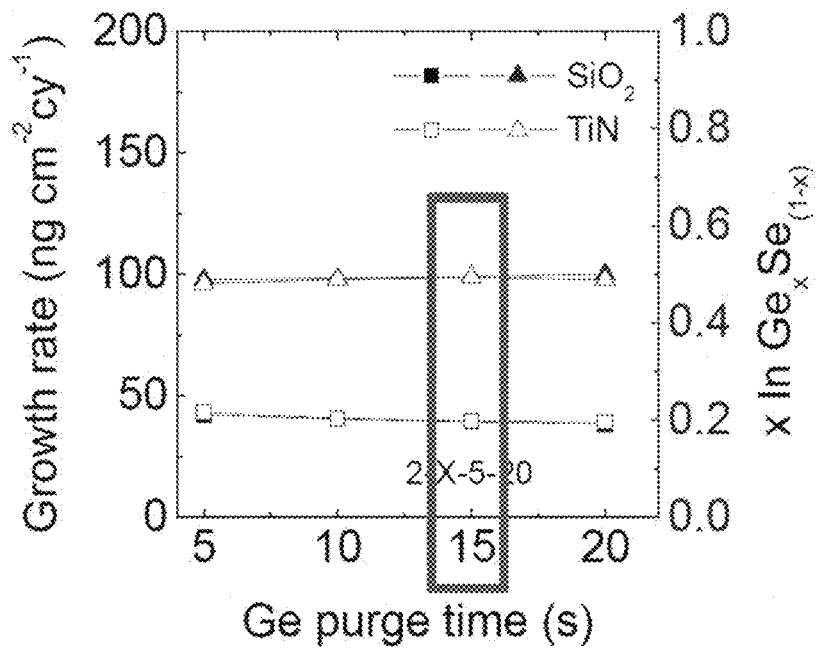

FIG. 49B illustrates a change in thin film growth rate and composition (composition ratio) of a GeSe thin film based on a change in Ge purge (that is, first purge) time.

Figure 49C:
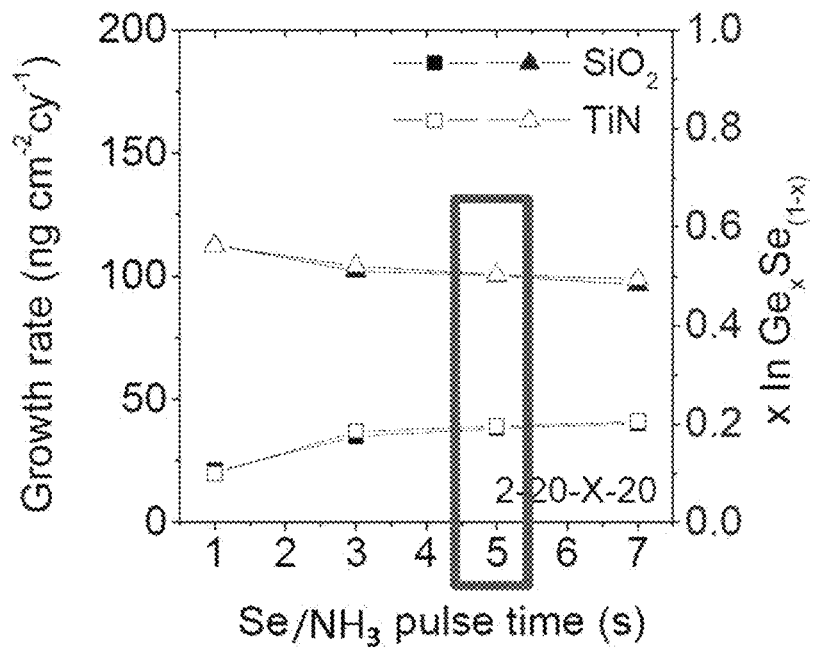

FIG. 49C illustrates a change in thin film growth rate and composition (composition ratio) of a GeSe thin film based on a change in pulse (injection) time of a Se precursor and an $NH_3$ gas (reaction promoting gas).

Figure 49D:
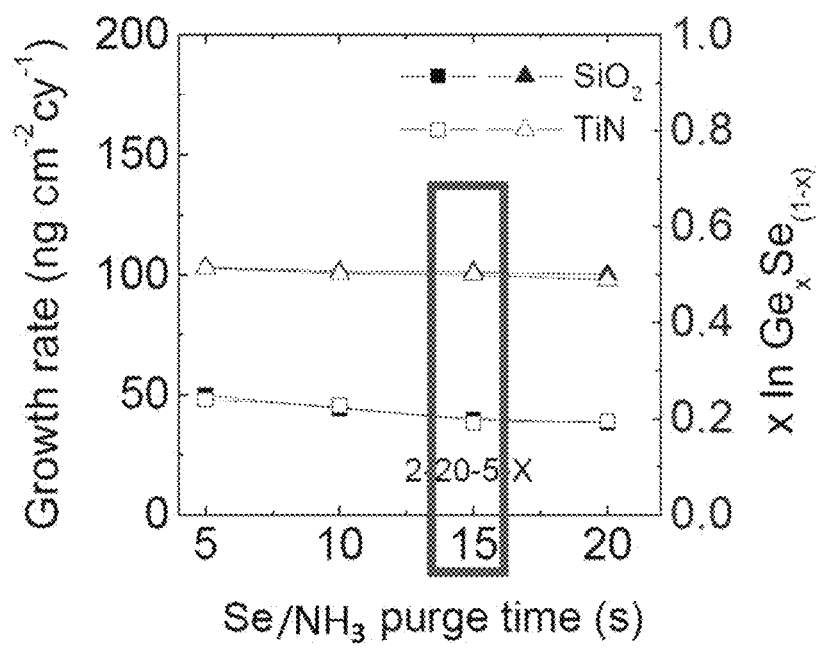

FIG. 49D illustrates a change in thin film growth rate and composition (composition ratio) of a GeSe thin film based on a change in Se/$NH_3$ purge (that is, second purge) time.

FIGS. 49A to 49D each include a result when a substrate is a Si/$SiO_2$ substrate (represented by $SiO_2$), and a result when the substrate is an Si/TiN substrate (represented by TiN). The results of FIGS. 49A to 49D are all cases in which a substrate temperature (deposition temperature) is 70° C.

Referring to FIGS. 49A to 49D, an ALD saturation behavior in each case can be confirmed. In addition, it can be confirmed that a formed GeSe thin film has a stoichiometric composition in which a ratio of Ge and Se is about 1:1. Based on these results, in the method of forming a thin film according to the embodiment, the injection/purge time of the Ge precursor and the injection/purge times of the Se precursor and the reaction promoting gas may be properly selected.

Additionally, since the electronegativity (about 2.6) of Se is higher than the electronegativity (about 2.1) of Te, the growth rate of GeSe may be slightly lower than that of GeTe. The growth rate of GeSe at 70° C. may be about 47 ng·cm$^{-2}$·cy$^{-1}$.

Figure 50:
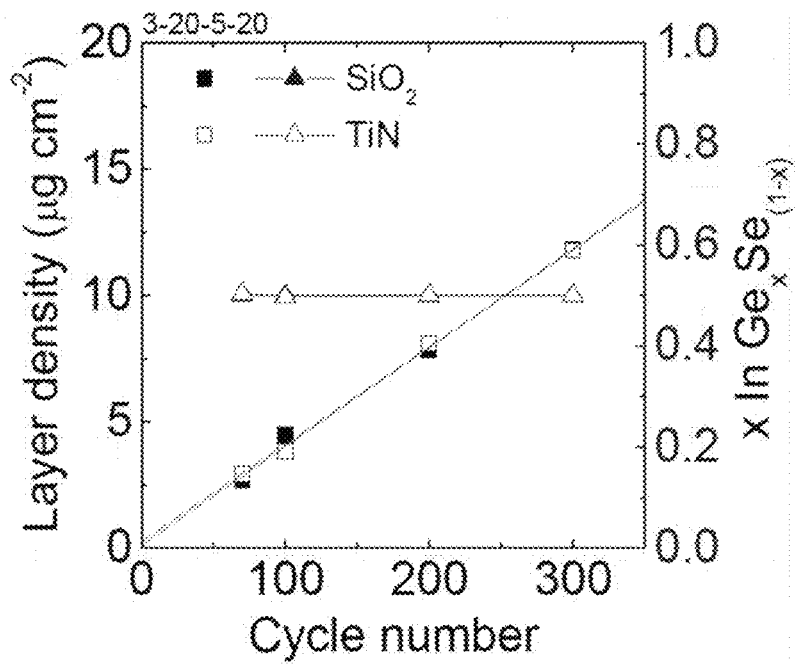
FIG. 50 is a graph illustrating a change in thin film density and composition ratio based on the number of ALD cycles in a method of forming a chalcogenide-based thin film according to an embodiment of the present disclosure.

FIG. 50 is a graph illustrating a change in thin film (layer) density and composition ratio based on the number of ALD cycles in a method of forming a chalcogenide-based thin film according to an embodiment of the present disclosure. In this case, a deposition temperature of the thin film was 70° C.

Referring to FIG. 50, it can be confirmed that a thin film density increases as the number of ALD cycles for thin film growth increases. The thin film density increased linearly in a relatively constant manner. For a composition ratio, a stoichiometric composition of 1:1 was well maintained, despite an increase in the number of ALD cycles.

Figure 51:
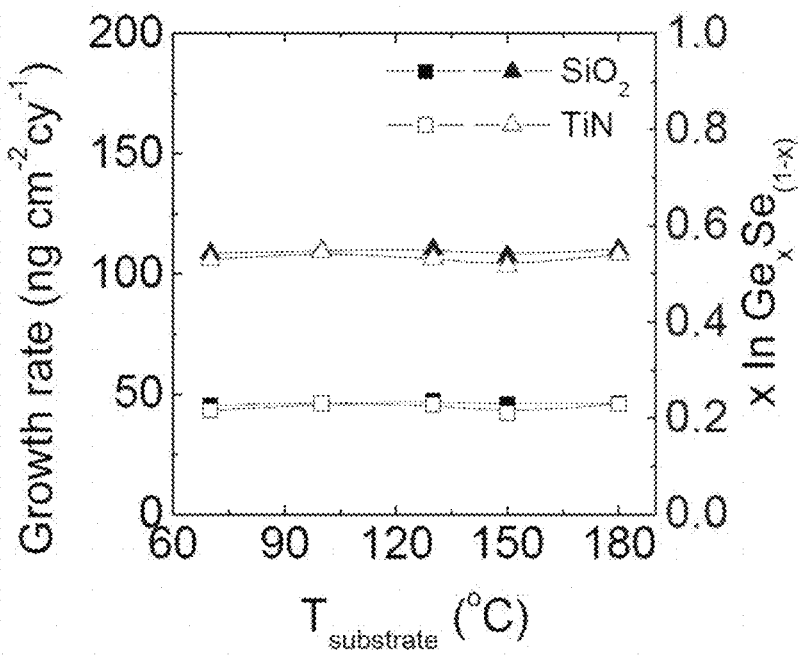
FIG. 51 is a graph illustrating an influence of a substrate temperature on a growth rate of a thin film in a method of forming a chalcogenide-based thin film according to an embodiment of the present disclosure.

FIG. 51 is a graph illustrating an influence of a substrate temperature on a growth rate of a thin film in a method of forming a chalcogenide-based thin film according to an embodiment of the present disclosure.

Referring to FIG. 51, it can be confirmed that a stable growth rate of about 45 to 50 ng·cm$^{-2}$·cy$^{-1}$ is obtained on $SiO_2$ and TiN substrates at a temperature (substrate temperature) of about 70 to 180° C. Precursors have a relatively high thermal stability, and thus may exhibit stable growth characteristics even at a relatively high deposition temperature (substrate temperature). A Ge precursor may be stable up to about 187° C.

FIG. 51 illustrates a change of x (that is, composition ratio change) in the deposited $Ge_xSe_{(1-x)}$ thin film. Referring to a result thereof, it can be confirmed that a 1:1 stoichiometric composition is maintained up to a temperature of about 180° C. that is a highest temperature in this experiment.

Figure 52:
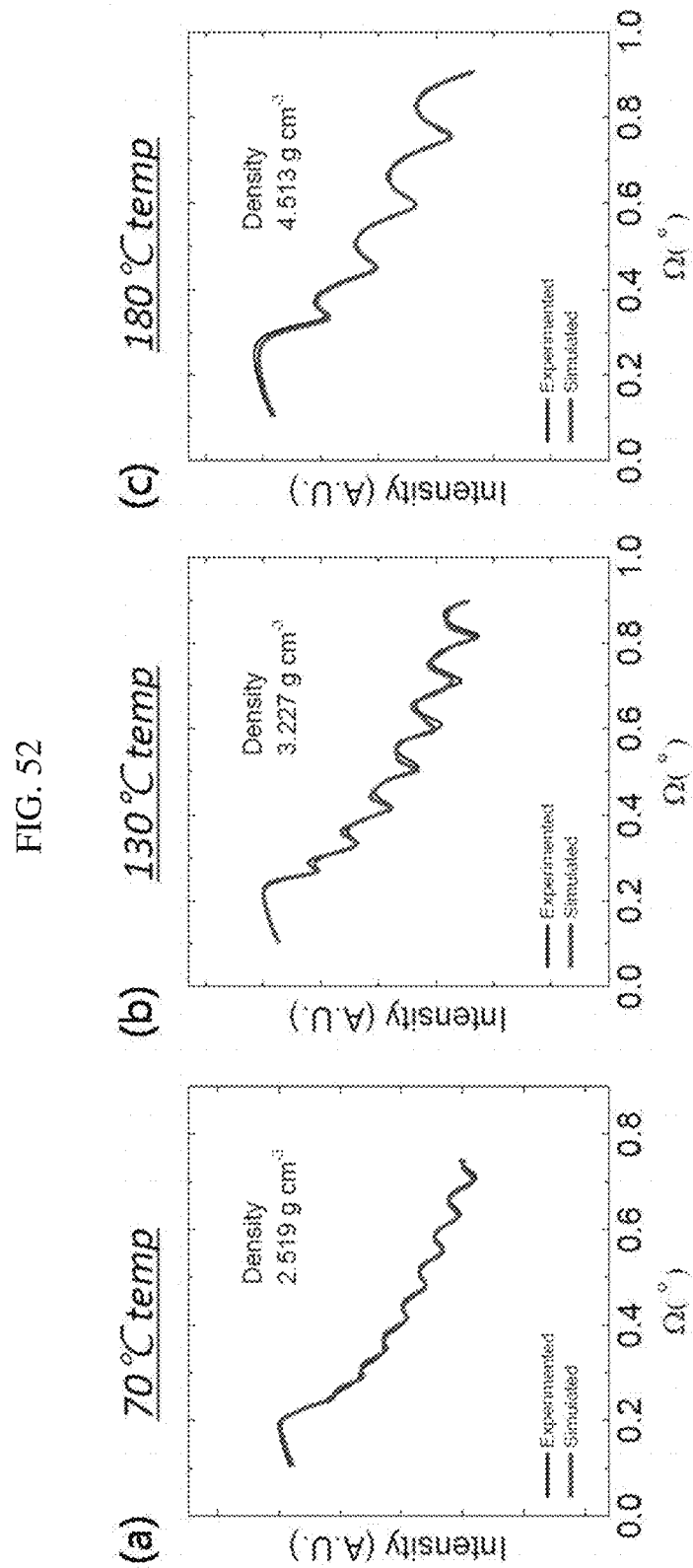
FIG. 52 is a graph illustrating XRR spectra for a chalcogenide-based thin film (GeSe) formed according to an embodiment of the present disclosure.

FIG. 52 is a graph illustrating XRR spectra for a chalcogenide-based thin film (GeSe) formed according to an embodiment of the present disclosure. FIG. 52A illustrates a case in which a deposition temperature is 100° C., FIG. 52B illustrates a case in which a deposition temperature is 130° C., and FIG. 52C illustrates a case in which a deposition temperature is 180° C. In the graphs of FIG. 52, an X axis represents an incident angle of an X-ray.

From the result of FIG. 52, a density of a thin film (GeSe) may be measured. The GeSe thin film of FIG. 52A may have a density of about 2.519 g/cm$^3$, the GeSe thin film of FIG. 52B may have a density of about 3.227 g/cm$^3$, and the GeSe thin film of FIG. 52C may have a density about 4.513 g/cm$^3$. An increase in deposition temperature may increase the density of the thin film. The GeSe thin films formed in this experiment may be all amorphous thin films. The density (4.513 g/cm$^3$) of the GeSe thin film of FIG. 52C, that is, the GeSe film formed at a deposition temperature of 180° C., corresponds to about 81.1% of the density (5.56 g/cm$^3$) of general GeSe having a crystalline structure. When using the method according to the embodiment, a high-density chalcogenide-based thin film having a low defect level may be formed.

Figure 53:
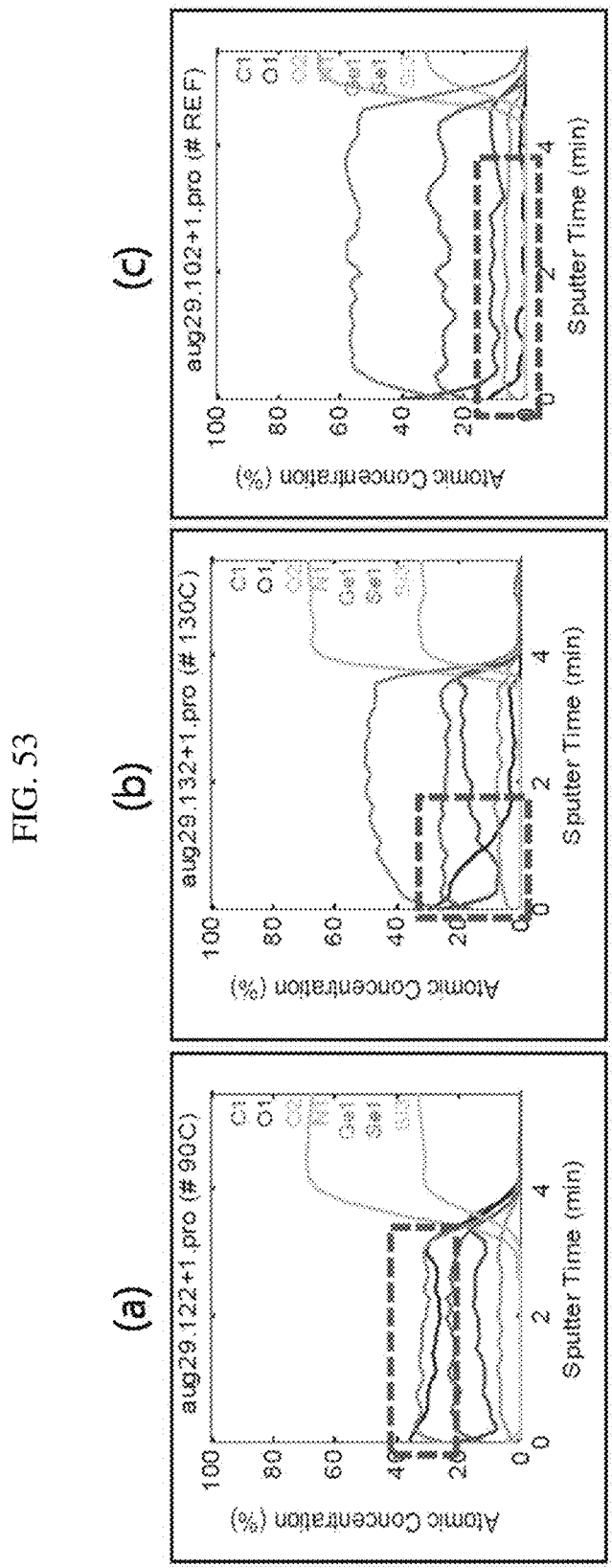
FIG. 53 is a graph illustrating an AES depth profile analysis result for a chalcogenide-based thin film (GeSe) formed according to an embodiment of the present disclosure.

FIG. 53 is a graph illustrating an AES depth profile analysis result for a chalcogenide-based thin film (GeSe) formed according to an embodiment of the present disclosure. FIG. 53A illustrates a result for a GeSe thin film deposited at 90° C., FIG. 52B illustrates a result for a GeSE thin film deposited at 130° C., and FIG. 52C illustrates a result for a GeSe film deposited at a predetermined reference temperature. The reference temperature may be higher than 130° C. FIG. 53 illustrates a result of absolute concentration analysis being not reflected, which is for confirming a relative change of each constituent material or impurity.

Referring to FIG. 53, the content of impurities such as C, N, O, and the like included in the GeSe thin film at each deposition temperature may be roughly evaluated.

Figure 54:
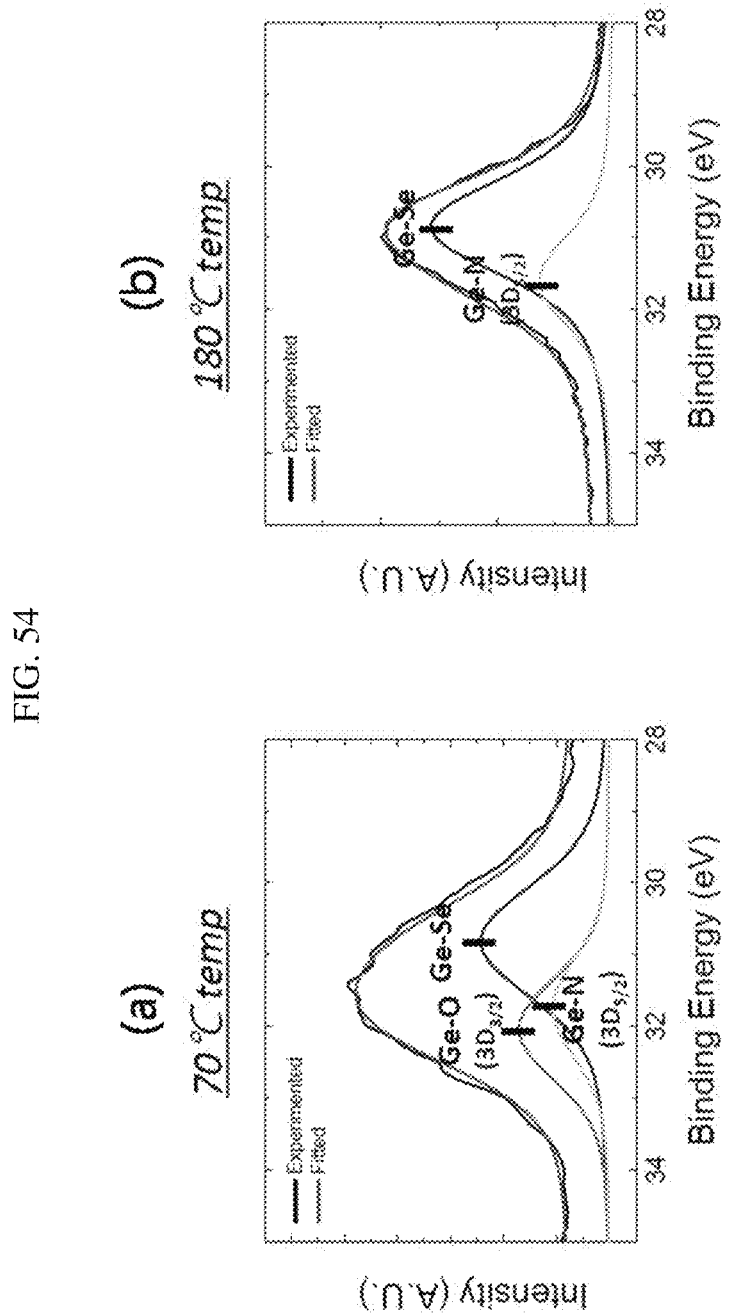
FIG. 54 is a graph illustrating an XPS analysis result for a chalcogenide-based thin film (GeSe) formed according to an embodiment of the present disclosure.

FIG. 54 is a graph illustrating an XPS analysis result for a chalcogenide-based thin film (GeSe) formed according to an embodiment of the present disclosure. FIG. 54A illustrates a result for a GeSe thin film deposited at 70° C., and FIG. 54B illustrates a result for a GeSe thin film deposited at 180° C. FIGS. 54A and 54B illustrate XPS spectra of a Ge 3d peak.

Figure 55:
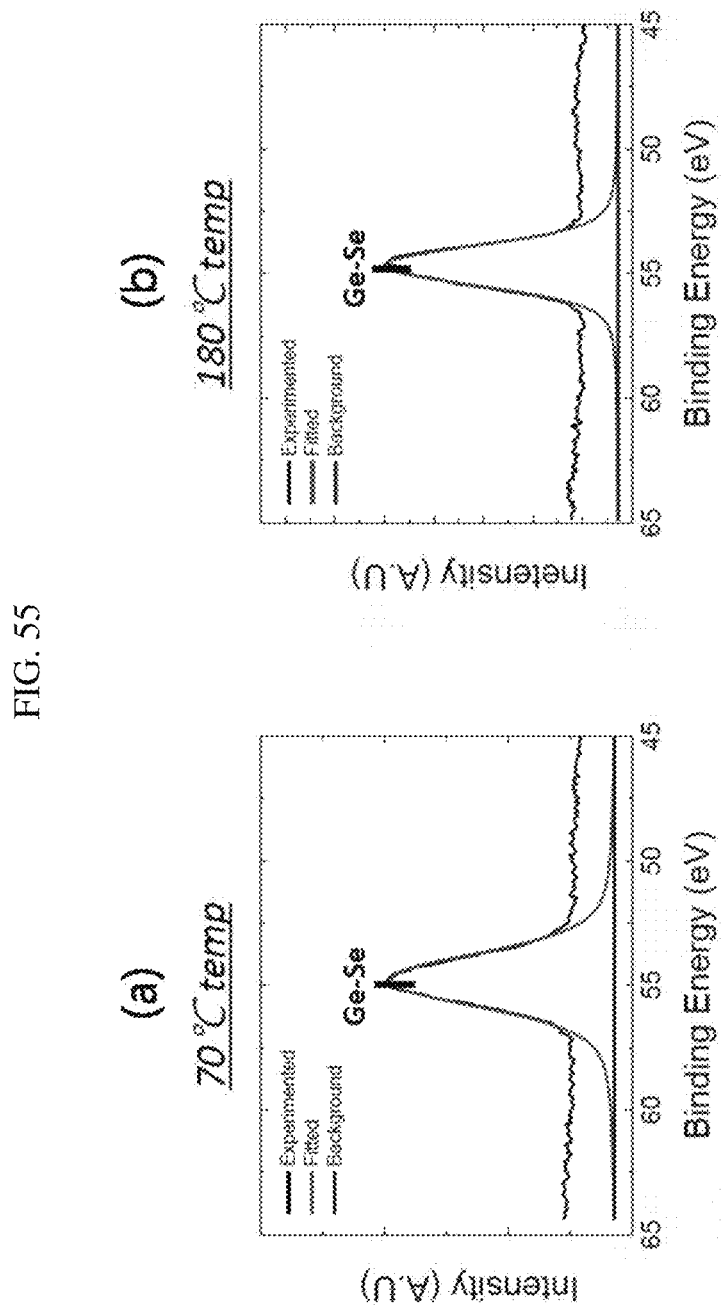
FIG. 55 is a graph illustrating an XPS analysis result for a chalcogenide-based thin film (GeSe) formed according to an embodiment of the present disclosure.

FIG. 55 is a graph illustrating an XPS analysis result for a chalcogenide-based thin film (GeSe) formed according to an embodiment of the present disclosure. FIG. 55A illustrates a result for a GeSe thin film deposited at 70° C., and FIG. 55B illustrates a result for a GeSe film deposition at 180° C. FIGS. 55A and 55B illustrate XPS spectra of a Se 3d peak.

Figure 56:
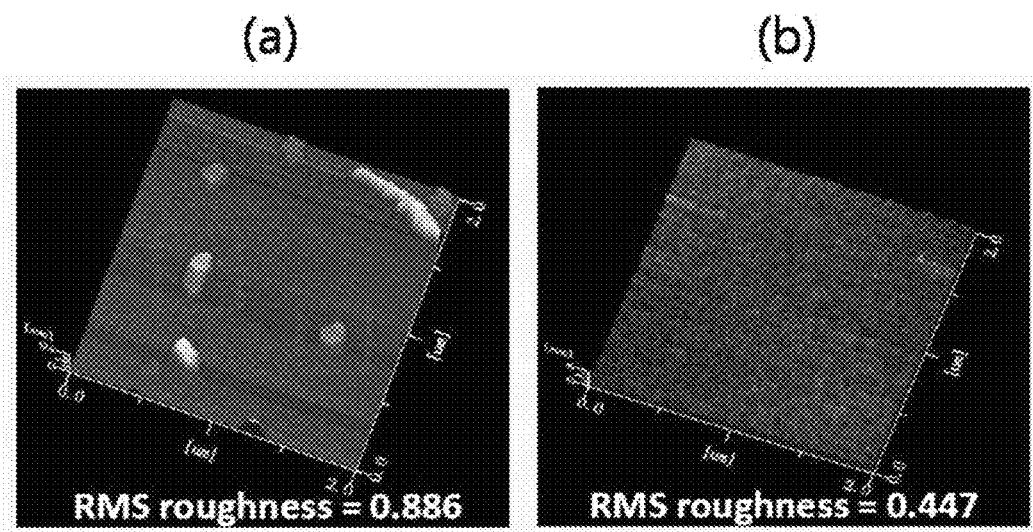
FIG. 56 is a diagram illustrating an AFM image of a chalcogenide-based thin film (GeSe) formed according to an embodiment of the present disclosure.

FIG. 56 is a diagram illustrating an AFM image of a chalcogenide-based thin film (GeSe) formed according to an embodiment of the present disclosure. FIG. 56A illustrates a result for a GeSe thin film deposited at 70° C., and FIG. 56B illustrates a result for a GeSe film deposition at 180° C.

In FIG. 56A, the GeSe thin film had an RMS roughness of about 0.886 nm, and in in FIG. 56B, the GeSe thin film had an RMS roughness of about 0.447 nm. A chalcogenide-based thin film formed by the method according to the embodiment may have excellent surface morphology and high smoothness. The GeSe thin film deposited at 180° C.

may have more excellent roughness characteristics, that is, excellent flatness characteristics, than the GeSe thin film deposited at 70° C.

Figure 57:
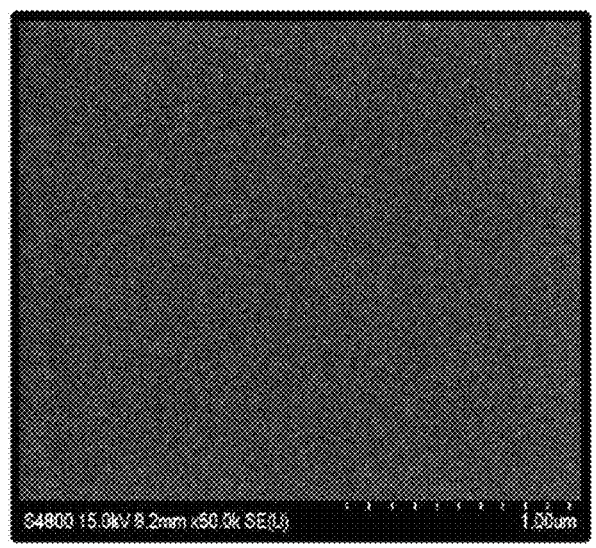
FIG. 57 is a diagram illustrating an SEM image of a chalcogenide-based thin film (GeSe) formed according to an embodiment of the present disclosure.

FIG. 57 is a diagram illustrating an SEM image of a chalcogenide-based thin film (GeSe) formed according to an embodiment of the present disclosure. The GeSe thin film of FIG. 57 was deposited at 180° C.

Figure 58:
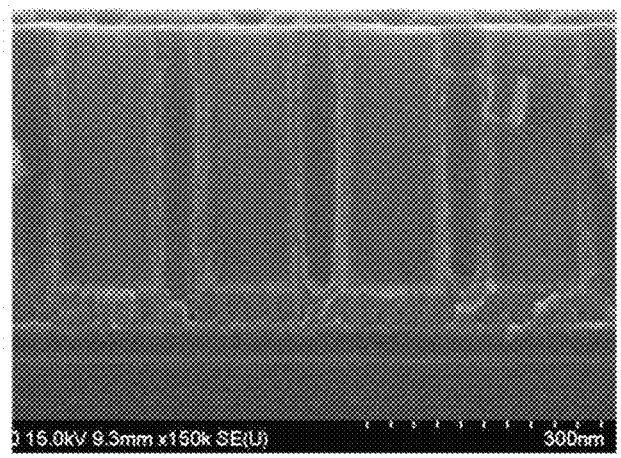
FIG. 58 is a diagram illustrating a TEM cross-sectional image of a chalcogenide-based thin film (GeSe) formed on a substrate having a hole structure, according to an embodiment of the present disclosure.

FIG. 58 is a diagram illustrating a TEM cross-sectional image of a chalcogenide-based thin film (GeSe) formed on a substrate having a hole structure, according to an embodiment of the present disclosure. In this case, the GeSe thin film was deposited on a hole structure having an aspect ratio of about 5:1.

Referring to FIG. 58, it can be confirmed that the thin film was conformally deposited on the substrate having a hole structure by an ALD process according to the embodiment. In this case, an opening of the hole had a diameter of about 50 nm and a depth of about 250 nm. It can be confirmed that thin film deposition was generally uniformly formed on an entire surface of the hole structure.

Figure 59:
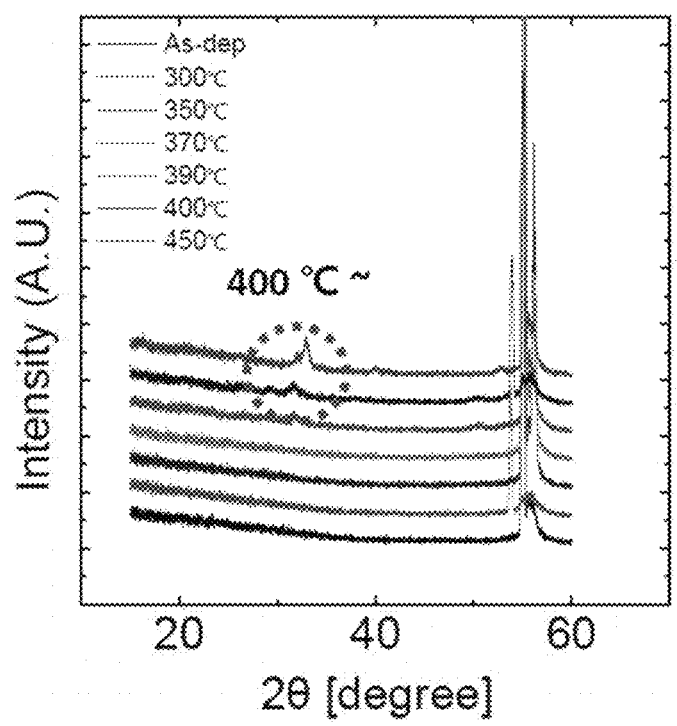
FIG. 59 is a graph illustrating an XRD analysis result for a chalcogenide-based thin film (GeSe) formed according to an embodiment of the present disclosure.

FIG. 59 is a graph illustrating an XRD analysis result for a chalcogenide-based thin film (GeSe) formed according to an embodiment of the present disclosure. FIG. 59 includes a result for a GeSe thin film deposited at 180° C. (represented by As-dep) and results for thin films obtained by annealing the GeSe film at different temperatures up to 450° C. The annealing was furnace annealing, and was performed for about 15 minutes.

Referring to FIG. 59, when an annealing temperature is about 400° C. or more, it can be confirmed that a peak occurs in the graph. This result may be due to a change in crystallinity of the thin film based on annealing at a temperature of 400° C. or more. It can be presumed that crystallization of the GeSe thin film began by annealing at 400° C. or more.

The chalcogenide-based thin film according to the above-described embodiment may be applied to a switching device, and the switching device may be an OTS device. The switching device may also be applied to a memory device. The chalcogenide-based thin film formed according to this embodiment may have excellent switching characteristics (for example, OTS characteristics) and excellent durability.

A method of forming a phase change material layer according to the embodiment of the present disclosure may include forming a chalcogenide-based thin film using the above-described ALD process. In addition, a method of forming the switching device may further include forming an electrode structure for applying an electrical signal to the chalcogenide-based thin film. For example, the switching device may include a switching element layer between a first electrode and a second electrode, and the switching element layer may include the chalcogenide-based thin film.

A method of manufacturing a memory device according to the embodiment of the present disclosure, which is a method of manufacturing a memory device including a memory element and a switching device electrically connected to the memory element, may include forming a chalcogenide-based thin film using the above-described ALD process. That is, the memory device may be manufactured by applying the method of forming a switching device according to the embodiment. The memory device may be a highly integrated device or a memory array device having a vertical structure. When manufacturing the highly integrated device and the memory device having a vertical structure, the ALD process having excellent step coverage characteristics may be usefully applied.

Figure 60:
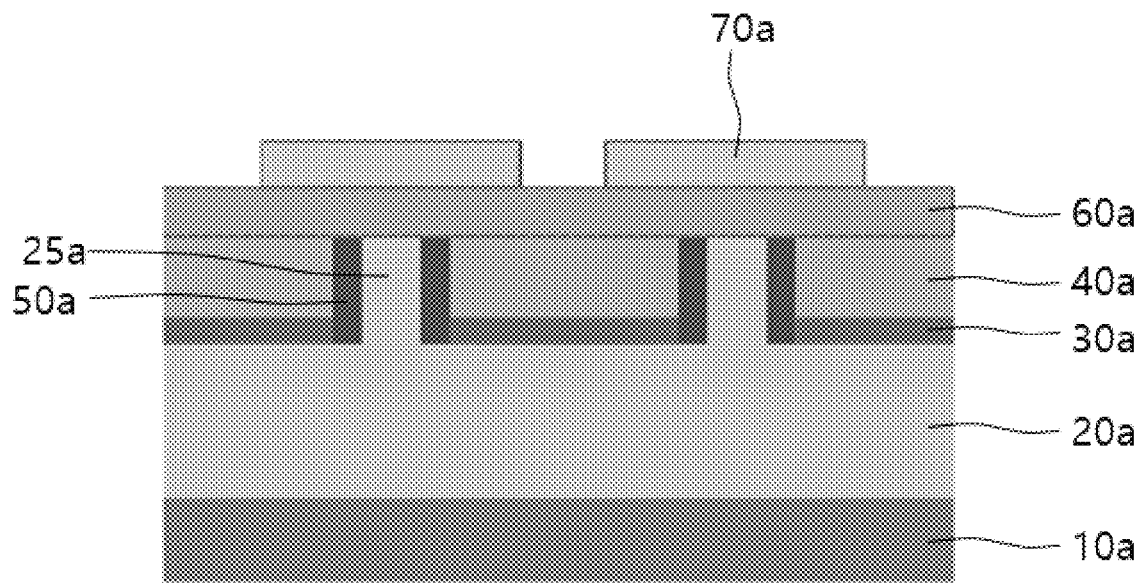
FIG. 60 is a cross-sectional view illustrating a structure of a test ovonic threshold switch (OTS) device for electrical testing of a chalcogenide-based thin film manufactured according to an embodiment of the present disclosure.

FIG. 60 is a cross-sectional view illustrating a structure of a test OTS device for electrical testing of a chalcogenide-based thin film manufactured according to an embodiment of the present disclosure.

Referring to FIG. 60, a lower electrode 20a may be provided on a substrate 10a, a chalcogenide-based thin film 60a may be provided on the lower electrode 20a, and an upper electrode 70a may be provided on the chalcogenide-based thin film 60a. Between the lower electrode 20a and the chalcogenide-based thin film 60a, a lower electrode plug 25a that connects the lower electrode 20a and the chalcogenide-based thin film 60a to each other may be provided. The lower electrode plug 25a may have a diameter of, for example, about 80 nm. An etch stop layer 30a and an interlayer insulating layer 40a may be sequentially provided on the lower electrode 20a, and a contact hole may be formed in the interlayer insulating layer 40a and the etch stop layer 30a. A sidewall insulating layer 50a may be provided on an inner wall of the contact hole. The lower electrode plug 25a may be provided in the contact hole provided with the sidewall insulating layer 50a. The substrate 10a may be a silicon substrate, the lower electrode 20a and the lower electrode plug 25a may include TiN, the etch stop layer 30a may be formed of a nitride, and the interlayer insulating layer 40a may be formed of an oxide. The chalcogenide-based thin film 60a may be formed by the above-described ALD method according to the embodiment. That is, the chalcogenide-based thin film 60a may be a GeSe thin film formed according to the ALD process of the embodiment. The structure of the test OTS device illustrated in FIG. 60 is merely exemplary and may vary.

Figure 61:
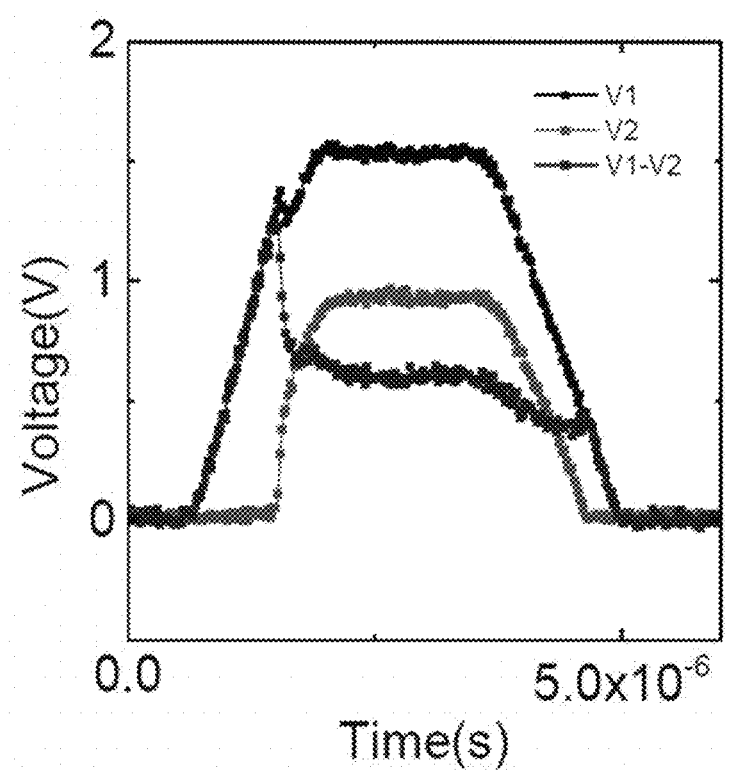
FIG. 61 is a graph illustrating a pulse test result for the test OTS device of FIG. 60.

FIG. 61 is a graph illustrating a pulse test result for the test OTS device of FIG. 60. In this case, the chalcogenide-based thin film (60a in FIG. 60) was a GeSe thin film deposited at a substrate temperature (deposition temperature) of 180° C., and had a thickness of about 20 nm.

Referring to FIG. 61, the test OTS device had a threshold voltage ($V_{TH}$) of about 1.4 V and an ON-current ($I_{ON}$) of about $1.2 \times 10_{-2}$ A.

Figure 62:
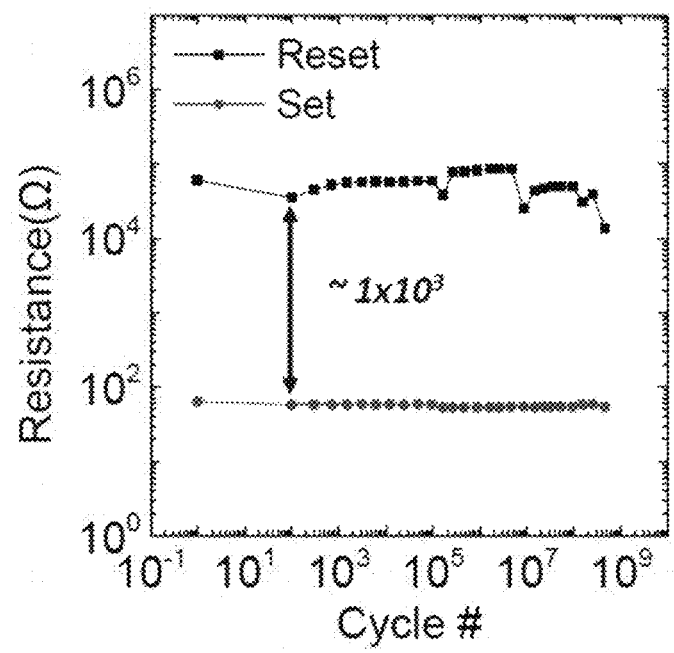
FIG. 62 is a graph illustrating a durability test result for the test OTS device of FIG. 60.

FIG. 62 is a graph illustrating a durability test result for the test OTS device of FIG. 60. In this case, the chalcogenide-based thin film (60a in FIG. 60) was the same as described with reference to FIG. 61.

Referring to FIG. 62, the test OTS device exhibited an ON/OFF resistance ratio (that is, moderate selectivity) of about $\sim 1 \times 10^3$, and exhibited excellent durability/stability up to the number of on/off cycles of about $\sim 4 \times 10^8$ or more.

Figure 63:
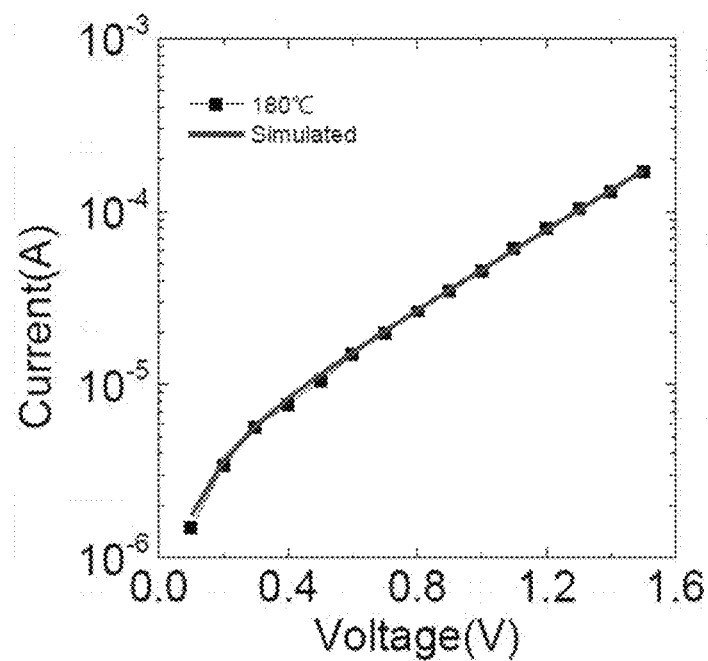
FIG. 63 is a graph illustrating a voltage-current characteristic evaluation result for the test OTS device of FIG. 60.

FIG. 63 is a graph illustrating a voltage-current characteristic evaluation result for the test OTS device of FIG. 60. In this case, the chalcogenide-based thin film (60a in FIG. 60) was the same as described with reference to FIG. 61.

Referring to FIG. 63, it can be confirmed that the test OTS device exhibits a characteristic similar to a voltage-current characteristic of a general OTS device in a sub-threshold region. In addition, as a result of performing calculation from the result of FIG. 63, a total trap density ($N_T$) was about $4.2 \times 10^{19}$ cm$^3$, and an average trap distance ($\Delta z$) was about 2.51 nm.

Table 1 below shows a comparison between an ALD GeSe thin film formed according to a comparative embodiment and an ALD GeSe thin film formed according to an embodiment in terms of a characteristic.

TABLE 1

| Properties of ALD GeSe | Ge precursor | |
|---|---|---|
| | HGeCl$_3$ | Ge—[guan] |
| Substrate Temp [° C.] | 70 | 70~200 |
| Film density [g cm$^{-3}$] | 4.17 | 4.51 |
| Crystallization Temp [° C.] | 350 | 400 |
| Threshold voltage [V] | 1.9 | 1.4 |
| Endurance [cy] | ~1 × 10$^1$ | ~4 × 10$^8$ |

A case in which HGeCl$_3$ is used as a Ge precursor is a comparative embodiment, and a case in which Ge(II)-guanidinate is used as a Ge precursor is an embodiment. In Table 1, Ge(II)-guanidinate is represented as Ge-[guan].

Table 2 below shows materials used in the ALD process according to the comparative embodiment and the embodiment of Table 1.

TABLE 2

| Ge precursor | HGeCL$_3$ | Ge [Guanidinate] |
|---|---|---|
| Se precursor | [(CH$_3$)$_3$Si$_2$]Se | [(CH$_3$)$_3$Si$_2$]Se |
| Reactant gas | — | NH$_3$ |
| Compound | GeSe | GeSe |

Referring to the results of Table 1, it can be confirmed that the ALD GeSe thin film according to the embodiment has more excellent characteristics than the ALD GeSe thin film according to the comparative embodiment in various aspects such as substrate temperature (deposition temperature), film density, crystallization temperature, threshold voltage, and durability. The ALD GeSe thin film according to this embodiment may have excellent switching performance (OTS performance), and excellent step coverage characteristics, and may be usefully applied to a highly integrated device and various memory devices (in particular, a memory array device having a vertical structure).

Figure 64:
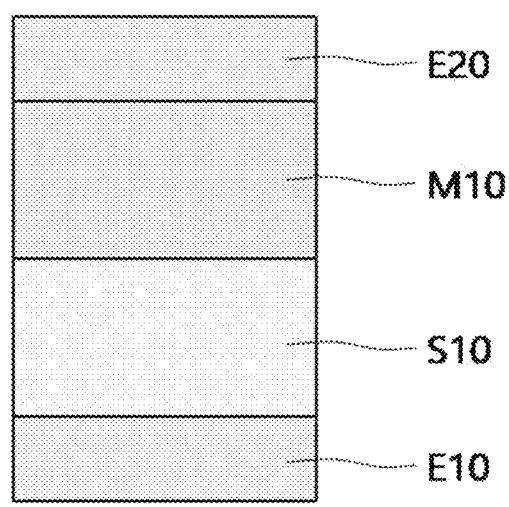
FIG. 64 is a schematic cross-sectional view illustrating a basic structure (cell structure) of a memory device that can be manufactured according to an embodiment of the present disclosure.

FIG. 64 is a schematic cross-sectional view illustrating a basic structure (cell structure) of a memory device that can be manufactured according to an embodiment of the present disclosure.

Referring to FIG. 64, the cell structure of the memory device may include a memory element M10 and a switching device S10 between a first electrode member E10 and a second electrode member E20. The memory element M10 and the switching device S10 may be electrically connected to each other. The switching device S10 may be referred to as a type of selector device. A characteristic of access to the memory element M10 may be determined according to an ON/OFF state of the switching device S10. The switching device S10 may include a chalcogenide-based thin film formed by an ALD method according to embodiments.

The cell structure of the memory device illustrated in FIG. 64 is exemplary, and may vary. The memory device may be a phase change memory device, a resistive memory device, or another memory device. Various memory devices and a memory array device having a vertical structure may be manufactured.

According to the embodiments of the present disclosure described above, a chalcogenide-based thin film having excellent physical properties may be formed by using an ALD process. In particular, according to the embodiments, a chalcogenide-based thin film having excellent film quality, excellent switching characteristics and excellent durability may be easily formed by using the ALD process. When applying the method of forming a thin film according to these embodiments, a switching device having excellent performance and a memory device including the switching device may be implemented.

In the present specification, preferred embodiments of the present disclosure have been disclosed, and although specific terms are used, these are used only in order to easily describe the technical contents of the present disclosure and to help understanding of the present disclosure, and are not intended to limit the scope of the present disclosure. It will be apparent to those skilled in the art that other modifications based on the technical spirit of the present disclosure are possible in addition to the embodiments disclosed herein. Those skilled in the art will appreciate that a method of forming a chalcogenide-based thin film using an ALD process, and a method of forming a phase change material layer and a switching device, and a method of manufacturing a memory device described with reference to FIGS. 1 to 64 may be substituted, changed, and modified in various ways without departing from the technical spirit of the present disclosure. Therefore, the scope of the should not be defined by the described embodiments but by the technical spirit described in the patent claims.

What is claimed is:

1. A method of forming a chalcogenide-based thin film using an atomic layer deposition (ALD) process, the method comprising:
    forming a Ge—Te-based material,
    wherein the forming of the Ge—Te-based material comprises:
        a first operation of supplying, into a reaction chamber provided with a substrate, a first source gas including a Ge precursor with Ge having an oxidation state of +2;
        a second operation of supplying a first purge gas into the reaction chamber;
        a third operation of supplying, into the reaction chamber, a second source gas including a Te precursor and a first co-reactant gas for promoting a reaction as a catalyst between the Ge precursor and the Te precursor; and
        a fourth operation of supplying a second purge gas into the reaction chamber,
        wherein the second source gas and the first co-reactant gas are simultaneously supplied into the reaction chamber, and the first co-reactant gas includes NH$_3$.

2. The method of claim 1, wherein the Ge precursor includes Ge(II)-amido guanidinate.

3. The method of claim 1, wherein the first co-reactant gas is configured to react with the Te precursor to generate TeH$_2$.

4. The method of claim 1, wherein the Te precursor includes Te(SiMe$_3$)$_2$.

5. The method of claim 1, wherein in the forming of the Ge—Te-based material, a deposition temperature is in a range of 70° C. to 200° C.

6. The method of claim 1, further comprising:
    forming a Sb—Te-based material,
    wherein the forming of the Sb—Te-based material comprises:
        a fifth operation of supplying, into the reaction chamber, a third source gas including a Sb precursor;
        a sixth operation of supplying a third purge gas into the reaction chamber;
        a seventh operation of supplying, into the reaction chamber, the fourth source gas including a second Te precursor and a second co-reactant gas; and
        an eighth operation of supplying a fourth purge gas into the reaction chamber.

7. The method of claim 6, wherein the fourth source gas is the same as the second source gas, the second co-reactant gas is the same as the first co-reactant gas, and the fourth source gas and the second co-reactant gas are simultaneously supplied into the reaction chamber.

8. The method of claim 6,
wherein the forming of the Ge—Te-based material is configured to form a GeTe material, and the forming of the Sb—Te-based material is configured to form a $Sb_2Te_3$ material,
wherein the first to fourth operations for forming the Ge—Te-based material are repeatedly performed m times (m is an integer of 1 or more), and the fifth to eighth operations for forming the Sb—Te-based material are repeatedly performed n times (n is an integer of 1 or more),
wherein he forming of the Ge—Te-based material and the forming of the Sb—Te-based material are alternately and repeatedly performed.

9. A method of forming a phase change material layer, comprising:
forming a chalcogenide-based thin film by using the method of claim 1.

10. A method of manufacturing a phase change memory device, comprising:
forming a phase change material layer by using the method of claim 9; and
forming an electrode structure for applying a voltage to the phase change material layer.

* * * * *